United States Patent
Omura

(10) Patent No.: US 6,674,513 B2
(45) Date of Patent: Jan. 6, 2004

(54) PROJECTION EXPOSURE METHODS AND APPARATUS, AND PROJECTION OPTICAL SYSTEMS

(75) Inventor: Yasuhiro Omura, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/252,427

(22) Filed: Sep. 24, 2002

(65) Prior Publication Data

US 2003/0147061 A1 Aug. 7, 2003

Related U.S. Application Data

(62) Division of application No. 09/856,959, filed as application No. PCT/JP00/06706 on Sep. 28, 2000, now abandoned.

(30) Foreign Application Priority Data

Sep. 29, 1999 (JP) .................................. PCT/JP99/05329
Nov. 16, 1999 (JP) .................................. PCT/JP99/06387

(51) Int. Cl.⁷ ..................... G03B 27/54; G03B 27/42; G03B 27/10
(52) U.S. Cl. ........................ 355/67; 355/53; 359/618
(58) Field of Search ............................. 355/53, 67–71; 359/618–620, 758

(56) References Cited

U.S. PATENT DOCUMENTS

| 5,117,225 | A | 5/1992 | Wang |
|---|---|---|---|
| 5,253,110 | A | 10/1993 | Ichihara et al. |
| 5,424,552 | A | 6/1995 | Tsuji et al. |
| 5,473,410 | A | 12/1995 | Nishi |
| 5,477,304 | A | 12/1995 | Nishi |
| 5,555,479 | A | 9/1996 | Nakagiri |
| 5,559,584 | A | 9/1996 | Miyaji et al. |
| 5,623,365 | A | 4/1997 | Kuba |
| 5,636,000 | A | 6/1997 | Ushida et al. |
| 5,707,908 | A | 1/1998 | Komine et al. |
| 5,781,278 | A | 7/1998 | Matsuzawa et al. |
| 5,808,814 | A | 9/1998 | Kudo |
| 5,850,300 | A | 12/1998 | Kathman et al. |
| 5,990,926 | A | 11/1999 | Mercado |
| 6,008,884 | A | 12/1999 | Yamaguchi et al. |
| 6,087,283 | A | 7/2000 | Jinbo et al. |
| 6,088,171 | A | 7/2000 | Kudo |
| 6,198,577 | B1 | 3/2001 | Kedar et al. |
| 6,222,680 | B1 | 4/2001 | Yamamoto |
| 6,285,509 | B1 * | 9/2001 | Nakayama et al. ......... 359/676 |
| 6,333,781 | B1 * | 12/2001 | Shigematsu .................. 355/71 |
| 6,335,787 | B1 | 1/2002 | Nishi |
| 6,349,005 | B1 | 2/2002 | Schuster et al. |
| 6,377,338 | B1 | 4/2002 | Suenaga |
| 2002/0080498 | A1 | 6/2002 | Takahashi |

FOREIGN PATENT DOCUMENTS

| EP | 0 803 755 A2 | 10/1997 |
|---|---|---|
| EP | 0 828 172 A1 | 3/1998 |
| EP | 0 863 440 A2 | 9/1998 |
| EP | 0 951 054 A1 | 10/1999 |

(List continued on next page.)

Primary Examiner—Henry Hung Nguyen
(74) Attorney, Agent, or Firm—Oliff & Berridge PLC

(57) ABSTRACT

A dioptric projection optical system for imaging a reduced image of a pattern on a first surface onto a second surface using radiation-transmitting refractors. The projection optical system has a front lens unit of a positive refracting power and a rear lens unit of a positive refracting power. An aperture stop is located in the vicinity of a rear focal point of the front lens unit.

20 Claims, 20 Drawing Sheets

FOREIGN PATENT DOCUMENTS

| | | |
|---|---|---|
| EP | 0 997 761 A1 | 5/2000 |
| EP | 1 004 937 A2 | 5/2000 |
| EP | 1 006 373 A2 | 6/2000 |
| EP | 1 006 387 A2 | 6/2000 |
| EP | 1 006 388 A2 | 6/2000 |
| EP | 1 006 389 A2 | 6/2000 |
| EP | 1 020 897 A1 | 7/2000 |
| EP | 1 037 267 A1 | 9/2000 |
| EP | 1 061 396 A2 | 12/2000 |
| EP | 1 075 017 A1 | 2/2001 |
| EP | 1 094 350 A2 | 4/2001 |
| JP | A 01-198759 | 8/1989 |
| JP | A 04-127514 | 4/1992 |
| JP | A 04-192317 | 7/1992 |
| JP | A 04-196513 | 7/1992 |
| JP | A 05-034593 | 2/1993 |
| JP | A 05-041344 | 2/1993 |
| JP | A 05-175098 | 7/1993 |
| JP | A 06-084757 | 3/1994 |
| JP | A 06-260386 | 9/1994 |
| JP | A 06-331942 | 12/1994 |
| JP | A 07-128592 | 5/1995 |
| JP | A 08-330220 | 12/1996 |
| JP | A-9-329742 | 12/1997 |
| JP | B2 27-70224 | 4/1998 |
| JP | A-10-142501 | 5/1998 |
| JP | A 10-163097 | 6/1998 |
| JP | A 10-163098 | 6/1998 |
| JP | A 10-163099 | 6/1998 |
| JP | A 10-197791 | 7/1998 |
| JP | A 10-214783 | 8/1998 |
| JP | A 10-284408 | 10/1998 |
| JP | A-10-325922 | 12/1998 |
| JP | A 10-333030 | 12/1998 |
| JP | A-11-6957 | 1/1999 |
| JP | A-11-133301 | 5/1999 |
| JP | B2 29-36138 | 6/1999 |
| JP | A 11-174365 | 7/1999 |
| JP | A-11-219999 | 8/1999 |
| JP | A 11-233437 | 8/1999 |
| JP | A 11-297620 | 10/1999 |
| JP | A 11-307443 | 11/1999 |
| JP | A 2000-121934 | 4/2000 |
| JP | A 2000-356741 | 12/2000 |
| JP | A 2000-357645 | 12/2000 |
| WO | WO98/57213 | 12/1998 |
| WO | WO99/10917 | 3/1999 |
| WO | WO99/50892 | 10/1999 |
| WO | WO 00/30348 | 5/2000 |
| WO | WO 00/33138 | 6/2000 |
| WO | WO 00/70407 | 11/2000 |

* cited by examiner

US 6,674,513 B2

PROJECTION EXPOSURE METHODS AND APPARATUS, AND PROJECTION OPTICAL SYSTEMS

This is a Division of application Ser. No. 09/856,959 filed May 29, 2001, now abandoned which in turn is a National Stage of PCT/JP00/06706 filed Sep. 28, 2000. The entire disclosure of the prior application(s) is hereby incorporated by reference herein in its entirety.

TECHNICAL FIELD

The present invention relates to projection exposure apparatus and methods used in fabrication of microdevices, for example, such as semiconductor integrated circuits, imaging devices including CCDs and the like, liquid crystal displays, or thin-film magnetic heads by the lithography technology, and to projection optical systems suitably applicable to such projection exposure apparatus. The present invention also relates to methods of fabricating the foregoing projection exposure apparatus and projection optical systems.

BACKGROUND ART

As the circuit patterns for such microdevices as the semiconductor integrated circuits and others are becoming finer and finer in recent years, the wavelengths of illumination light(radiation) for exposure (exposure light(radiation)) used in the exposure apparatus such as steppers and the like have been decreasing toward shorter wavelengths year after year. Namely, as the exposure light, KrF excimer laser light (wavelength: 248 nm) is going mainstream in place of the i-line (wavelength: 365 nm) of mercury lamps mainly used conventionally, and ArF excimer laser light of a much shorter wavelength (wavelength: 193 nm) is also nearing practical use. For the purpose of further decreasing the wavelength of the exposure light, there are also attempts to use halogen molecular lasers and others like the $F_2$ laser (wavelength: 157 nm).

Although the aforementioned excimer lasers, halogen molecular lasers, etc. are available as light sources in the vacuum ultraviolet region of wavelengths not more than 200 nm, there are limits to practical band narrowing thereof.

Since limited materials transmit the emitted light in this vacuum ultraviolet region, available materials are limited for lens elements constituting the projection optical systems and transmittances of the limited materials are not so high, either. As matters now stand, the performance of antireflection coats provided on surfaces of the lens elements is not so high, as against those for longer wavelengths.

A first object of the present invention is to suppress chromatic aberration of the projection optical system and reduce loads on the light source.

A second object of the present invention is to correct chromatic aberration for the exposure light having some spectral width, by adding a single kind of glass material or a few color-correcting glass materials.

A third object of the present invention is to obtain an extremely fine microdevice circuit pattern while simplifying the structure of the projection optical system.

A fourth object of the present invention is to obtain an extremely fine microdevice circuit pattern without decrease in throughput.

DISCLOSURE OF THE INVENTION

For accomplishing the foregoing first or second object, a first projection optical system according to the present invention is a dioptric projection optical system for forming an image of a pattern on a first surface, onto a second surface by action of light-transmitting (radiation-transmitting) refractors, comprising: a front lens unit having a positive refracting power, located in an optical path between the first surface and the second surface; a rear lens unit having a positive refracting power, located in an optical path between the front lens unit and the second surface; and an aperture stop located in the vicinity of a rear focus position of the front lens unit; the projection optical system being telecentric on the first surface side and on the second surface side, wherein the following condition is satisfied:

$$0.065 < f2/L < 0.125,$$

where f2 is a focal length of the rear lens unit and L is a distance from the first surface to the second surface.

A first fabrication method of a projection optical system according to the present invention is a method of fabricating a dioptric projection optical system for forming an image of a pattern on a first surface, onto a second surface by action of radiation-transmitting refractors, comprising: a step of locating a front lens unit having a positive refracting power; a step of locating a rear lens unit having a positive refracting power, between the front lens unit and the second surface; and a step of locating an aperture stop between the front lens unit and the rear lens unit; wherein the front lens unit, the rear lens unit, and the aperture stop are located so that the projection optical system is telecentric on the first surface side and on the second surface side, and said method using the projection optical system satisfying the following condition;

$$0.065 < f2/L < 0.125,$$

where f2 is a focal length of the rear lens unit and L a distance from the first surface to the second surface.

For accomplishing the foregoing first or second object, a second projection optical system according to the present invention is a dioptric projection optical system for forming an image of a pattern on a first surface, onto a second surface by action of radiation-transmitting refractors, comprising three or more lenses having their respective refracting powers, wherein when three lenses are selected in order from the first surface side of the lenses having their respective refracting powers, at least one surface of the three lenses is of an aspheric shape having a negative refracting power.

For accomplishing the foregoing first or second object, a third projection optical system according to the present invention is a dioptric projection optical system for forming an image of a pattern on a first surface, onto a second surface by action of radiation-transmitting refractors, comprising a plurality of lenses having their respective refracting powers, wherein when two lenses are selected in order from the first surface of the lenses having their respective refracting powers, at least one surface of the two lenses is an aspheric surface, and wherein, where Ca is a local, principal curvature near a center of an optical axis of the aspheric surface and Cb is a local, principal curvature in the meridional direction of an extreme marginal region of a lens clear aperture diameter of the aspheric surface, the following condition holds if the aspheric surface has a negative refracting power:

$$Cb/Ca < 0.7 \qquad (b\text{-}1);$$

on the other hand, in the present invention, the following condition holds if the aspheric surface has a positive refracting power:

$$Cb/Ca > 1.6 \qquad (b\text{-}2).$$

In this invention, the local, principal curvature Ca near the center of the optical axis of the aspheric surface and the local, principal curvature Cb is in the meridional direction of the extreme marginal region of the lens clear aperture diameter of the aspheric surface can be expressed as follows as an example. That is to say, the aspheric surface is expressed by the following equation (b-3):

$$Z(Y) = \frac{Y^2/r}{1+\sqrt{1-(1+\kappa)Y^2/r^2}} + AY^4 + BY^6 + CY^8 + DY^{10} + EY^{12} + FY^{14}, \quad (b-3)$$

where Y is a height of the aspheric surface from the optical axis, z a distance along the direction of the optical axis from a tangent plane at the vertex of the aspheric surface to the aspheric surface, r a radius of curvature at the vertex, κ a conical coefficient, and A, B, C, D, E, and F aspheric coefficients.

With this expression, the local, principal curvatures Ca and Cb are given as follows.

$$Ca = 1/r \quad (b-4)$$

$$Cb = \frac{d^2z/d^2Y}{\{1+(dz/dY)^2\}^{3/2}} \quad (b-5)$$

With increase in the numerical apertures of the projection optical systems and with increase in the size of the image field, there are increasing demands for minimization of distortion. In order to correct only distortion while suppressing influence on the other aberrations, it is preferable to place an aspheric surface for correction of distortion at a position as close to the object plane (mask) as possible. On this occasion, when the aspheric surface satisfies the foregoing condition (b-1) or (b-2), the distortion can be corrected well even with increase in the numerical aperture and with increase in the size of the image field.

For accomplishing the foregoing first or second object, a fourth projection optical system according to the present invention is a dioptric projection optical system for forming an image of a pattern on a first surface, onto a second surface by action of radiation-transmitting refractors, comprising four or more lenses having their respective refracting powers, wherein when four lenses are selected in order from the first surface of the lenses having their respective refracting powers, at least one surface of the four lenses is an aspheric surface, and wherein, where Ca is a local, principal curvature near a center of an optical axis of the aspheric surface and Cb is a local, principal curvature in the meridional direction of an extreme marginal region of a lens clear aperture diameter of the aspheric surface, the following condition holds if the aspheric surface has a negative refracting power:

$$Cb/Ca < 0.45 \quad (c-1);$$

on the other hand, in the present invention, the following condition holds if the aspheric surface has a positive refracting power:

$$Cb/Ca > 2.3 \quad (c-2).$$

In the present invention, the local, principal curvatures Ca, Cb can be expressed by the above equations (b-4) and (b-5) as an example. When the aspheric surface satisfies the foregoing condition (c-1) or (c-2), the distortion can be corrected well even with increase in the numerical aperture and with increase in the size of the image field.

For accomplishing the foregoing third object, a fifth projection optical system according to the present invention is a projection optical system for forming a reduced image of a pattern on a first surface, onto a second surface, comprising: in the order named hereinafter from the first surface side, a first lens unit having a negative refracting power; a second lens unit having a positive refracting power; a third lens unit having a negative refracting power; a fourth lens unit having a positive refracting power; an aperture stop; and a fifth lens unit having a positive refracting power; wherein the following conditions are satisfied:

$$-1.3 < 1/\beta 1 < 0, \text{ and}$$

$$0.08 < L1/L < 0.17,$$

where β1 is a composite, lateral magnification of the first lens unit and the second lens unit, L1 is a distance from the first surface to a lens surface closest to the second surface in the second lens unit, and L is a distance from the first surface to the second surface.

A second fabrication method of a projection optical system according to the present invention is a method of fabricating a projection optical system for forming a reduced image of a pattern on a first surface, onto a second surface, comprising: a step of preparing a first lens unit having a negative refracting power; a step of preparing a second lens unit having a positive refracting power; a step of preparing a third lens unit having a negative refracting power; a step of preparing a fourth lens unit having a positive refracting power; a step of preparing an aperture stop; a step of preparing a fifth lens unit having a positive refracting power; and a step of locating the first lens unit, the second lens unit, the third lens unit, the fourth lens unit, the aperture stop, and the fifth lens unit in the order named from the first surface side; wherein, where β1 is a composite, lateral magnification of the first lens unit and the second lens unit, L1 a distance from the first surface to a lens surface closest to the second surface in the second lens unit, and L a distance from the first surface to the second surface, the first and second lens units are prepared so as to satisfy the following condition:

$$-1.3 < 1/\beta 1 < 0,$$

and the first and second lens units are located so as to satisfy the following condition:

$$0.08 < L1/L < 0.17.$$

For accomplishing the foregoing third object, a sixth projection optical system according to the present invention is a projection optical system for forming a reduced image of a pattern on a first surface, onto a second surface, comprising at least one light-transmitting refractor located in an optical path of the projection optical system, wherein the following condition is satisfied:

$$0.46 < C/L < 0.64,$$

where C is a total thickness along the optical axis of the radiation transmitting refractor located in the optical path of the projection optical system and L is a distance from the first surface to the second surface.

A third fabrication method of a projection optical system according to the present invention is a method of fabricating a projection optical system for forming a reduced image of a pattern on a first surface, onto a second surface, comprising a step of preparing a first lens unit having a negative refracting power, a step of preparing a second lens unit having a positive refracting power, a step of preparing a third lens unit having a negative refracting power, a step of preparing a fourth lens unit having a positive refracting power, a step of preparing an aperture stop, a step of preparing a fifth lens unit having a positive refracting power, and a step of locating the first lens unit, the second lens unit, the third lens unit, the fourth lens unit, the aperture stop, and the fifth lens unit in the order named from the first surface side, wherein the first lens unit to the fifth lens unit are prepared so as to satisfy the following condition:

$$0.46 < C/L < 0.64,$$

where C is a total thickness along the optical axis of a light-transmitting refractor located in an optical path of the projection optical system and L a distance from the first surface to the second surface.

For accomplishing the foregoing third object, a seventh projection optical system according to the present invention is a projection optical system for forming a reduced image of a pattern on a first surface, onto a second surface, comprising at least three lens surfaces of aspheric shape, wherein the following condition is satisfied:

$$0.15 < Ea/E < 0.7,$$

where E is the total number of members having their respective refracting powers among radiation-transmitting refractors in the projection optical system and Ea the total number of members each provided with a lens surface of aspheric shape.

A fourth fabrication method of a projection optical system according to the present invention is a method of fabricating a projection optical system for forming a reduced image of a pattern on a first surface, onto a second surface, comprising: a step of preparing light-transmitting members so that at least three surfaces of lens surfaces of the radiation-transmitting refractors are of aspheric shape and so that the following condition is satisfied:

$$0.15 < Ea/E < 0.7,$$

where E is the total number of members having their respective refracting powers among the radiation-transmitting refractors and Ea the total number of members each provided with a lens surface of aspheric shape; and a step of assembling the radiation transmitting members.

A first projection exposure apparatus according to present invention is a projection exposure apparatus for projecting a reduced image of a pattern provided on a projection master, onto a workpiece to effect exposure thereof, comprising: a light source for supplying exposure light; an illumination optical system for guiding the exposure light from the light source to the pattern on the projection master; and the projection optical system being either one selected from said projection systems; wherein the projection master can be placed on the first surface of the projection optical system, and the workpiece be placed on the second surface.

A second projection exposure apparatus according to the present invention is a projection exposure apparatus for projecting a reduced image of a pattern provided on a projection master, onto a workpiece to effect exposure thereof while scanning, comprising: a light source for supplying exposure light; an illumination optical system for guiding the exposure light from the light source to the pattern on the projection master; the projection optical system being either one selected from said projection optical systems; a first stage for enabling the projection master to be placed on the first surface of the projection optical system; and a second stage for enabling the workpiece to be placed on the second surface; wherein the first and second stages are movable at a ratio of speeds according to a projection magnification of the projection optical system.

For accomplishing the foregoing fourth object, a third projection exposure apparatus according to the present invention is a projection exposure apparatus for projecting a reduced image of a pattern provided on a projection master, onto a workpiece to effect exposure thereof, comprising: a light source for supplying exposure light in a wavelength region of not more than 180 nm; an illumination optical system for guiding the exposure light from the light source to the pattern on the projection master; and a projection optical system located in an optical path between the projection master and the workpiece, the projection optical system guiding 25% or more by quantity of the exposure light having passed through the projection master, to the workpiece to form the reduced image of the pattern on the workpiece.

A first projection exposure method according to the present invention is a projection exposure method of projecting a pattern formed on a projection master, onto a workpiece to effect exposure thereof, which uses the projection exposure apparatus being either one of the projection exposure apparatus, wherein the projection master is placed on the first surface and the workpiece is placed on the second surface, and wherein an image of the pattern is formed on the workpiece through the projection optical system.

A fourth projection exposure apparatus and a second projection exposure method according to the present invention are a projection exposure apparatus and a projection exposure method for projecting a reduced image of a pattern provided on a projection master, onto a workpiece to effect exposure thereof, which comprise: a light source for supplying exposure light in a wavelength region of not more than 200 nm; an illumination optical system for guiding the exposure light from the light source to the pattern on the projection master; and a projection optical system located in an optical path between the projection master and the workpiece, the projection optical system guiding the exposure light having passed through the projection master, to the workpiece to form the reduced image of the pattern on the workpiece; wherein the following condition is satisfied:

$$(En4/En3) > (En2/En1)$$

where En1 is a quantity of the exposure light traveling from the light source to the illumination optical system, En2 a quantity of the exposure light traveling from the illumination optical system to the projection master, En3 a quantity of the exposure light entering the projection optical system, and En4 a quantity of the exposure light emerging from the projection optical system toward the workpiece.

A first microdevice fabrication method according to the present invention is a method of fabricating a microdevice having a predetermined circuit pattern, comprising: a step of projecting an image of the pattern onto the workpiece to effect exposure thereof, using the foregoing exposure method; and a step of developing the workpiece after the projection exposure.

Next, for accomplishing the foregoing first or second object, a fifth projection exposure apparatus according to the present invention is a projection exposure apparatus for projecting a pattern on a projection master onto a workpiece to effect exposure thereof, comprising: an illumination optical system for supplying exposure light of a wavelength of not more than 200 nm to the projection master; and a projection optical system for forming an image of the pattern on the projection master, at a predetermined projection magnification β on the workpiece; wherein the projection optical system comprises an aperture stop, a front lens unit located between the aperture stop and the projection master, and a rear lens unit located between the aperture stop and the workpiece, wherein, where y (kg) represents a translated amount of fluorite of a disk member from an amount of fluorite among light-transmitting optical materials in the projection optical system, f2 (mm) represents a focal length of the rear lens unit, and NAw represents a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

A sixth projection exposure apparatus according to the present invention is a scanning projection exposure apparatus for projecting a pattern on a projection master onto a workpiece to effect exposure thereof while scanning, comprising: an illumination optical system for supplying exposure light of a wavelength of not more than 200 nm to the projection master; and a projection optical system for forming an image of the pattern on the projection master, at a predetermined projection magnification β on the workpiece; wherein the projection optical system comprises an aperture stop, a front lens unit located between the aperture stop and the projection master, and a rear lens unit located between the aperture stop and the workpiece, wherein, where y (kg) represents a translated amount of fluorite of a disk member from an amount of fluorite among light-transmitting optical materials in the projection optical system, f2 (mm) a focal length of the rear lens unit, and NAw a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

A seventh projection exposure apparatus according to the present invention is a projection exposure apparatus for projecting a pattern on a projection master onto a workpiece to effect exposure thereof, comprising: an illumination optical system for supplying exposure light of a wavelength of not more than 200 nm to the projection master; and a projection optical system for forming an image of the pattern on the projection master, at a predetermined projection magnification β on the workpiece; wherein the projection optical system comprises an aperture stop, a front lens unit located between the aperture stop and the projection master, and a rear lens unit located between the aperture stop and the workpiece, wherein, where y (kg) represents a translated amount of fluorite of a disk member from an amount of fluorite among light-transmitting optical materials in the projection optical system, f2 (mm) a focal length of the rear lens unit, and NAw a maximum numerical aperture on the image side of the projection optical system, and where a parameter x is defined as follows:

$$x = f2 \cdot 4|\beta| \cdot NAw^2;$$

the following conditions are satisfied:

$$y \leq (9x/2) - 270,$$

$$y \leq 90,$$

$$y \geq (9x/2) - (855/2), \text{ and}$$

$$y \geq 0.$$

An eighth projection exposure apparatus according to the present invention is a projection exposure apparatus for projecting a pattern on a projection master onto a workpiece to effect exposure thereof, comprising: an illumination optical system for supplying exposure light of a wavelength of not more than 200 nm to the projection master; and a projection optical system for forming an image of the pattern on the projection master, at a predetermined projection magnification β on the workpiece; wherein the projection optical system comprises an aperture stop, a front lens unit located between the aperture stop and the projection master, and a rear lens unit located between the aperture stop and the workpiece, wherein, where y (kg) represents a translated amount of a first material of a disk member from an amount of the first material among light-transmitting optical materials in the projection optical system, f2 (mm) represents a focal length of the rear lens unit, and NAw represents a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

Next, for accomplishing the foregoing first or second object, a third projection exposure method according to the present invention is a projection exposure method of projecting a pattern on a projection master onto a workpiece to effect exposure thereof, comprising: an illumination step of supplying exposure light of a wavelength of not more than 200 nm to the projection master; and an image forming step of forming an image of the pattern on the projection master, at a predetermined projection magnification β on the workpiece, using a projection optical system comprising a front lens unit, an aperture stop, and a rear lens unit; wherein the image forming step comprises a first auxiliary step of guiding the light from the projection master to the front lens unit, a second auxiliary step of guiding the light passing through the front lens unit, to the aperture stop, a third auxiliary step of guiding the light passing through the aperture stop, to the rear lens unit, and a fourth auxiliary step of forming the image of the pattern on the workpiece, using the light passing through the rear lens unit, wherein, where y (kg) represents a translated amount of fluorite of a disk member from an amount of fluorite among light-transmitting optical materials in the projection optical system, f2 (mm) represents a focal length of the rear lens unit, and NAw represents a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

A fourth projection exposure method according to the present invention is a projection exposure method of projecting a pattern on a projection master onto a workpiece to effect exposure thereof, comprising: an illumination step of supplying exposure light of a wavelength of not more than 200 nm to the projection master; and an image forming step of forming an image of the pattern on the projection master, at a predetermined projection magnification β on the workpiece, using a projection optical system comprising a front lens unit, an aperture stop, and a rear lens unit; wherein the image forming step comprises a first auxiliary step of guiding the light from the projection master to the front lens unit, a second auxiliary step of guiding the light passing through the front lens unit, to the aperture stop, a third auxiliary step of guiding the light passing through the aperture stop, to the rear lens unit, and a fourth auxiliary step of forming the image of the pattern on the workpiece, using the light passing through the rear lens unit, wherein, where y (kg) represents a translated amount of a first material of a disk member from an amount of the first material among light-transmitting optical materials in the projection optical system, f2 (mm) represents a focal length of the rear lens unit, and NAw represents a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

Next, a fabrication method of projection exposure apparatus according to the present invention is a method of fabricating the fifth, sixth, or seventh projection exposure apparatus of the present invention, comprising a step of preparing an illumination optical system for supplying exposure light of a wavelength of not more than 200 nm to the projection master; and a step of preparing a projection optical system for forming an image of the pattern on the projection master, at a predetermined projection magnification β on the workpiece; wherein the step of preparing the projection optical system comprises an auxiliary step of preparing a front lens unit, an aperture stop, and a rear lens unit, an auxiliary step of locating the front lens unit between positions where the aperture stop and the projection master are located respectively, and an auxiliary step of locating the rear lens unit between positions where the aperture stop and the workpiece are located respectively.

Next, a second microdevice fabrication method of the present invention is a method of fabricating a microdevice having a predetermined circuit pattern, comprising: a step of projecting an image of the pattern onto the workpiece to effect exposure thereof, using the third or fourth projection exposure method of the present invention; and a step of developing the workpiece after the projection exposure.

Next, for accomplishing the foregoing first or second object, an eighth projection optical system of the present invention is a dioptric projection optical system for forming an image of a pattern on a first surface, on a second surface, using light of a wavelength of not more than 200 nm, comprising: an aperture stop; a front lens unit located between the aperture stop and the first surface; and a rear lens unit located between the aperture stop and the second surface; wherein, where y (kg) represents a translated amount of fluorite of a disk member from an amount of fluorite among light-transmitting optical materials in the projection optical system, f2 (mm) a focal length of the rear lens unit, β a projection magnification of the projection optical system, and NAw a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

A ninth projection optical system according to the present invention is a dioptric projection optical system for forming an image of a pattern of a first surface on a second surface, using light of a wavelength of not more than 200 nm, comprising: an aperture stop; a front lens unit located between the aperture stop and the first surface; and a rear lens unit located between the aperture stop and the second surface; wherein, where y (kg) represents a translated amount of a first material of a disk member from an amount of the first material among light-transmitting optical materials in the projection optical system, f2 (mm) represents a focal length of the rear lens unit, β a projection magnification of the projection optical system, and NAw represents a maximum numerical aperture on the image side of the projection optical system, and where a parameter x is defined as follows:

$$x = f2 \cdot 4|\beta| \cdot NAw^2;$$

the following conditions are satisfied:

$$y \leq 4x - 200,$$

$$y \leq (4x/13) + (1000/13),$$

$$y \geq 4x - 440, \text{ and}$$

$$y \geq 0.$$

Fifth and sixth fabrication methods of a projection optical system according to the present invention are methods of fabricating the eighth and ninth projection optical systems, respectively, of the present invention, which comprise a step of preparing a front lens unit, an aperture stop, and a rear lens unit, a step of locating the front lens unit between the aperture stop and the first surface, and a step of locating the rear lens unit between the aperture stop and the second surface.

BEST MODE FOR CARRYING OUT THE INVENTION

Figure 1:
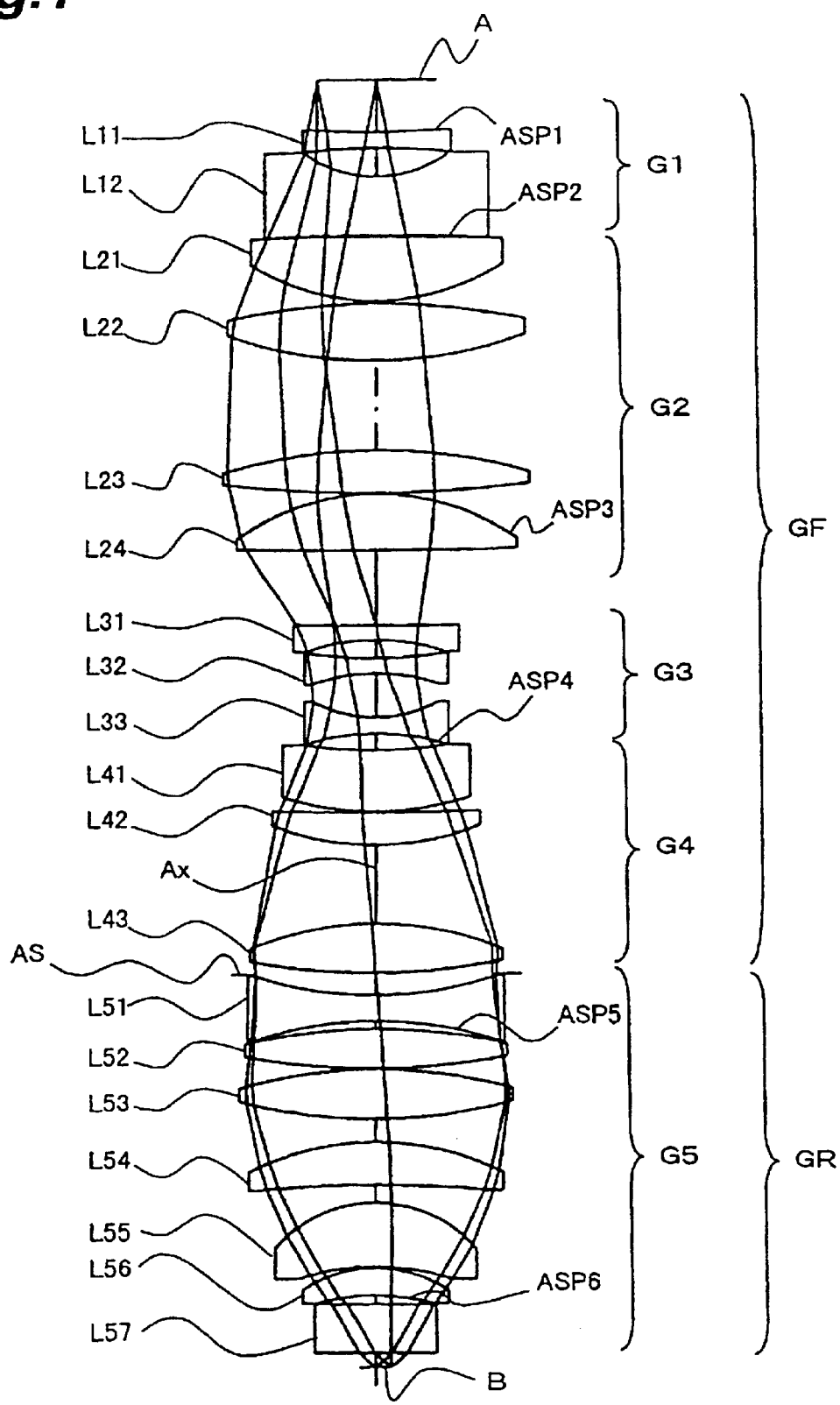
FIG. 1 is an optical path diagram of a projection optical system according to a first numerical example of the present invention.
Figure 2:
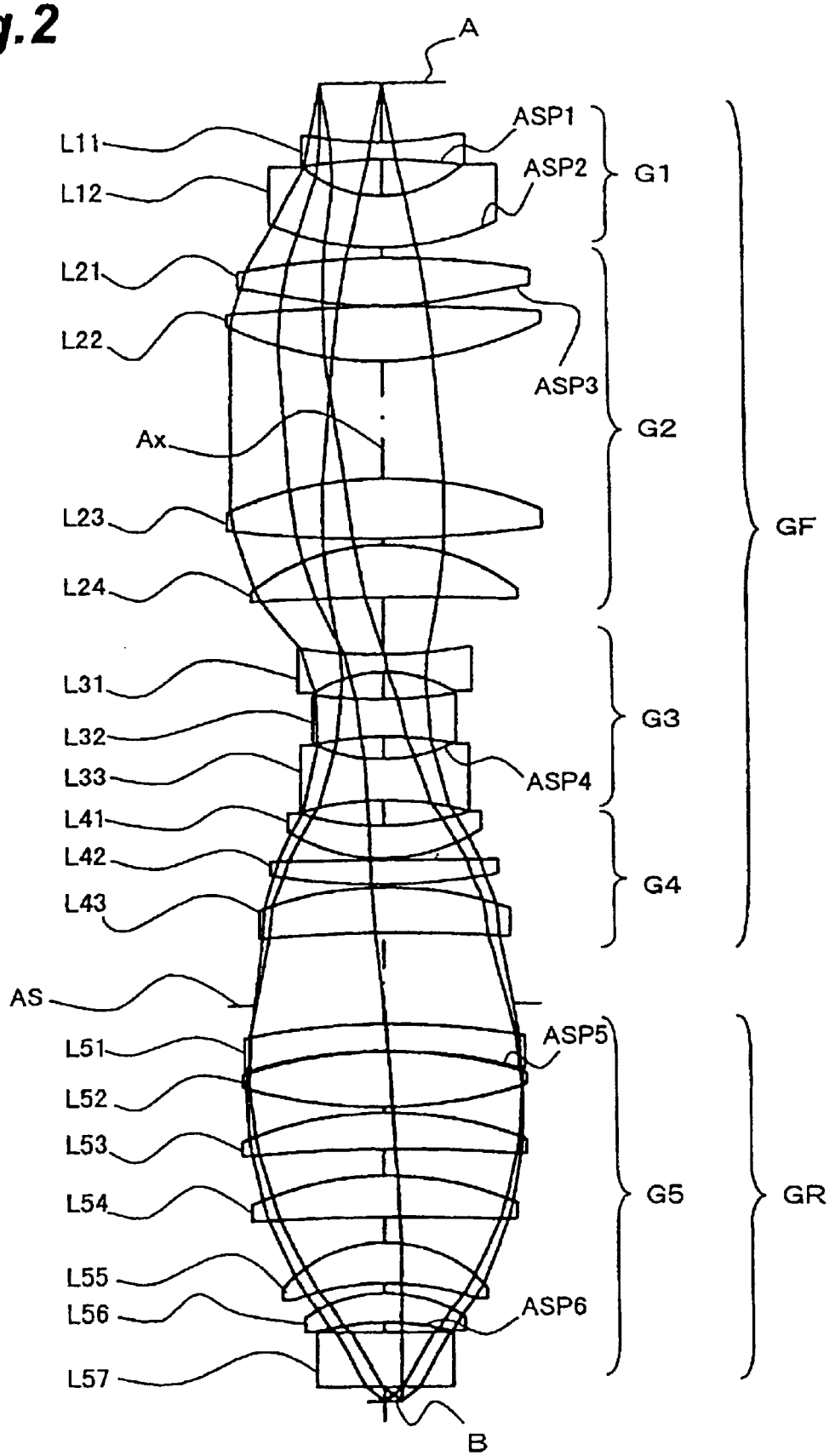
FIG. 2 is an optical path diagram of a projection optical system according to a second numerical example of the present invention.

Preferred embodiments of the present invention will be described with reference to the drawings. FIG. 1 and FIG. 2 are optical path diagrams of projection optical systems (which will be also referred to as "projection optical system PL") according to examples of embodied forms of the first to seventh projection optical systems of the present invention.

In FIG. 1 and FIG. 2, the projection optical system PL of the present invention is a dioptric projection optical system for imaging a reduced image of a pattern on a first surface A, onto a second surface B. The projection optical system PL has a front lens unit GF of a positive refracting power and a rear lens unit GR of a positive refracting power. An aperture stop AS is located in the vicinity of a rear focal point of the front lens unit GF. The position of the aperture stop AS does not always have to be limited to the paraxial, rear focus position of the front lens unit GF. For example, where there exists the field curvature of the pupil of the projection optical system PL, a vignetting (eclipse) difference can occur in the image field with change in the aperture diameter of the aperture stop AS. In order to prevent or reduce this vignetting difference, there are also cases wherein the position of the aperture stop AS is set to a position off the paraxial, rear focal point of the front lens unit GF (e.g., on the rear lens unit side from the paraxial, rear focal point). The aforementioned "vicinity of the rear focal point" is thus a concept also involving such off positions. In such cases, the rear lens unit GR (fifth lens unit) represents an assembly of a group of lenses located from the paraxial pupil position of the projection optical system PL to the second surface.

In the examples of FIG. 1 and FIG. 2, the aperture stop AS is located between the front lens unit GF and the rear lens unit GR.

The front lens unit GF has a first lens unit G1 of a negative refracting power, a second lens unit G2 of a positive refracting power, a third lens unit G3 of a negative refracting power, and a fourth lens unit of a positive refracting power in the order named from the first surface side. Accordingly, the projection optical system PL of the present invention is also a projection optical system of a five-unit configuration consisting of the first lens unit G1 to fifth lens unit G5 of the negative, positive, negative, positive, and positive refracting powers.

The projection optical system PL according to the embodiments of FIG. 1 and FIG. 2 is an optical system substantially telecentric on the first surface A side and on the second surface B side. Here "substantially telecentric on the first surface side and on the second surface side" means that when a ray parallel to the optical axis Ax of the projection optical system is made incident from the second surface B side into the projection optical system PL, an angle between the optical axis and this ray as emitted toward the first surface, is not more than 50 minutes.

In the projection optical system of each embodiment, constructed in this way, even if there occurs a positional deviation in the direction along the optical axis of a reticle (mask) as a projection master or a photosensitive substrate (a wafer, a plate, or the like) as a workpiece, or a change of shape due to warped or the like of these projection master and workpiece, it is feasible to control the magnification error and distortion of the image due to them to a small level.

In the projection optical system of each embodiment, the following condition is preferably satisfied:

$$0.065 < f2/L < 0.125 \qquad (1),$$

where f2 represents the focal length of the rear lens unit GR (or the fifth lens unit G5) and L the distance from the first surface A to the second surface B (object-image distance).

The above condition (1) is a formula defined for reducing chromatic aberration of the projection optical system, particularly, axial chromatic aberration. In the range below the lower limit of Condition (1), the focal length of the rear lens unit GR (or the fifth lens unit G5) becomes too short. For this reason, the rear lens unit GR (or the fifth lens unit G5) produces extremely small quantity of axial chromatic aberration but too large monochromatic aberrations, which are too difficult to correct, undesirably. For further satisfactory correction of the monochromatic aberrations except for the chromatic aberration, it is preferable to set the lower limit of Condition (1) to 0.075, and for better correction of the monochromatic aberrations, it is more preferable to set the lower limit of Condition (1) to 0.09.

In the range above the upper limit of Condition (1), the focal length of the rear lens unit GR (or the fifth lens unit G5) becomes too long. In this case, while the correction of the monochromatic aberrations can be made well, the rear lens unit GR (or the fifth lens unit G5) undesirably produces large axial chromatic aberration. In this case, it is necessary to narrow the wavelength band of the exposure light from the light source or add a refracting optical member for correction of chromatic aberration to the projection optical system PL, which is likely to increase the loads on the light source or increase the cost of the projection optical system PL. For further suppressing occurrence of axial chromatic aberration of the projection optical system, it is thus preferable to set the upper limit of Condition (1) to 0.12.

When the exposure light is one of not more than 180 nm, only limited kinds of radiation-transmitting refractors can transmit the exposure light in this wavelength region and thus there is the possibility that the projection optical system PL itself can not be established in the range over the upper limit of Condition (1).

In the above structure, the projection optical system PL preferably has at least one surface of aspheric shape, ASP1 to ASP6. When Condition (1) holds, it is further preferable to construct the projection optical system PL so that it is provided with at least six lenses having their respective refracting powers and so that when six lenses are selected in order from the first surface A side (lenses L11, L12, L21, L22, L23, and L24 in FIG. 1 and FIG. 2) of the lenses having their respective refracting powers, at least one surface of the six lenses is of an aspheric shape having a negative refracting power.

Describing this action, it is common practice to measure the aspheric surfaces by the Null Test using an element that makes a specific wavefront, so called a null lens or the like (which will be called a "null element"). For making a wavefront matching an aspheric surface to be inspected, by a null element, the aspheric surface better has a negative refracting power or is concave, because it can prevent increase of the size of the null element and increase degrees of freedom for the wavefront of the aspheric shape to be made.

If Condition (1) does not always hold, it is preferable to construct the projection optical system PL so that it is provided with at least three lenses having their respective refracting powers and so that when three lenses are selected in order from the first surface A side (lenses L11, L12, and L21 in FIG. 1 and FIG. 2) of the lenses having their respective refracting powers, at least one of the three lenses is of an aspheric shape having a negative refracting power. In this case, for making a wavefront matching an aspheric surface to be inspected, by a null element for the null test, it is better for the aspheric surface to have a negative refracting power, i.e., to be concave, because it can prevent the increase of the size of the null element and increase degrees of freedom for the wavefront of the aspheric shape to be made.

As described previously, the projection optical system PL of each embodiment has the power layout of the negative, positive, negative, positive, and positive refracting powers, and thus has the advantage of largely decreasing the number of lenses, as compared with the conventional projection optical systems of the 6-unit configuration having the power layout of positive, negative, positive, negative, positive, and positive refracting powers.

In the projection optical system PL of each embodiment, let us consider a composite optical system of the negative, first lens unit G1 and the positive, second lens unit G2, and let β1 be a lateral magnification of this composite optical system (a composite lateral magnification of the first and second lens units G1, G2), L1 be a distance from the first surface A to the lens surface closest to the second surface B in the second lens unit G2, and L be a distance from the first surface A to the second surface B. Then the projection optical system preferably satisfies the following conditions (2) and (3).

$$-1.3 < 1/\beta 1 < 0 \qquad (2)$$
$$0.08 < L1/L < 0.17 \qquad (3)$$

The above condition (2) is a condition defined for accomplishing good aberration correction in the entire field (the entire image field) of the projection optical system PL. As apparent from Condition (2), the composite optical system of the first and second lens units G1, G2 in the projection optical system PL of each embodiment, converts a diverging beam from the first surface A into a slightly converging beam.

In the range below the lower limit of Condition (2), the beam converging action in this composite optical system G1, G2 becomes too strong, so as to increase aberration, particularly, aberration concerning angles of view, which undesirably makes it difficult to ensure the sufficient image field of the projection optical system PL. For further suppressing occurrence of the aberration concerning angles of view, it is preferable to set the lower limit of Condition (2) to −1.10.

In the range above the upper limit of Condition (2) on the other hand, the negative refracting power of the first lens unit G1 becomes too weak, so as to degrade the Petzval sum of the projection optical system PL, which undesirably makes it difficult to ensure the sufficient image field of the projection optical system PL. For better correction of the Petzval sum of the projection optical system PL, it is preferable to set the upper limit of Condition (2) to −0.42.

Condition (3) is a formula as a premise of above Condition (2) and defines the position of the composite optical system G1, G2 of the first and second lens units. It is preferable herein to set the lower limit of Condition (3) to 0.1 and the upper limit of Condition (3) to 0.15.

The composite optical system G1, G2 of the first and second lens units preferably has at least two lens surfaces of aspheric shape, ASP1 to ASP3. It is feasible to correct field curvature, distortion, spherical aberration of pupil, etc. well by the action of the aspheric surfaces ASP1 to ASP3 in this composite optical system G1, G2.

The composite optical system G1, G2 of the first and second lens units is preferably composed of ten or less lenses. This configuration makes it feasible to ensure the transmittance of the projection optical system PL, reduce occurrence of flare, and decrease the cost in production.

The projection optical system PL of each embodiment preferably satisfies the following condition:

$$0.46 < C/L < 0.64 \tag{4},$$

where C is a total thickness along the optical axis of radiation-transmitting refractors (lenses and parallel-plane plates) located in the optical path of the projection optical system PL and L the distance from the first surface A to the second surface B.

The above condition (4) is a formula defined in order to achieve both the satisfactory transmittance of the projection optical system PL and the stable imaging performance of the projection optical system PL.

In the range below the lower limit of the above condition (4), spacings of gas between the radiation-transmitting refractors making the projection optical system PL become too long, so that variation in the properties of this gas (e.g., occurrence of variation of refractive index due to temperature variation, pressure variation, etc., occurrence of fluctuation, and so on) can undesirably cause variation of the imaging performance. In order to further improve the stability of the imaging performance against the environmental variations, it is preferable to set the lower limit of Condition (4) to 0.52.

In the range over the upper limit of the above condition (4), while improvement is made in the resistance of the projection optical system PL against the environmental variations, it undesirably becomes difficult to yield the satisfactory transmittance. In order to further ensure the satisfactory transmittance, it is preferable to set the upper limit of Condition (4) to 0.625.

In the structure satisfying the above condition (4), the projection optical system PL preferably has at least one aspheric surface, ASP1 to ASP6. This makes it feasible to sufficiently enhance the initial imaging performance and ensure the satisfactory transmittance and the stability against the environmental variations.

The projection optical system PL of each embodiment preferably has at least three lens surfaces of aspheric shape, ASP1 to ASP6. This structure permits good aberration correction to be made across the entire field (the entire image field) under the configuration including the relatively small number of lenses (i.e., amount of glass).

It is, however, noted that it is not preferable to increase the number of the aspheric lens surfaces ASP1 to ASP6 more than necessary, and the following condition is preferably satisfied:

$$0.15 < Ea/E < 0.7 \tag{5},$$

where E is the total number of members having their respective refracting powers (lens elements) among the radiation-transmitting refractors in the projection optical system PL and Ea the total number of members provided with the aspheric lens surfaces ASP1 to ASP6.

The above condition (5) is a formula for defining the optimum range of the number of the aspheric lens surfaces ASP1 to ASP6 in consideration of production of the projection optical system PL. The degree of difficulty in production of the aspheric lenses is higher than that of spherical lenses and there are tendencies to make large eccentric errors between front and back surfaces of the aspheric lenses, and large errors of profile irregularity. Accordingly, in production of the projection optical system PL, it is preferable to optimize the imaging performance of the projection optical system PL, by compensating for the errors of the aspheric lenses by adjusting the position and posture of the spherical lenses and adjusting the surface profiles of the spherical lenses.

In the range over the upper limit of the above condition (5), the aberration appears too large due to the errors of the aspheric lens surfaces ASP1 to ASP6 and the number of spherical lenses is also small, so that it becomes difficult to correct the aberration due to the errors of the aspheric surfaces ASP1 to ASP6 by the adjustment of the position and posture and the adjustment of the profiles of the spherical lenses. For further facilitating the production of the projection optical system PL, it is preferable to set the upper limit of Condition (5) to 0.42.

In the range below the lower limit of the above condition (5) on the other hand, while the number of the aspheric lens surfaces is small and the production of the projection optical system PL is easy, it becomes difficult to implement good aberration correction across the entire field (the entire image field) and the amount of necessary glass materials is increased for production of the projection optical system PL, undesirably. In order to implement better aberration correction and decrease the amount of glass, it is preferable to set the lower limit of Condition (5) to 0.2.

In the projection optical system PL of each embodiment, the total number of the members having their respective refracting powers (lens elements) among the radiation-transmitting refractors making the projection optical system PL, is preferably not less than 16. This makes it feasible to increase the numerical aperture on the image side (on the second surface B side) of the projection optical system PL and implement projection exposure of finer patterns. When the above condition (5) is met and when the total number of the lens elements is not less than 16, there is the advantage of ensuring the sufficient number of spherical lenses for correcting the aberration due to the errors of the aspheric lenses.

In the projection optical system PL of each embodiment, the total number of the members having their respective refracting powers (lens elements) among the radiation-transmitting refractors making the projection optical system PL, is preferably not more than 26. This is effective in increasing the transmittance because of decrease in thickness of the radiation-transmitting refractors making the projection optical system PL. In addition, it decreases the number of optical interfaces (lens surfaces) and thus decreases losses in quantity of light at the optical interfaces, thus increasing the transmittance of the entire system.

In the embodiment of FIG. 1, the radiation-transmitting refractors in the projection optical system PL are made of a single kind of material. This permits reduction in the production cost of the projection optical system PL. In particular, when the projection optical system PL is optimized for the exposure light of not more than 180 nm, the above construction is effective, because there are only limited glass materials with good transmittance for the exposure light in this wavelength region.

In the embodiment of FIG. 2, the radiation-transmitting refractors in the projection optical system PL include first radiation-transmitting refractors made of a first material and second radiation-transmitting refractors made of a second material. In this case, a percentage of the number of the second radiation-transmitting refractors to the number of the members having their respective refracting powers among the radiation-transmitting refractors, is preferably not more than 32%.

In particular, when the exposure light is one in the vacuum ultraviolet region of not more than 200 nm, materials are limited to some kinds of glass materials with good transmittance for the exposure light in this wavelength region. These glass materials also involve those requiring high production cost and high machining cost for formation of lens. Concerning the above high-cost glass materials, it is difficult to enhance the accuracy in processing into lenses and it is a drawback in seeking for higher accuracy of the projection optical system PL, i.e., higher imaging performance. From this viewpoint, when the projection optical system PL is produced using plural kinds of glass materials and when the above percentage is controlled to not more than 32%, it is feasible to achieve both reduction of production cost and improvement in the imaging performance. The above percentage is preferably not more than 16% and more preferably not more than 11%.

Numerical embodiments will be described below.

FIG. 1 is the optical path diagram of the projection optical system PL according to the first embodiment.

The projection optical system PL of the first embodiment uses the wavelength of 157.62 nm supplied from the band-narrowed $F_2$ laser, as a reference wavelength and the chromatic aberration is corrected in the range of the wavelength band ±0.2 pm for the reference wavelength. In the first embodiment, all the radiation-transmitting refractors (lenses L11 to L57) in the projection optical system PL are made of fluorite (calcium fluoride, $CaF_2$).

As shown in FIG. 1, the projection optical system PL of the first embodiment has the front lens unit GF of the positive refracting power, the aperture stop AS, and the rear lens unit GR of the positive refracting power in the order named from the first surface A side. According to another grouping, the projection optical system PL of the first embodiment has the negative, first lens unit G1, the positive, second lens unit G2, the negative, third lens unit G3, the positive, fourth lens unit G4, the aperture stop AS, and the positive, fifth lens unit G5 in the order named from the first surface A side.

The first lens unit G1 has a negative lens L11 of the biconcave shape and a negative lens L12 of the meniscus shape with a concave surface facing to the first surface A side, and these negative lenses L11, L12 make a gas lens of the biconvex shape. Here the lens surface on the first surface A side of the negative lens L11 and the lens surface on the second surface B side of the negative lens L12 are constructed in the aspheric shape.

The second lens unit G2 has four positive lenses L21 to L24 of the biconvex shape. Here the lens surface on the first surface A side of the positive lens L24 closest to the second surface B is constructed in the aspheric shape.

The third lens unit G3 has three negative lenses L31 to L33 of the biconcave shape and these negative lenses L31 to L33 make two gas lenses of the biconvex shape. Here the lens surface on the second surface B side of the negative lens L33 closest to the second surface B is constructed in the aspheric shape.

The fourth lens unit G4 has two positive lenses L41, L42 of the meniscus shape with a concave shape facing to the first surface A side, and a positive lens L43 of the biconvex shape in the order named from the first surface A side.

The fifth lens unit G5 has a negative lens L51 of the biconcave shape, two positive lenses L52, L53 of the biconvex shape, three positive lenses L54 to L56 of the meniscus shape with a convex surface facing to the first surface A side, and a positive lens L57 of the planoconvex shape. Here the lens surface on the second surface B side of the positive lens L56 is constructed in the aspheric shape.

FIG. 2 is the optical path diagram of the projection optical system PL according to the second embodiment.

The projection optical system PL of the second embodiment uses the wavelength of 193.306 nm supplied from the band-narrowed ArF laser, as a reference wavelength and implements correction for chromatic aberration in the range of the wavelength band ±0.4 pm for the reference wavelength. In the second embodiment, the radiation-transmitting refractors in the projection optical system PL are made of silica glass (synthetic quartz) and fluorite.

As shown in FIG. 2, the projection optical system PL of the second embodiment has the front lens unit GF of the positive refracting power, the aperture stop AS, and the rear lens unit GR of the positive refracting power in the order named from the first surface A side. According to another grouping, the projection optical system PL of the first embodiment has the negative, first lens unit G1, the positive, second lens unit G2, the negative, third lens unit G3, the positive, fourth lens unit G4, the aperture stop AS, and the positive, fifth lens unit G5 in the order named from the first surface A side.

The first lens unit G1 has a negative lens L11 of the biconcave shape and a negative lens L12 of the meniscus shape with a concave surface facing to the first surface A side, in the order named from the first surface A side, and these negative lenses L11, L12 make a gas lens of the biconvex shape. Here the lens surface on the second surface B side of the negative lens L11 and the lens surface on the second surface B side of the negative lens L12 are constructed in the aspheric shape. These two negative lenses L11, L12 are made both of silica glass.

The second lens unit G2 has three positive lenses L21 to L23 of the biconvex shape and a positive lens L24 of the meniscus shape with a convex surface facing to the first surface A side, in the order named from the first surface A side. Here the lens surface on the second surface side of the positive lens L21 closest to the first surface A is constructed in the aspheric shape. In the second lens unit G2, the three, biconvex, positive lenses L21 to L23 are made of silica glass, and the positive lens L24 of the meniscus shape is of fluorite.

The third lens unit G3 has three negative lenses L31 to L33 of the biconcave shape, and these negative lenses L31 to L33 make two gas lenses of the biconvex shape. Here the lens surface on the first surface A side of the negative lens L33 closest to the second surface B is constructed in the aspheric shape. All the negative lenses L31 to L33 in the third lens unit G3 are made of silica glass.

The fourth lens unit G4 has a positive lens L41 of the meniscus shape with a concave shape facing to the first surface A side, a positive lens L42 of the planoconvex shape with a convex surface facing to the second surface B side, and a positive lens L43 of the meniscus shape with a convex surface facing to the first surface A side, in the order named from the first surface A side. Here the three positive lenses L41 to L43 are made all of silica glass.

The fifth lens unit G5 has a negative lens L51 of the meniscus shape with a convex surface facing to the first surface A side, a positive lens L52 of the biconvex shape, four positive lenses L53 to L56 of the meniscus shape with a convex surface facing to the first surface A side, and a negative lens L57 of the planoconcave shape with a concave surface facing to the first surface A side, in the order named from the first surface A side. Here the lens surface on the second surface B side of the negative lens L51 of the meniscus shape and the lens surface on the second surface side of the positive lens L56 of the meniscus shape are constructed in the aspheric shape. In the fifth lens unit G5, the positive lens L52 of the biconvex shape is made of fluorite and the rest lenses L51, L53 to L57 are of silica glass.

When the silica glass (synthetic quartz) and fluorite are used as lens materials (glass materials), as in the case of the projection optical system PL of the second embodiment, the lens surfaces of the aspheric shape are preferably formed in the lenses of silica glass.

Table 1 and Table 2 below provide the specifications of the projection optical system PL of the first and second embodiments. In Table 1 and Table 2, the left end column indicates numbers of the respective lens surfaces from the first surface A, the second column radii of curvature of the respective lens surfaces, the third column surface spacings from each lens surface to a next lens surface, the fourth column lens materials, the fifth column symbols of the aspheric surfaces, and the sixth column symbols of the respective lenses. A radius of curvature in the second column for each aspheric lens surface represents a radius of curvature at a vertex thereof. In Table 2, $\phi_{eff}$ represents a clear aperture diameter of each lens surface.

The aspheric shape is expressed by Eq. (a) below.

$$Z(Y) = \frac{Y^2/r}{1 + \sqrt{1 - (1+\kappa)Y^2/r^2}} + AY^4 + BY^6 + CY^8 + DY^{10} + EY^{12} + FY^{14} \quad (a)$$

Y: height from the optical axis
z: distance along the direction of the optical axis from a tangent plane at the vertex of each aspheric surface to the aspheric surface
r: radius of curvature at the vertex
κ: conical coefficient
A, B, C, D, E, F: aspheric coefficients In the last part of Table 1 and Table 2 there are presented the conical coefficient κ and the aspheric coefficients A, B, C, D, E, F for each aspheric surface as [aspheric data].

The projection optical system of the first embodiment uses fluorite as the lens material (glass material) and the second embodiment silica glass (synthetic quartz) and fluorite.

The refractive index of fluorite at the reference wavelength (157.62 nm) of the first embodiment is 1.5593067 and a change of refractive index per the wavelength+1 pm (dispersion) is $-2.6 \times 10^{-6}$.

In the second embodiment the refractive index of silica glass (synthetic quartz) at the reference wavelength (193.306 nm) is 1.5603261, and a change of refractive index per the wavelength+1 pm (dispersion) is $-1.59 \times 10^{-6}$. Further, the refractive index of fluorite at the reference wavelength (193.306 nm) is 1.5014548 and a change of refractive index per the wavelength+1 pm (dispersion) is $-0.98 \times 10^{-6}$.

In Table 1 and Table 2 below, $SiO_2$ represents silica glass, $CaF_2$ represents fluorite, d0 represents the distance from the first surface A to the surface closest to the first surface A, WD represents the distance from the surface closest to the second surface B, to the second surface B (workpieceing distance), β represents the projection magnification, NA represents the numerical aperture on the second surface B side, and φ represents the diameter of the image circle on the second surface B.

TABLE 1

First Embodiment (FIG. 1)
d0 = 40.6446 (mm)
WD = 10.8134 (mm)
| β | = 1/4
NA = 0.75
Ø = 23 (mm)

| | Radius of curvature (mm) | Surface distance (mm) | Glass | Aspheric surface | Lens |
|---|---|---|---|---|---|
| 1: | −446.6132 | 12.0000 | $CaF_2$ | ASP1 | L11 |
| 2: | 554.7232 | 22.5800 | | | |
| 3: | −92.3259 | 46.8618 | $CaF_2$ | | L12 |
| 4: | −6695.3973 | 1.1105 | | ASP2 | |
| 5: | 3832.9930 | 50.0000 | $CaF_2$ | | L21 |
| 6: | −179.0867 | 2.1599 | | | |
| 7: | 552.3099 | 44.4615 | $CaF_2$ | | L22 |
| 8: | −337.8904 | 72.3130 | | | |
| 9: | 416.2197 | 34.5857 | $CaF_2$ | | L23 |
| 10: | −885.0528 | 1.0000 | | | |
| 11: | 179.8393 | 45.7388 | $CaF_2$ | ASP3 | L24 |
| 12: | −3356.1983 | 59.3145 | | | |
| 13: | −4096.8404 | 12.0000 | $CaF_2$ | | L31 |
| 14: | 160.6568 | 14.5833 | | | |
| 15: | −317.8664 | 12.0000 | $CaF_2$ | | L32 |
| 16: | 146.7839 | 35.8889 | | | |
| 17: | −96.9946 | 12.8163 | $CaF_2$ | | L33 |
| 18: | 190.5253 | 13.5021 | | ASP4 | |
| 19: | −335.6495 | 50.0000 | $CaF_2$ | | L41 |
| 20: | −220.3094 | 1.0000 | | | |
| 21: | −2196.6594 | 26.1615 | $CaF_2$ | | L42 |
| 22: | −200.6039 | 62.7317 | | | |
| 23: | 245.0000 | 38.2977 | $CaF_2$ | | L43 |
| 24: | −522.0290 | 1.0000 | | | |
| 25: | ∞ | 17.3237 | | | AS |
| 26: | −268.6720 | 20.2571 | $CaF_2$ | | L51 |
| 27: | 312.7719 | 6.2767 | | ASP5 | |
| 28: | 421.1502 | 30.5995 | $CaF_2$ | | L52 |
| 29: | −570.5232 | 1.0000 | | | |
| 30: | 392.6194 | 38.7693 | $CaF_2$ | | L53 |
| 31: | −392.6194 | 18.3534 | | | |
| 32: | 208.4943 | 34.4190 | $CaF_2$ | | L54 |
| 33: | 993.1946 | 13.7466 | | | |
| 34: | 100.1780 | 50.0000 | $CaF_2$ | | L55 |
| 35: | 182.3029 | 1.4636 | | | |
| 36: | 100.1446 | 20.5148 | $CaF_2$ | | L56 |
| 37: | 166.7499 | 6.9737 | | ASP6 | |
| 38: | 23871.5667 | 36.7374 | $CaF_2$ | | L57 |
| 39: | ∞ | (WD) | | | |

[Aspheric Data]

ASP1

κ: 0.000000
A: $0.193140 \times 10^{-6}$
B: $-0.824604 \times 10^{-11}$
C: $0.290280 \times 10^{-15}$
D: $-0.163368 \times 10^{-19}$
E: $-0.748150 \times 10^{-23}$
F: $0.191873 \times 10^{-26}$

ASP2

κ: 0.000000
A: $0.489084 \times 10^{-7}$
B: $-0.220485 \times 10^{-11}$
C: $0.962305 \times 10^{-16}$
D: $-0.287934 \times 10^{-20}$
E: $0.318426 \times 10^{-25}$
F: $0.736564 \times 10^{-30}$

TABLE 1-continued

ASP3

κ: 0.000000
A: $-0.350067 \times 10^{-8}$
B: $-0.254455 \times 10^{-12}$
C: $-0.464126 \times 10^{-17}$
D: $-0.307104 \times 10^{-21}$
E: $-0.247414 \times 10^{-27}$
F: $-0.475856 \times 10^{-30}$

ASP4

κ: 0.000000
A: $0.103662 \times 10^{-6}$
B: $-0.141741 \times 10^{-10}$
C: $0.495429 \times 10^{-15}$
D: $0.567158 \times 10^{-19}$
E: $-0.655441 \times 10^{-23}$
F: $0.227245 \times 10^{-27}$

ASP5

κ: 0.000000
A: $0.166512 \times 10^{-7}$
B: $0.572516 \times 10^{-13}$
C: $-0.931419 \times 10^{-17}$
D: $-0.141990 \times 10^{-21}$
E: $0.347373 \times 10^{-26}$
F: $-0.357575 \times 10^{-31}$

ASP6

κ: 0.000000
A: $-0.827300 \times 10^{-8}$
B: $-0.150446 \times 10^{-10}$
C: $-0.119559 \times 10^{-14}$
D: $-0.367677 \times 10^{-19}$
E: $0.140360 \times 10^{-22}$
F: $0.443761 \times 10^{-26}$

TABLE 2

Second Embodiment (FIG. 2)
d0 = 50.2691 (mm)
WD = 12.7196 (mm)
|β| = 1/4
NA = 0.75
Ø = 26.6 (mm)

| | Radius of curvature (mm) | Spacing (mm) | Glass | Aspheric surface | Lens | Ø$_{eff}$ (mm) |
|---|---|---|---|---|---|---|
| 1: | −310.0151 | 14.1998 | SiO$_2$ | | L11 | 61.615337 |
| 2: | 303.6996 | 31.5711 | | ASP1 | | 66.565666 |
| 3: | −100.7999 | 43.9802 | SiO$_2$ | | L12 | 66.983185 |
| 4: | −223.9596 | 9.5226 | | ASP2 | | 93.367592 |
| 5: | 723.6127 | 40.8525 | SiO$_2$ | | L21 | 116.401726 |
| 6: | −326.4452 | 1.4173 | | ASP3 | | 120.452324 |
| 7: | 1771.0971 | 46.9449 | SiO$_2$ | | L22 | 127.712166 |
| 8: | −289.4624 | 104.4363 | | | | 129.745331 |
| 9: | 315.8237 | 54.1717 | SiO$_2$ | | L23 | 129.661499 |
| 10: | −982.0234 | 5.9069 | | | | 126.792755 |
| 11: | 177.1899 | 46.2445 | CaF$_2$ | | L24 | 109.210121 |
| 12: | 2145.8394 | 52.0242 | | | | 103.951401 |
| 13: | −383.7553 | 14.4116 | SiO$_2$ | | L31 | 70.429657 |
| 14: | 103.2214 | 24.7417 | | | | 57.789726 |
| 15: | −406.0024 | 33.8665 | SiO$_2$ | | L32 | 57.333916 |
| 16: | 264.3030 | 20.2564 | | | | 55.370338 |
| 17: | −130.6551 | 36.7937 | SiO$_2$ | ASP4 | L33 | 55.433979 |
| 18: | 243.2466 | 22.7571 | | | | 68.153618 |
| 19: | −214.9802 | 30.3809 | SiO$_2$ | | L41 | 69.129860 |
| 20: | −138.6461 | 1.6720 | | | | 78.097023 |
| 21: | ∞ | 21.7611 | SiO$_2$ | | L42 | 88.842262 |
| 22: | −503.4971 | 3.2133 | | | | 92.214386 |
| 23: | 300.0000 | 39.0994 | SiO$_2$ | | L43 | 100.787971 |
| 24: | 1276.4893 | 64.3575 | | | | 101.914116 |
| 25: | ∞ | 17.6348 | | | AS | 107.438789 |
| 26: | 634.9754 | 23.4375 | SiO$_2$ | | L51 | 112.544273 |
| 27: | 428.5036 | 1.0000 | | ASP5 | | 114.046783 |
| 28: | 374.4189 | 48.2150 | CaF$_2$ | | L52 | 114.698341 |
| 29: | −377.2840 | 5.8246 | | | | 115.519508 |
| 30: | 312.6914 | 30.9155 | SiO$_2$ | | L53 | 115.577393 |
| 31: | 1319.1903 | 24.0395 | | | | 113.770447 |
| 32: | 272.3437 | 35.8174 | SiO$_2$ | | L54 | 107.279770 |
| 33: | 2421.5392 | 21.5533 | | | | 103.251373 |
| 34: | 111.2389 | 35.3044 | SiO$_2$ | | L55 | 82.084534 |
| 35: | 217.9576 | 8.7809 | | | | 74.716202 |
| 36: | 117.8762 | 24.0827 | SiO$_2$ | | L56 | 63.873623 |
| 37: | 206.3743 | 8.3992 | | ASP6 | | 55.041325 |
| 38: | −4906.7588 | 47.4235 | SiO$_2$ | | L57 | 53.879700 |
| 39: | ∞ | (WD) | | | | 27.722666 |

[Aspheric Data]

ASP1

κ: 0.000000
A: $-0.140916 \times 10^{-6}$
B: $0.565597 \times 10^{-11}$
C: $-0.301261 \times 10^{-15}$
D: $-0.207339 \times 10^{-19}$
E: $0.554668 \times 10^{-23}$
F: $-0.585529 \times 10^{-27}$

ASP2

κ: 0.000000
A: $0.319500 \times 10^{-8}$
B: $-0.616429 \times 10^{-12}$
C: $-0.170315 \times 10^{-16}$
D: $0.486911 \times 10^{-20}$
E: $-0.144218 \times 10^{-24}$
F: $0.926412 \times 10^{-29}$

ASP3

κ: 0.000000
A: $0.263695 \times 10^{-7}$
B: $0.676253 \times 10^{-12}$
C: $-0.828213 \times 10^{-17}$
D: $-0.121949 \times 10^{-20}$
E: $0.572412 \times 10^{-25}$
F: $-0.806708 \times 10^{-30}$

ASP4

κ: 0.000000
A: $-0.879103 \times 10^{-7}$
B: $0.950068 \times 10^{-12}$
C: $0.184679 \times 10^{-15}$
D: $0.197968 \times 10^{-19}$
E: $0.107088 \times 10^{-23}$
F: $-0.173148 \times 10^{-27}$

ASP5

κ: 0.000000
A: $0.401293 \times 10^{-8}$
B: $0.300603 \times 10^{-12}$
C: $-0.310130 \times 10^{-17}$
D: $0.269304 \times 10^{-22}$
E: $-0.108809 \times 10^{-27}$
F: $0.341338 \times 10^{-32}$

ASP6

κ: 0.000000
A: $-0.141220 \times 10^{-7}$
B: $-0.760266 \times 10^{-11}$
C: $-0.429061 \times 10^{-15}$
D: $0.179175 \times 10^{-20}$
E: $0.705845 \times 10^{-23}$
F: $-0.321978 \times 10^{-27}$

ASP4

κ: 0.000000
A: $-0.879103 \times 10^{-7}$
B: $0.950068 \times 10^{-12}$
C: $0.184679 \times 10^{-15}$
D: $0.197968 \times 10^{-19}$
E: $0.107088 \times 10^{-23}$
F: $-0.173148 \times 10^{-27}$ TABLE 2-continued

ASP5

κ: 0.000000
A: 0.401293 × 10$^{-8}$
B: 0.300603 × 10$^{-12}$
C: −0.310130 × 10$^{-17}$
D: 0.269304 × 10$^{-22}$
E: −0.108809 × 10$^{-27}$
F: 0.341338 × 10$^{-32}$

ASP6

κ: 0.000000
A: −0.141220 × 10$^{-7}$
B: −0.760266 × 10$^{-11}$
C: −0.429061 × 10$^{-15}$
D: 0.179175 × 10$^{-20}$
E: 0.705845 × 10$^{-23}$
F: −0.321978 × 10$^{-27}$

Now numerals corresponding to the conditions in the respective embodiments are presented in Table 3 below.

TABLE 3

|  | f 2/L (1) | 1/β 1 (2) | L1/L (3) | C/L (4) | E a/E (5) |
|---|---|---|---|---|---|
| Embodiment 1 | 0.108 | −0.74 | 0.120 | 0.604 | 0.316 |
| Embodiment 2 | 0.111 | −0.88 | 0.121 | 0.576 | 0.316 |

As shown in Table 3 above, the first and second embodiments both satisfy the foregoing conditions.

Figure 3:
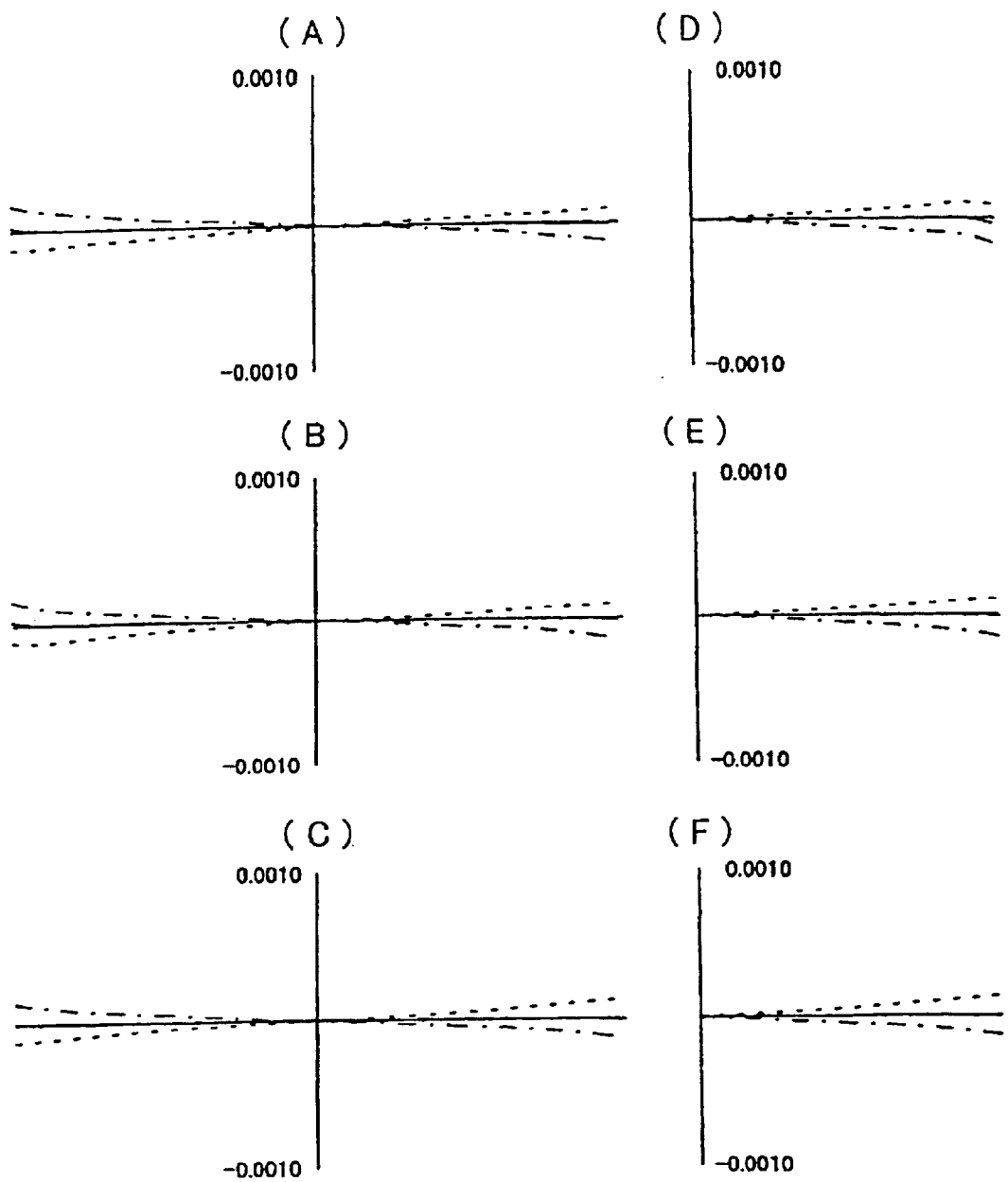
FIG. 3 is lateral aberration charts of the projection optical system of the first numerical example.
Figure 4:
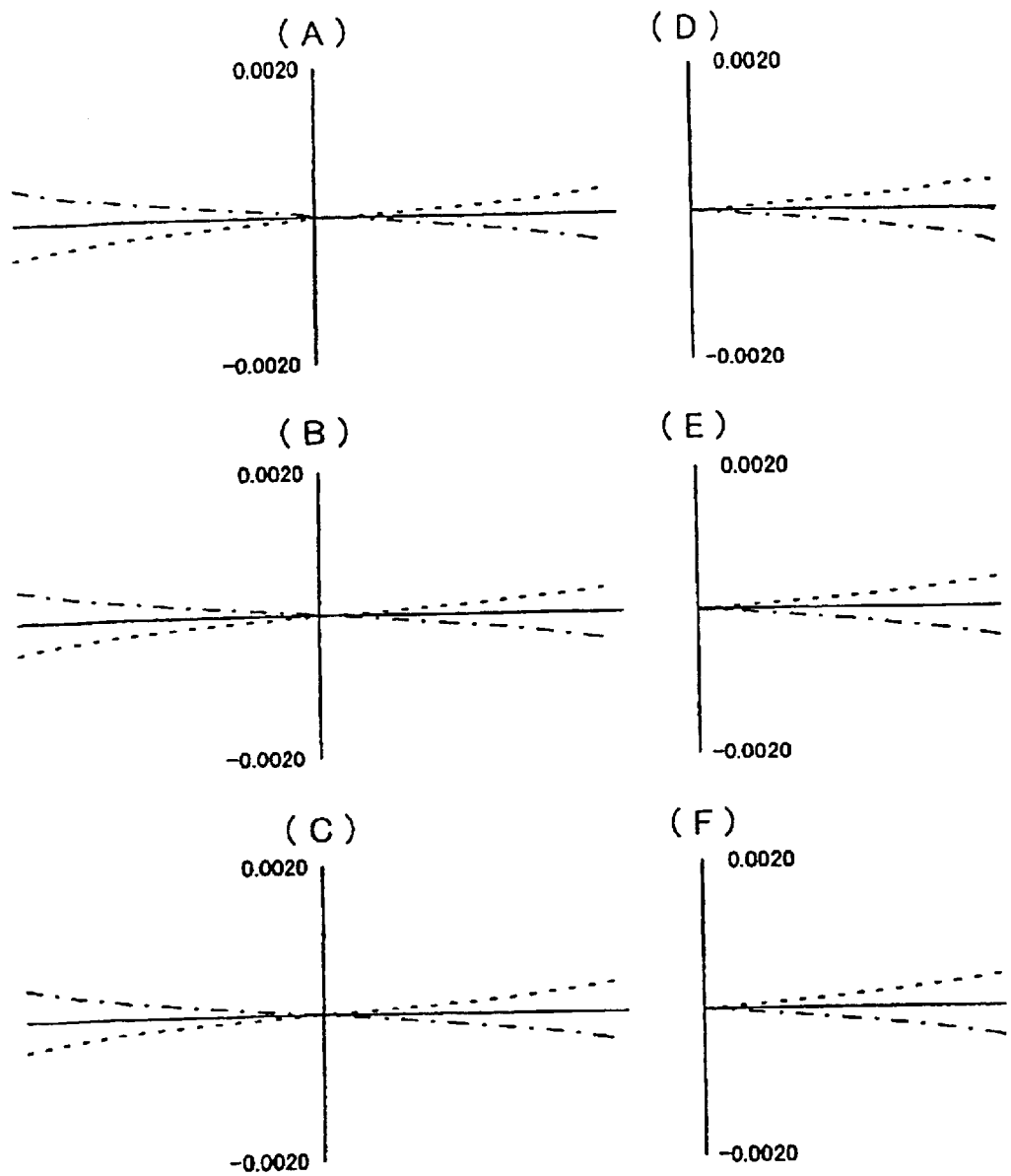
FIG. 4 is lateral aberration charts of the projection optical system of the second numerical example.

Next, FIG. 3 and FIG. 4 show the lateral aberration charts on the second surface B of the projection optical system PL according to the first and second embodiments, respectively.

FIG. 3(A) is a lateral aberration chart in the meridional direction at the image height Y=11.5, FIG. 3(B) a lateral aberration chart in the meridional direction at the image height Y=5.75, FIG. 3(C) a lateral aberration chart in the meridional direction at the image height Y=0 (on the optical axis), FIG. 3(D) a lateral aberration chart in the sagittal direction at the image height Y=11.5, FIG. 3(E) a lateral aberration chart in the sagittal direction at the image height Y=5.75, and FIG. 3(F) a lateral aberration chart in the sagittal direction at the image height Y=0 (on the optical axis). In each of the lateral aberration charts of FIG. 3(A) to FIG. 3(F), a solid line represents an aberration curve at the wavelength λ=157.62 nm (reference wavelength), a dashed line an aberration curve at the wavelength λ=157.62 nm+0.2 pm (reference wavelength+0.2 pm), and a chain line an aberration curve at the wavelength λ=157.62 nm−0.2 pm (reference wavelength−0.2 pm).

FIG. 4(A) is a lateral aberration chart in the meridional direction at the image height Y=13.3, FIG. 4(B) a lateral aberration chart in the meridional direction at the image height Y=6.65, FIG. 4(C) a lateral aberration chart in the meridional direction at the image height Y=0 (on the optical axis), FIG. 4(D) a lateral aberration chart in the sagittal direction at the image height Y=13.3, FIG. 4(E) a lateral aberration chart in the sagittal direction at the image height Y=6.65, and FIG. 4(F) a lateral aberration chart in the sagittal direction at the image height Y=0 (on the optical axis). In each of the lateral aberration charts of FIG. 4(A) to FIG. 4(F), a solid line represents an aberration curve at the wavelength λ=193.306 nm (reference wavelength), a dashed line an aberration curve at the wavelength λ=193.306 nm+0.4 pm (reference wavelength+0.4 pm), and a chain line an aberration curve at the wavelength λ=193.306 nm−0.4 pm (reference wavelength−0.4 pm).

As apparent from FIG. 3, in the projection optical system PL of the first embodiment, excellent correction for chromatic aberration is achieved across the wavelength region of ±0.2 pm, though the system is constructed using only the single kind of glass material, in the wavelength region of not more than 180 nm.

As also apparent from FIG. 4, in the projection optical system PL of the second embodiment, excellent correction for chromatic aberration is achieved across the wavelength region of ±0.4 pm, though the system is constructed using only the small number of lens elements for correction of chromatic aberration (approximately 10% of all the lens elements), in the vacuum ultraviolet wavelength region of not more than 200 nm.

The projection optical system PL of the first embodiment has the circular image field having the diameter of 23 mm and can ensure the rectangular exposure region having the width of 6.6 mm in the scanning direction and the width of 22 mm in the direction perpendicular to the scanning direction, in the image field. The projection optical system PL of the second embodiment has the circular image field having the diameter of 26.6 mm and can ensure the rectangular exposure region having the width of 8.8 mm in the scanning direction and the width of 25 mm in the direction perpendicular to the scanning direction, in the image field.

In the next place, examples of preferred forms of the eighth and ninth projection optical systems according to the present invention will be described below. FIG. 10 to FIG. 14 are the optical path diagrams of the projection optical systems according to the embodiments of the eighth and ninth projection optical systems of the present invention. It is, however, noted that the projection optical systems of FIG. 1 and FIG. 2 described above can be included in the embodiments of the eighth and ninth projection optical systems of the present invention in certain cases, as described hereinafter.

In FIG. 10 to FIG. 14, the projection optical systems of the examples (which will be also referred to hereinafter as "projection optical system PL") are dioptric projection optical systems for forming a reduced image of a pattern on the first surface A, onto the second surface B. When these projection optical systems are applied, for example, to the projection exposure apparatus for fabrication of semiconductor devices, a pattern surface of reticle R as a projection master (mask) is placed on the first surface A, and a photoresist coating surface (exposure surface) of wafer W being a substrate to be exposed as a workpiece, is placed on the second surface B. The projection optical systems have a front lens unit GF of a positive refracting power, a rear lens unit GR of a positive refracting power, and an aperture stop AS in the vicinity of a rear focal point of the front lens unit GF. The position of the aperture stop AS does not always have to be limited to the paraxial, rear focal point of the front lens unit GF. This is similar to the cases of the embodiments of FIG. 1 and FIG. 2. In this case, the rear lens unit GR represents an assembly of a group of lenses located from the paraxial pupil position of the projection optical system to the second surface B.

In the examples of FIG. 10 to FIG. 14, the aperture stop AS is located between the front lens unit GF and the rear lens unit GR.

The projection optical systems in the examples of FIG. 10 to FIG. 14 are optical systems that are substantially telecentric on the first surface A side and on the second surface B side, as in the case of the examples of FIG. 1 and FIG. 2. As a result, in the projection optical systems of the examples, even if there occurs the positional deviation in the direction of the optical axis of the reticle (mask) as a projection master or the photosensitive substrate (wafer, plate, or the like) as a workpiece, or the profile change due to warped or the like of these projection master and workpiece, it is also feasible to decrease the magnification error and distortion of images due to them.

In the projection optical system according to an embodiment of the eighth projection optical system (the fifth projection exposure apparatus or the third projection exposure method) of the present invention, the exposure light is one having the wavelength of not more than 200 nm and, letting y (kg) be a translated amount of fluorite of a disk member from an amount (use amount) of fluorite ($CaF_2$) among the radiation transmitting optical materials in the projection optical system, f2 (mm) be the focal length of the rear lens unit GR, and NAw be an image-side maximum numerical aperture of the projection optical system, a parameter x (mm) is defined as follows.

$$x = f2 \cdot 4|\beta| \cdot NAw^2 \tag{10}$$

In this case, as shown in FIG. 8(b), a disk member D of a lens L used in the projection optical system is a cylindrical member used in fabrication of the lens L. When $r_{eff}$ represents an effective radius (a radius of clear aperture) of the lens L (the larger of those on the entrance side and on the exit side) and dS a holding width for stably holding the lens L, a radius $r_d$ of the disk member D is given by ($r_{eff}$+dS) and the length of the disk member D by a length of a cylinder circumscribed about the lens L. Accordingly, the translated amount y of fluorite of the disk member from the use amount of fluorite consequently represents the total amount of fluorite used in fabrication of the projection optical system.

In the present example the holding width dS is 8 mm. Under these circumstances, the optical system of the example is configured to satisfy the following conditions.

$$y \leq 4x - 200 \tag{11}$$

$$y \leq (4x/13) + (1000/13) \tag{12}$$

$$y \geq 4x - 440 \tag{13}$$

$$y \geq 0 \tag{14}$$

FIG. 8(a) shows the relation between the parameter x and the fluorite amount y (the use amount reduced to the disk member) in the embodiment of the present invention, and in this FIG. 8(a), straight lines B1, B2, B3, and B4 indicate a line (y=4x−200), a line (y=(4x/13)+(1000/13)), a line (y=4x−440), and a line (y=0), respectively. The range of (x, y) satisfying the conditions of Eq (11) to Eq (14) consequently is the rectangular region B5 surrounded by the lines B1, B2, B3, B4 of FIG. 8(a).

The chromatic aberration of optical system is usually corrected by adequately combining optical materials of different dispersions (conventional correction technique). However, when the exposure light is light in the wavelength region of not more than 200 nm (vacuum ultraviolet radiation) as in the present example, optical materials (light-transmitting optical materials) for the lenses (including the parallel-plane plates for correction of aberration and the like) transmitting the exposure light are limited in kind. Specifically, practically applicable materials for the combination of plural optical materials of mutually different dispersions in the wavelength region of approximately 170 to 200 nm are silica glass (synthetic quartz) and fluorite. Since fluorite is produced in the small volume of production and is expensive, it is desirable to decrease the use amount y of fluorite to as low as possible in order to decrease the production cost of the projection optical system and eventually decrease the production cost of the projection exposure apparatus provided therewith.

Then the inventor considered applying the technique of correcting the chromatic aberration for the light with predetermined wavelength band by proportional reduction of the optical system (correction technique by proportional reduction), to the optical system of the instant example, and found that, in order to correct the chromatic aberration well while reducing the amount of fluorite y for the light of the wavelength of not more than 200 nm as much as possible, the region B5 of FIG. 8(a) was the optimum combination of the foregoing conventional correction technique (capable of control by the amount of fluorite y) with the correction technique by proportional reduction (capable of control by the parameter x).

When Condition (11) is not satisfied, i.e., in the region B1e above the line B1, the focal length f2 of the rear lens unit GR is too short against the amount y of fluorite. In this case, the power of the entire projection optical system is too strong and it is difficult to correct even the monochromatic aberrations. Thus this region is not preferable. In other words, fluorite is used more than necessary against the focal length f2 of the rear lens unit GR. Namely, the chromatic aberration correction by the technique of proportional reduction is not effected so much, and the use amount of fluorite is undesirably increased fruitlessly.

When Condition (12) is not met, i.e., in the region B2e above the line B27, the absolute use amount of fluorite is undesirably increased.

When Condition (13) is not met, i.e., in the region B3e outside the line B3, it becomes easier to correct the monochromatic aberrations of the projection optical system, but the correction of chromatic aberration becomes largely insufficient, so as to degrade the imaging performance, undesirably. Since the amount y of fluorite is 0 or a positive value, Condition (14) is always satisfied.

In the present embodiment, the image-side maximum numerical aperture NAw of the projection optical system and the fluorite amount y (the reduced use amount to the disk member) are preferably set to further satisfy the following two conditions.

$$NAw > 0.72 \tag{d-1}$$

$$y < 75 \tag{d-2}$$

When Condition (d-1) is not satisfied, it is not feasible to yield a satisfactory resolution. Further, since the volume production of fluorite is difficult at present, when Condition (d-2) is not met, there is the possibility that it becomes difficult to increase the supply of projection optical systems PL (and the projection exposure apparatus equipped therewith) according to demands.

In the present embodiment, the focal length f2 (mm) of the rear lens unit GR and the image-side maximum numerical aperture NAw of the projection optical system are desirably set to satisfy the following condition.

$$110 < f2/NAw < 200 \tag{e}$$

When the value of f2/NAw is not more than the lower limit of Condition (e), it becomes difficult to correct off-axial aberrations such as coma, astigmatism, and distortion. When the value of f2/NAw is not less than the upper limit of Condition (e), it becomes difficult to correct the chromatic aberration.

In order to further decrease the fluorite amount y and well correct the chromatic aberration by proportional reduction, it is desirable to satisfy the following conditions (15) to (18), which are narrower conditions than Conditions (11) to (14).

$$y \leq (9x/2) - 270 \quad (15)$$

$$y \leq 90 \quad (16)$$

$$y \geq (9x/2) - (855/2) \quad (17)$$

$$y \geq 0 \quad (18)$$

In FIG. 8(a), straight lines C1, C2, C3, and C4 indicate a line (y=(9x/2)−270), a line (y=90), a line (y=(9x/2)−(855/2)), and a line (y=0), respectively. Accordingly, the range of (x, y) satisfying Conditions (15) to (18) is the rectangular region C5 surrounded by the lines C1, C2, C3, C4 and this region C5 is in the range of the region B5.

The exposure light is desirably one having the wavelength of not more than 200 nm and the wavelength band having the full width at half maximum of not more than 0.5 pm. As the wavelength band becomes narrower, it becomes easier to correct the chromatic aberration, but the structure of the exposure light source becomes more complex according thereto, so as to increase the production cost and inevitably decrease the exposure dosage, thus lowering the throughput. When the exposure light source is, for example, an ArF excimer laser source (the wavelength 193 nm), the wavelength bands of not more than 0.5 pm to approximately 0.3 pm are bands that can be realized at reasonable cost by the band narrowing technique and the chromatic aberration can also be readily corrected by the correction technique of the present example.

In the present example, the correction technique by proportional reduction is applied and, in order to ensure the wide field while controlling the various aberrations on the image plane side to within permissible ranges on this occasion, it is desirable to employ aspheric surfaces for predetermined lens surfaces of lenses of a plurality of lenses making the projection optical system. However, since the production cost of aspheric lenses is high, it is desirable to minimize the number of aspheric surfaces within the range permitting the desired imaging performance.

In the present example, Conditions (11) to (14) are satisfied, and when the following condition about the fluorite amount y is further imposed, the number A of aspheric surfaces in the projection optical system is desirably not less than 2.

$$0 \leq y < 40 \quad (19)$$

$$2 \leq A \quad (20)$$

Describing this further, since the fluorite amount y is relatively small within the range of Condition (19), the focal length f2 of the rear lens unit GR is set to a relatively short value from Conditions (11) to (14). Namely, the chromatic aberration correction by proportional reduction tends to become dominant. In this case, if the number of aspheric surfaces is smaller than 2, the range of the image field well corrected for aberration becomes too narrow and it will lead to decrease of throughput when applied to the projection exposure apparatus. It is thus desirable to use two or more aspheric surfaces in order to implement good aberration correction in the desired range of image field. In order to effect good aberration correction in a wider image field, the number of aspheric surfaces is more preferably not less than three.

When the following condition different from Condition (19) is imposed as to the fluorite amount y, the number A of aspheric surfaces in the projection optical system is desirably 1 to 5.

$$40 \leq y < 70 \quad (21)$$

$$1 \leq A \leq 5 \quad (22)$$

In the range of this condition (21), because of increase in the fluorite amount y, the focal length f2 of the rear lens unit GR can be set longer from Conditions (11) to (14) than in the case of the range of Condition (19). Namely, since the chromatic aberration correction by proportional reduction is made in addition to the correction technique of combining plural materials, use of aspheric surfaces in the number of not less than 1 nor more than 5 permits the aberration to be corrected well within the desired range of image field. When no aspheric surface is used off Condition (22), it becomes difficult to maintain the proportionally reduced image field in the state before the proportional reduction, which is undesirable. When there are aspheric surfaces over five surfaces, the production cost is undesirably increased more than necessary.

For providing the projection optical system with an aspheric surface, this aspheric surface is desirably provided in a lens surface of a lens made of a material (e.g., silica glass) different from fluorite. If the aspheric surface is provided in a lens of fluorite to the contrary, it will be difficult to process fluorite into an aspheric surface because of great abrasion of fluorite and it can cause considerable increase of production cost and production time and further degrade the accuracy of aspheric surface.

The image field of the projection optical system in the present example is desirably not less than 20 mm in diameter (more desirably, not less than 25 mm in diameter), and the image-side maximum numerical aperture NAw of the projection optical system is desirably set to satisfy the following condition.

$$NAw \geq 0.65 \quad (23)$$

Using the exposure wavelength λ, the maximum numerical aperture NAw, and the process coefficient k1, the resolution Res of the image to be transferred by the projection optical system is given as follows.

$$Res = k1 \cdot \lambda / NAw \quad (24)$$

Accordingly, supposing the exposure wavelength λ is 200 nm, the maximum numerical aperture NAw 0.65, and, for example, on the assumption of application of the modified illumination method, the process coefficient k1 0.5, the resolution Res is about 154 nm. Therefore, when Condition (23) is satisfied at the exposure wavelength of not more than 200 nm, it is feasible to yield the resolution enough for fabrication of next-generation semiconductor devices and the like.

When the diameter of the image field is not less than 20 mm, exposure can be implemented at high throughput in the state of high resolution.

In the projection optical system according to an embodiment of the ninth projection optical system (the sixth projection exposure apparatus or the fourth projection exposure method) of the present invention, the exposure light is one having the wavelength of not more than 200 nm and y (kg) represents a translated amount of a first material of a disk member from an amount (use amount) of the first material among the radiation transmitting optical materials in the projection optical system. Then Conditions (11) to (14) are satisfied where the focal length of the rear lens unit GR is f2 (mm), the image-side maximum numerical aperture of the projection optical system is NAw, and the parameter x (mm) is defined as in Eq (10).

Figure 8:
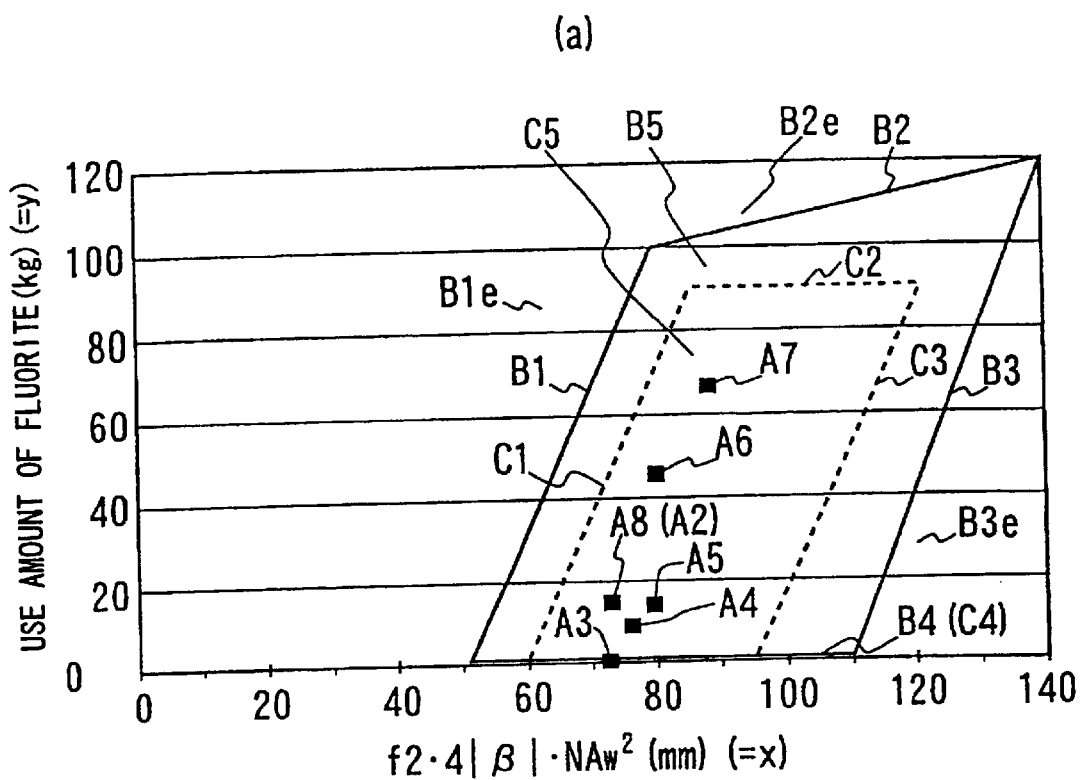
In FIG. 8, (a) is a diagram to show the relation between parameter x and fluorite use amount y in embodiments of the fifth projection optical system of the present invention, and (b) is a view to show the relation between a lens and a disk member.
Figure 8:
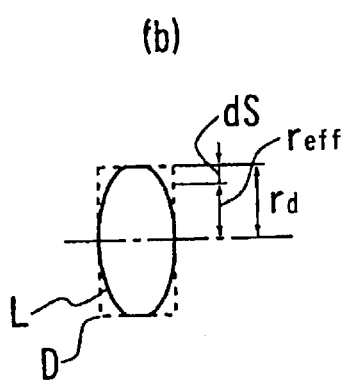
Figure 9:
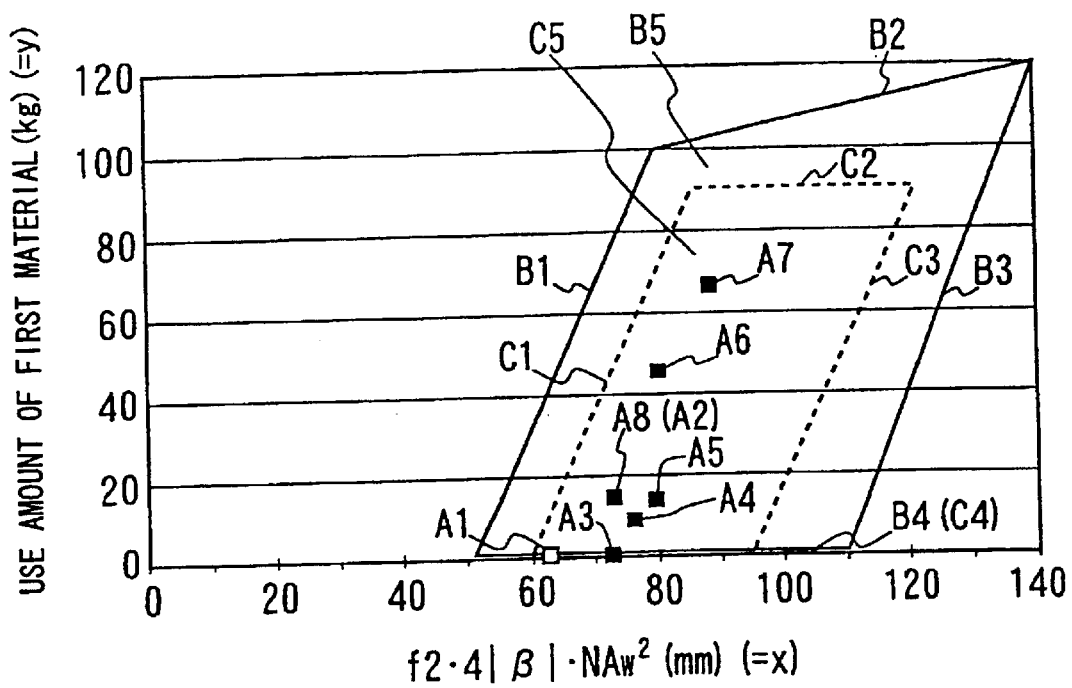
FIG. 9 is a chart to show the relation between parameter x and use amount y of a first material in embodiments of the sixth projection optical system of the present invention.

FIG. 9 shows the relation between the parameter x (mm) and the amount y (the use amount reduced to the disk member) (kg) of the first material in this embodiment, wherein the straight lines B1 to B4 and the straight lines C1 to C4 in this FIG. 9 are the same as those in FIG. 8(a) and the region satisfying Conditions (11) to (14) is the region B5 surrounded by the lines B1 to B4.

In this embodiment of FIG. 9, a second material different from the first material is first used as a principal material (light-transmitting optical material) for the lenses making the projection optical system, and then the first material is added according to the necessity for correction of chromatic aberration. The present embodiment further uses a correction technique of effecting achromatism by proportionally reducing the optical system. Namely, the present example can be said to be "an example of finding the range of optimum combination of the correction technique by proportional reduction with the correction technique of achromatism by adding the chromatic-aberration-correcting material (first material) to the principal material (second material)."

In the present example, not only silica, but also fluorite and the like can be used as the principal material (second material). When the principal material is, for example, silica, the first material can be selected from fluorite (which corresponds to the embodiment of FIG. 8(a)), barium fluoride ($BaF_2$), lithium fluoride (LiF), and so on. On the other hand, for example, at the exposure wavelengths of not more than 170 nm (e.g., the $F_2$ laser of the wavelength of 157 nm), it is also conceivable to use fluorite as the principal material in order to increase the transmittance, and in this case the first material is selected from materials (silica, BaF, LiF, etc.) different from fluorite.

In FIG. 9, when Condition (11) is not satisfied, it can be mentioned that the first material is used more than necessary against the focal length f2 of the rear lens unit GR. When Condition (12) is not satisfied, the absolute use amount of the second material becomes large and the transmittance becomes too low, for example, at the exposure wavelengths of not more than 170 nm, undesirably.

When Condition (13) is not satisfied, it becomes easier to correct the monochromatic aberrations of the projection optical system, but the correction of chromatic aberration becomes largely insufficient, so as to degrade the imaging performance, undesirably.

In the present example, it is desirable to satisfy Conditions (d-1), (d-2), in order to obtain the satisfactory resolution and control the use amount of fluorite to within the practical range. It is also desirable to satisfy Condition (e), in order to readily correct the off-axial aberrations such as coma, astigmatism, and distortion and readily correct the chromatic aberration.

In the present example, in order to further decrease the amount y of the first material and correct the chromatic aberration well by proportional reduction, it is also desirable to satisfy the above conditions (15) to (18), which are narrower conditions than Conditions (11) to (14). This is the case wherein (x, y) is in the region C5 surrounded by the lines C1 to C4 of FIG. 9.

In FIG. 9, data A1 corresponds to the foregoing first embodiment. In the first embodiment, the exposure wavelength is 157 nm of the $F_2$ laser (note more than 170 nm), all the lenses are made of the same material (second material) of silica, and the amount y of the first material is 0. In the first embodiment, the focal length f2 of the rear lens unit GR is 110.6 mm, the projection magnification β–0.25, and the image-side maximum numerical aperture Naw 0.75. Therefore, the parameter x=110.6 . 4 . |–0.25|. $0.75^2$=62.2 (mm), so that the data A1 is in the more desirable region C5.

A plurality of numerical embodiments of the present example will be described below. The projection optical systems of the third embodiment to the eighth embodiment below all use the wavelength of 193.3 nm supplied from the band-narrowed ArF laser as the reference wavelength and the chromatic aberration is corrected in the range of FWHM (full width at half maximum) of 0.35 pm centered about the reference wavelength, i.e., in the range of 193.3 nm±0.175 pm.

Figure 10:
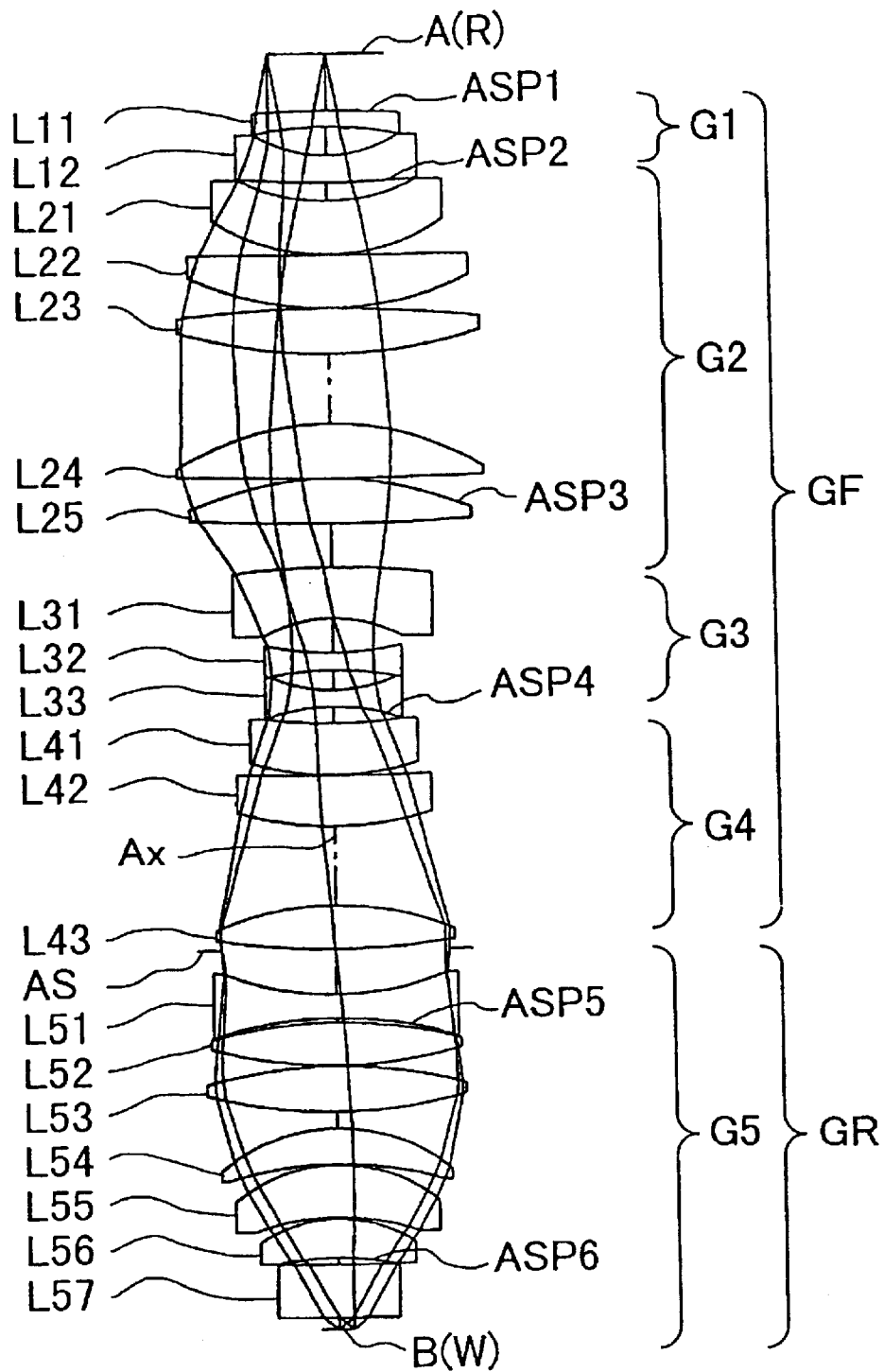
FIG. 10 is an optical path diagram of a projection optical system according to a third numerical example of the present invention.

FIG. 10 is the optical path diagram of the projection optical system according to the third embodiment. In this third embodiment, all the radiation-transmitting refractors (lenses L11 to L57) in the projection optical system are made of silica (synthetic quartz: $SiO_2$). Namely, the material for achromatism (the first material) is not used.

As shown in FIG. 10, the projection optical system of the third embodiment has the front lens unit GF of the positive refracting power, the aperture stop AS, and the rear lens unit GR of the positive refracting power in the order named from the first surface A side. According to another grouping, the projection optical system of the third embodiment has the negative, first lens unit G1, the positive, second lens unit G2, the negative, third lens unit G3, the positive, fourth lens unit G4, the aperture stop AS, and the positive, fifth lens unit G5 in the order named from the first surface A side, in which the first lens unit G1 to the fourth lens unit G4 constitute the front lens unit GF and the fifth lens unit G5 the rear lens unit GR.

The first lens unit G1 has a negative lens L11 of the meniscus shape with a convex surface facing to the first surface A side, and a negative lens L12 of the meniscus shape with a concave surface facing to the first surface A side in the order named from the first surface A side, and these negative lenses L11, L12 form a gas lens of the biconvex shape. The lens surface on the first surface A side of the negative lens L11 and the lens surface on the second surface B side of the negative lens L12 are formed as aspheric surfaces ASP1 and ASP2, respectively.

The second lens unit G2 has a negative lens L21 of the meniscus shape with a concave surface facing to the first surface A side, a positive lens L22 of the meniscus shape with a concave surface facing to the first surface A side, and three positive lenses L23 to L25 of the biconvex shape. The lens surface on the first surface A side of the positive lens L25 closest to the second surface B is formed as an aspheric surface ASP3.

The third lens unit G3 has a negative lens L31 of the meniscus shape with a convex surface facing to the first surface A side, and two negative lenses L32, L33 of the biconcave shape in the order named from the first surface A side, and these negative lenses L31 to L33 form two gas lenses of the biconvex shape. The lens surface on the second surface B side of the negative lens L33 closest to the second surface B is formed as an aspheric surface ASP4.

The fourth lens unit G4 has two positive lenses L41, L42 of the meniscus shape with a concave surface facing to the first surface A side and a positive lens L43 of the biconvex shape in the order named from the first surface A side.

The fifth lens unit G5 also being the rear lens unit GR, has a negative lens L51 of the biconcave shape, two positive lenses L52, L53 of the biconvex shape, three positive lenses L54 to L56 of the meniscus shape with a convex surface facing to the first surface A side, and a negative lens L57 of the planoconcave shape with a concave surface facing to the first surface A side, in the order named from the first surface A side. Here the lens surface on the first surface A side of the positive lens L52 and the lens surface on the second surface B side of the positive lens L56 are formed as aspheric surfaces ASP5 and ASP6, respectively.

Figure 11:
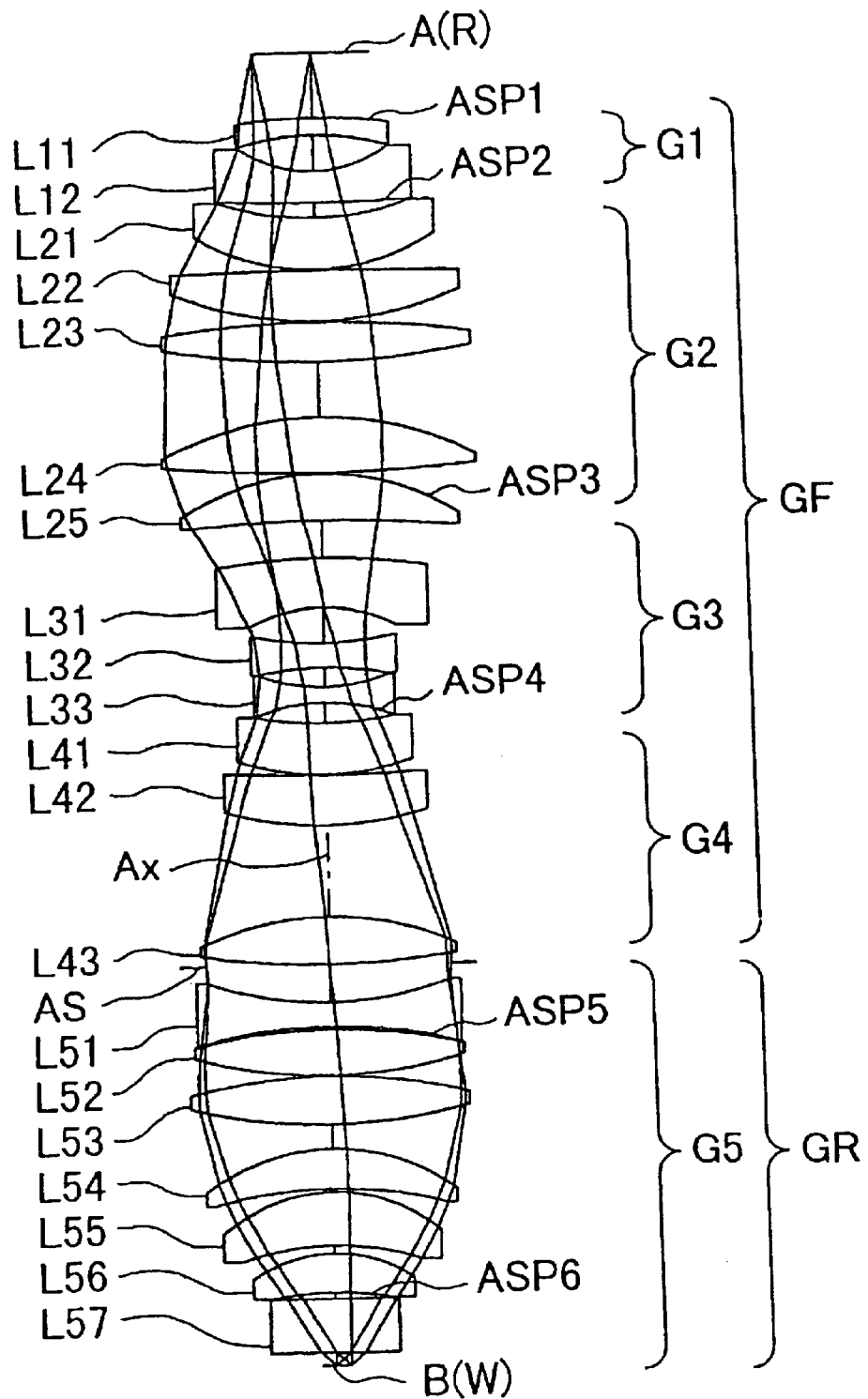
FIG. 11 is an optical path diagram of a projection optical system according to a fourth numerical example of the present invention.

FIG. 11 is the optical path diagram of the projection optical system according to the fourth embodiment. In this fourth embodiment, silica glass (synthetic quartz) is used as the principal material (second material) of the radiation-transmitting refractors in the projection optical system and fluorite as the achromatizing material (first material).

As shown in FIG. 11, the projection optical system of the fourth embodiment has the front lens unit GF of the positive refracting power, the aperture stop AS, and the rear lens unit GR of the positive refracting power in the order named from the first surface A side. According to another grouping, the projection optical system PL of the fourth embodiment has the negative, first lens unit G1, the positive, second lens unit G2, the negative, third lens unit G3, the positive, fourth lens unit G4, the aperture stop AS, and the positive, fifth lens unit G5 in the order named from the first surface A side, in which the first lens unit G1 to the fourth lens unit G4 correspond to the front lens unit GF and in which the fifth lens unit G5 corresponds to the rear lens unit GR.

The first lens unit G1 has a negative lens L11 of the meniscus shape with a convex surface facing to the first surface A side, and a negative lens L12 of the meniscus shape with a concave surface facing to the first surface A side, in the order named from the first surface A side, and these negative lenses L11, L12 form a gas lens of the biconvex shape. The lens surface on the first surface A side of the negative lens L11 and the lens surface on the second surface B side of the negative lens L12 are formed as aspheric surfaces ASP1 and ASP2, respectively. These two negative lenses L11, L12 are made both of silica glass.

The second lens G2 has a positive lens L21 of the meniscus shape with a concave surface facing to the first surface A side, three positive lenses L22 to L24 of the biconvex shape, and a positive lens L25 of the meniscus shape with a convex surface facing to the first surface A side, in the order named from the first surface A side. The lens surface on the first surface A side of the positive lens L25 closest to the second surface B is formed as an aspheric surface ASP3. All the lenses in the second lens unit G2 are made of silica glass.

The third lens unit G3 has a negative lens L31 of the meniscus shape with a convex surface facing to the first surface A side, and two negative lenses L32, L33 of the biconcave shape in the order named from the first surface A side, and these negative lenses L31 to L33 form two gas lenses of the biconvex shape. Here the lens surface on the second surface B side of the negative lens L33 closest to the second surface B is formed as an aspheric surface ASP4. All the negative lenses L31 to L33 in the third lens unit G3 are made of silica glass.

The fourth lens unit G4 has a positive lens L41 of the meniscus shape with a concave surface facing to the first surface A side, a positive lens L42 of the meniscus shape with a concave surface facing to the first surface A side, and a positive lens L43 of the biconvex shape in the order named from the first surface A side. Here the two positive lenses L41, L42 are made of silica glass and the positive lens L43 on the second surface B side is made of fluorite.

The fifth lens unit G5 has a negative lens L51 of the biconcave shape, two positive lenses L52, L53 of the biconvex shape, three positive lenses L54 to L56 of the meniscus shape with a convex surface facing to the first surface A side, and a negative lens L57 of the biconcave shape in the order named from the first surface A side. Here the lens surface on the second surface B side of the negative lens L51 and the lens surface on the second surface B side of the positive lens L56 are formed as aspheric surfaces ASP5 and ASP6, respectively. In the fifth lens unit G5, only the negative lens L57 closest to the second surface B is made of fluorite and the other lenses L51 to L56 are made of silica glass.

In the fourth embodiment, as described above, silica glass (synthetic quartz) and fluorite are used as the lens materials (glass materials) and all the lens surfaces of the aspheric shape are formed in the lenses of silica glass.

Figure 12:
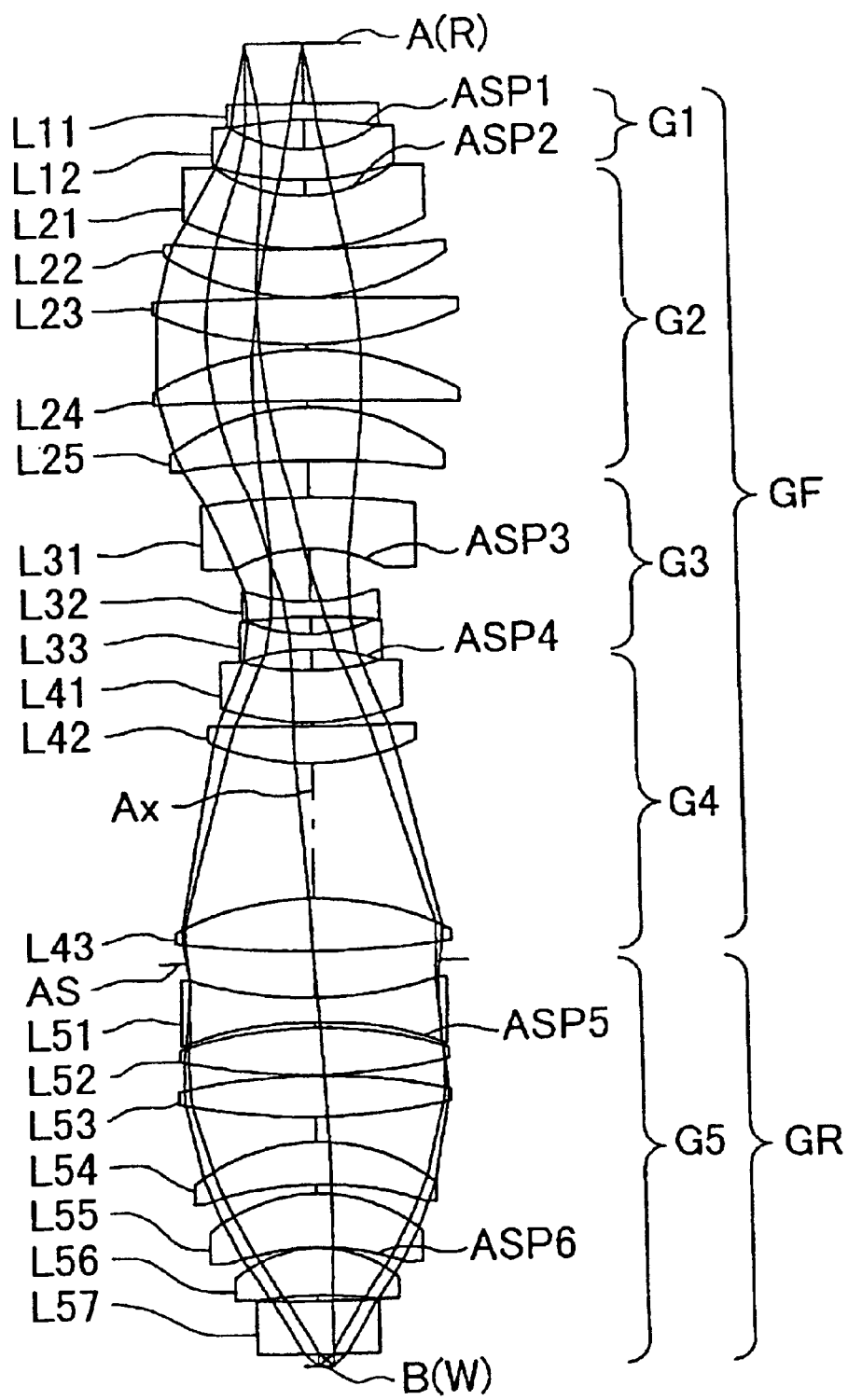
FIG. 12 is an optical path diagram of a projection optical system according to a fifth numerical example of the present invention.

FIG. 12 is the optical path diagram of the projection optical system according to the fifth embodiment. In this fifth embodiment, silica glass (synthetic quartz) is used as the principal material (second material) of the radiation-transmitting refractors in the projection optical system and fluorite as the achromatizing material (first material).

As shown in FIG. 12, the projection optical system of the fifth embodiment has the front lens unit GF of the positive refracting power, the aperture stop AS, and the rear lens unit GR of the positive refracting power in the order named from the first surface A side. According to another grouping, the projection optical system of the fifth embodiment has the negative, first lens unit G1, the positive, second lens unit G2, the negative, third lens unit G3, the positive, fourth lens unit G4, the aperture stop AS, and the positive, fifth lens unit G5 in the order named from the first surface A side, in which the first lens unit G1 to the fourth lens unit G4 correspond to the front lens unit GF and in which the fifth lens unit G5 corresponds to the rear lens unit GR.

The first lens unit G1 has a negative lens L11 of the planoconcave shape with a plane facing to the first surface A side, and a negative lens L12 of the meniscus shape with a concave surface facing to the first surface A side, in the order named from the first surface A side, and these negative lenses L11, L12 form a gas lens of the biconvex shape. The lens surface on the second surface B side of the negative lens L11 is formed as an aspheric surface ASP1. These two negative lenses L11, L12 are made both of silica glass.

The second lens G2 has a negative lens L21 of the meniscus shape with a concave surface facing to the first surface A side, a positive lens L22 of the meniscus shape with a concave surface facing to the first surface A side, a positive lens L23 of the biconvex shape, and two positive lenses L24, L25 of the meniscus shape with a convex surface facing to the first surface A side, in the order named from the first surface A side. The lens surface on the first surface A side of the negative lens L21 closest to the first surface A is formed as an aspheric surface ASP2. All the lenses in the second lens unit G2 are made of silica glass.

The third lens unit G3 has a negative lens L31 of the meniscus shape with a convex surface facing to the first surface A side, and two negative lenses L32, L33 of the biconcave shape in the order named from the first surface A side, and these negative lenses L31 to L33 form two gas lenses of the biconvex shape. Here the lens surface on the second surface B side of the negative lens L31 closest to the first surface A and the lens surface on the second surface B side of the negative lens L33 closest to the second surface B are formed as aspheric surfaces ASP3 and ASP4, respectively. All the negative lenses L31 to L33 in the third lens unit G3 are made of silica glass.

The fourth lens unit G4 has a positive lens L41 of the meniscus shape with a concave surface facing to the first surface A side, a positive lens L42 of the meniscus shape with a concave surface facing to the first surface A side, and a positive lens L43 of the biconvex shape in the order named from the first surface A side. Here the two positive lenses L41, L42 on the first surface A side are made of fluorite and the positive lens L43 on the second surface B side is made of silica glass.

The fifth lens unit G5 has a negative lens L51 of the biconcave shape, two positive lenses L52, L53 of the biconvex shape, three positive lenses L54 to L56 of the meniscus shape with a convex surface facing to the first surface A side, and a negative lens L57 of the planoconcave shape with a concave surface facing to the first surface A side, in the order named from the first surface A side. Here the lens surface on the second surface B side of the negative lens L51 and the lens surface on the second surface B side of the positive lens L55 are formed as aspheric surfaces ASP5 and ASP6, respectively. In the fifth lens unit G5, only the two lenses L56, L57 closest to the second surface B are made of fluorite and the other lenses L51 to L55 are made of silica glass.

In the fifth embodiment, as described above, silica glass (synthetic quartz) and fluorite are also used as the lens materials (glass materials) and all the lens surfaces of the aspheric shape are formed in the lenses of silica glass.

Figure 13:
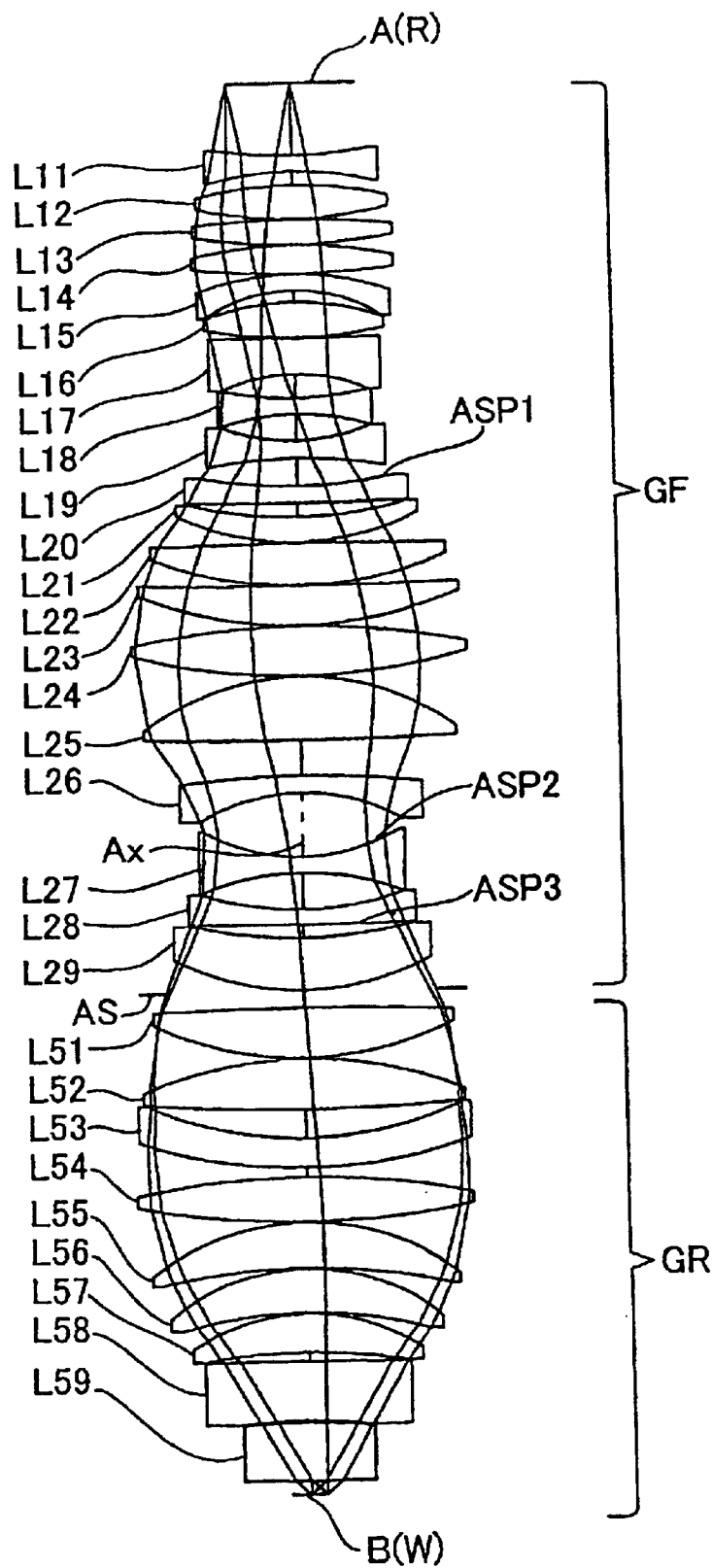
FIG. 13 is an optical path diagram of a projection optical system according to a sixth numerical example of the present invention.

FIG. 13 is the optical path diagram of the projection optical system according to the sixth embodiment. In this sixth embodiment, silica glass (synthetic quartz) is used as the principal material (second material) of the radiation-transmitting refractors in the projection optical system and fluorite as the achromatizing material (first material).

As shown in FIG. 13, the projection optical system of the sixth embodiment is a double waist type imaging optical system having the front lens unit GF of the positive refracting power, the aperture stop AS, and the rear lens unit GR of the positive refracting power in the order named from the first surface A side.

The front lens unit GF has a negative lens L11 of the biconcave shape, three positive lenses L12 to L14 of the biconvex shape, a negative lens L15 of the meniscus shape with a convex surface facing to the first surface A side, a positive lens L16 of the biconvex shape, a negative lens L17 of the biconcave shape, two negative lenses L18, L19 of the biconcave shape, a negative lens L20 of the meniscus shape with a concave surface facing to the first surface A side, a positive lens L21 of the meniscus shape with a concave surface facing to the first surface A side, a positive lens L22 of the biconvex shape, a positive lens L23 of the meniscus shape with a concave surface facing to the first surface A side, two positive lenses L24, L25 of the biconvex shape, a negative lens L26 of the meniscus shape with a convex surface facing to the first surface A side, a negative lens L27 of the biconcave shape, a negative lens L28 of the meniscus shape with a concave surface facing to the first surface A side, and a positive lens L29 of the meniscus shape with a concave surface facing to the first surface A side, in the order named from the first surface A side. Then the lens surface on the first surface A side of the negative lens L20, the lens surface on the first surface A side of the negative lens L27, and the lens surface on the second surface B side of the negative lens L28 are formed as aspheric surfaces ASP1, ASP2, and ASP3, respectively. Only the positive lens L29 closest to the second surface B is made of fluorite and the other lenses L11 to L28 are made all of silica glass.

The rear lens unit GR has two positive lenses L51, L52 of the biconvex shape, a negative lens L53 of the meniscus shape with a concave surface facing to the first surface A side, a positive lens L54 of the biconvex shape, three positive lenses L55 to L57 of the meniscus shape with a convex surface facing to the first surface A side, a negative lens L58 of the meniscus shape with a convex surface facing to the first surface A side, and a positive lens L59 of the biconvex shape in the order named from the first surface A side. Here the four lenses L53, L54, L58, L59 are made as silica lenses and the other five lenses L51, L52, L55, L56, L57 are made of fluorite.

In the sixth embodiment, as described above, silica glass (synthetic quartz) and fluorite are also used as the lens materials (glass materials) and all the lens surfaces of the aspheric shape are formed in the lenses of silica glass.

Figure 14:
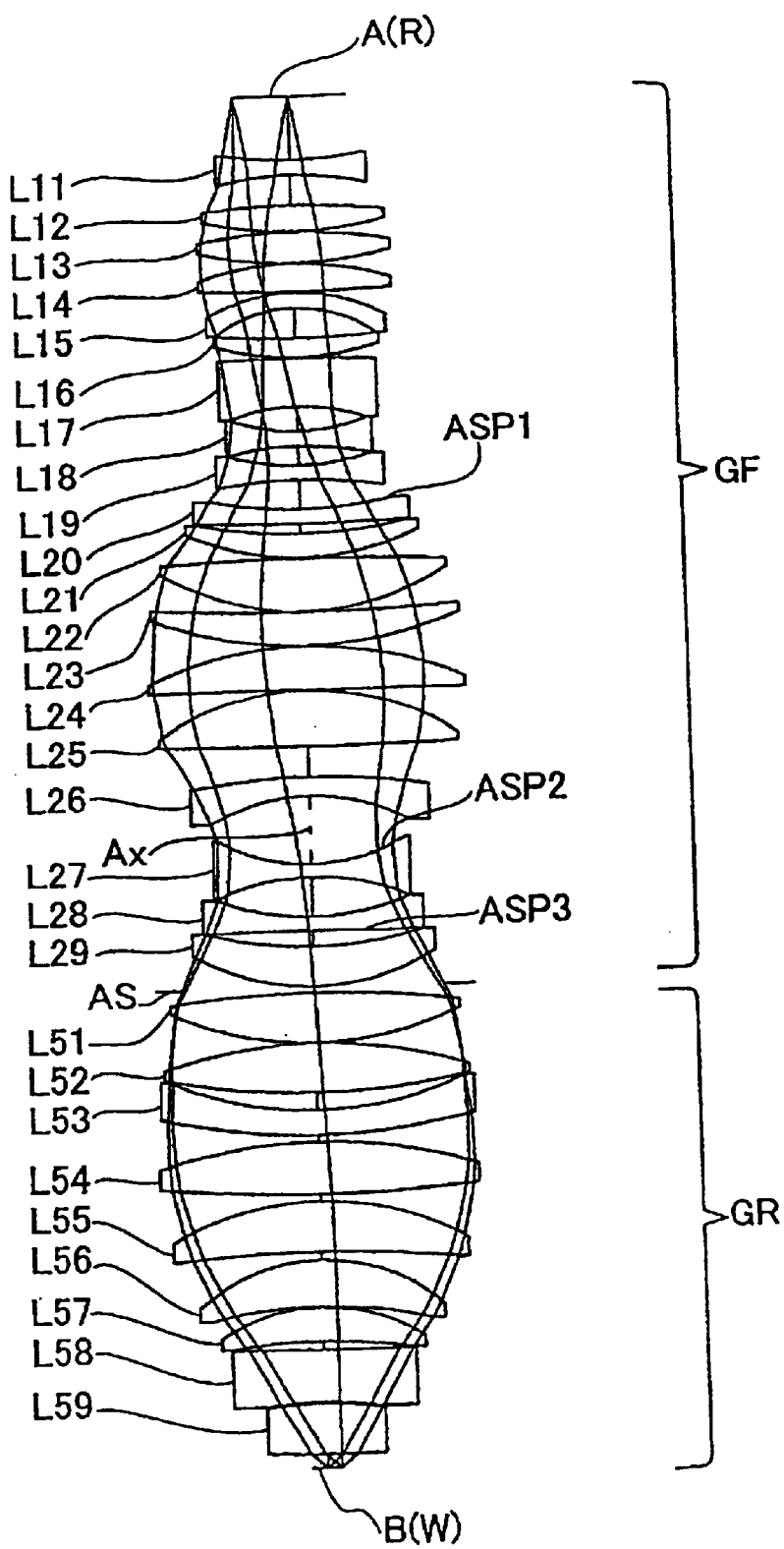
FIG. 14 is an optical path diagram of a projection optical system according to a seventh numerical example of the present invention.
Figure 15:
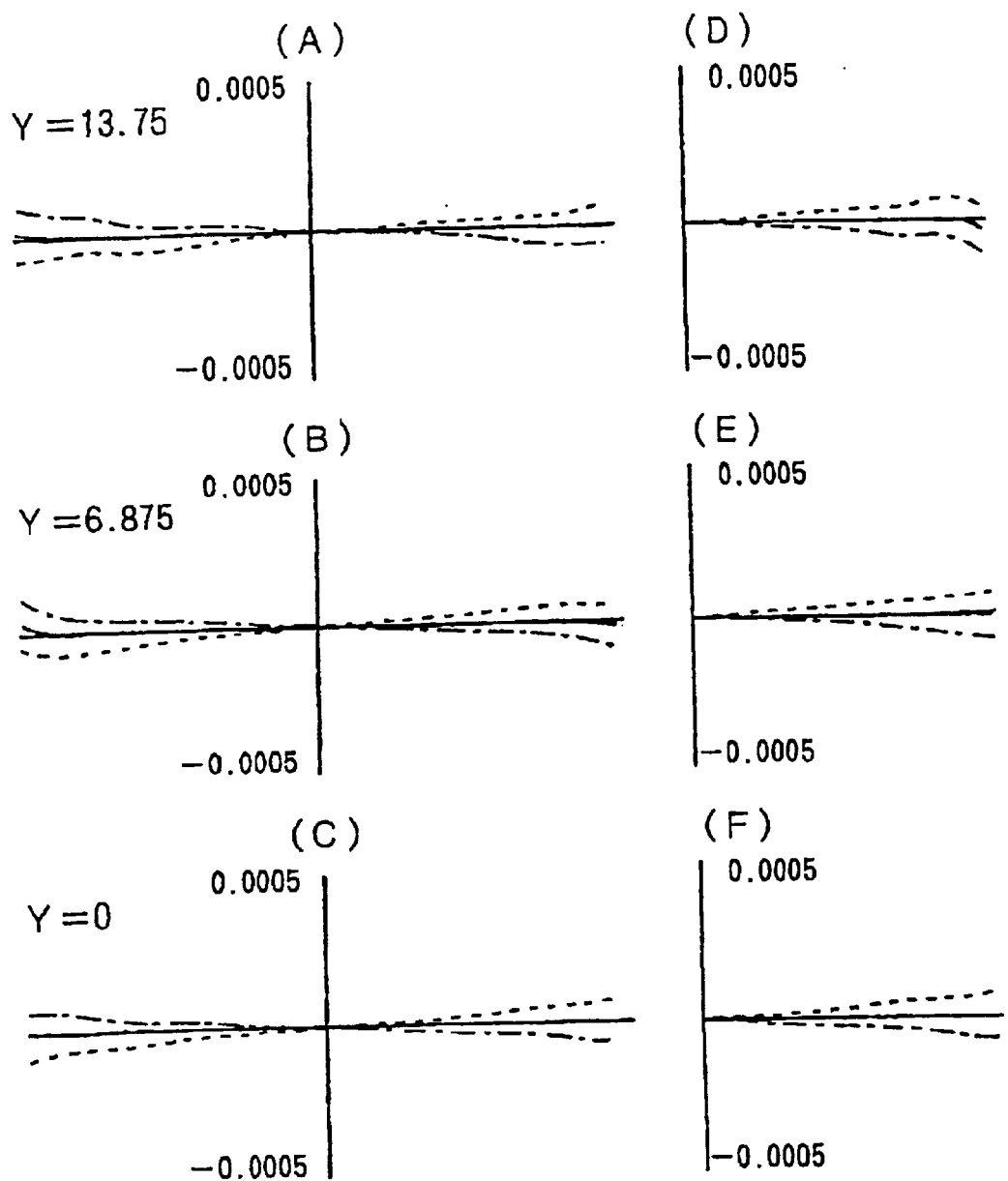
FIG. 15 is lateral aberration charts of the projection optical system according to the third numerical example of the present invention.
Figure 16:
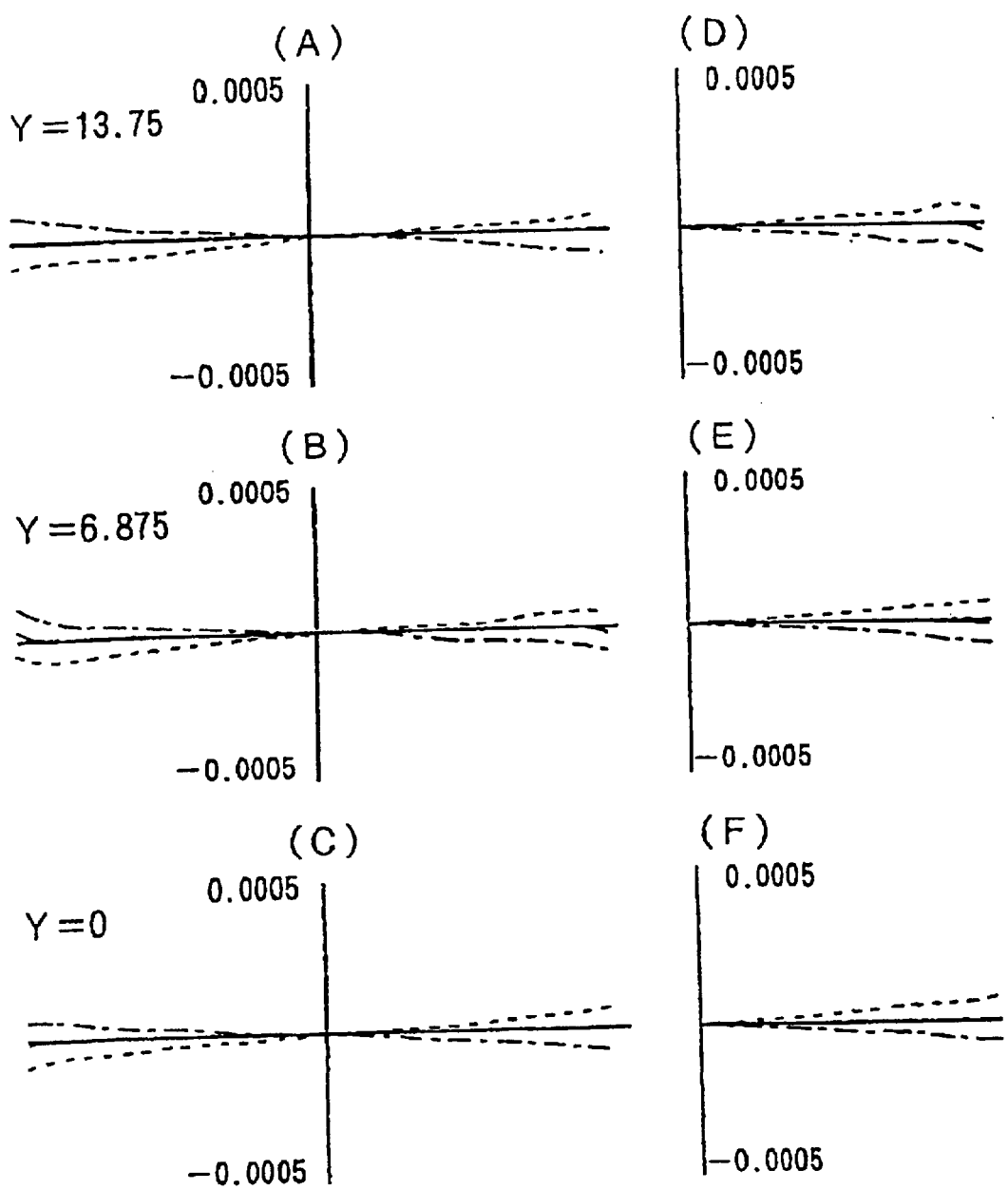
FIG. 16 is lateral aberration charts of the projection optical system according to the fourth numerical example of the present invention.
Figure 17:
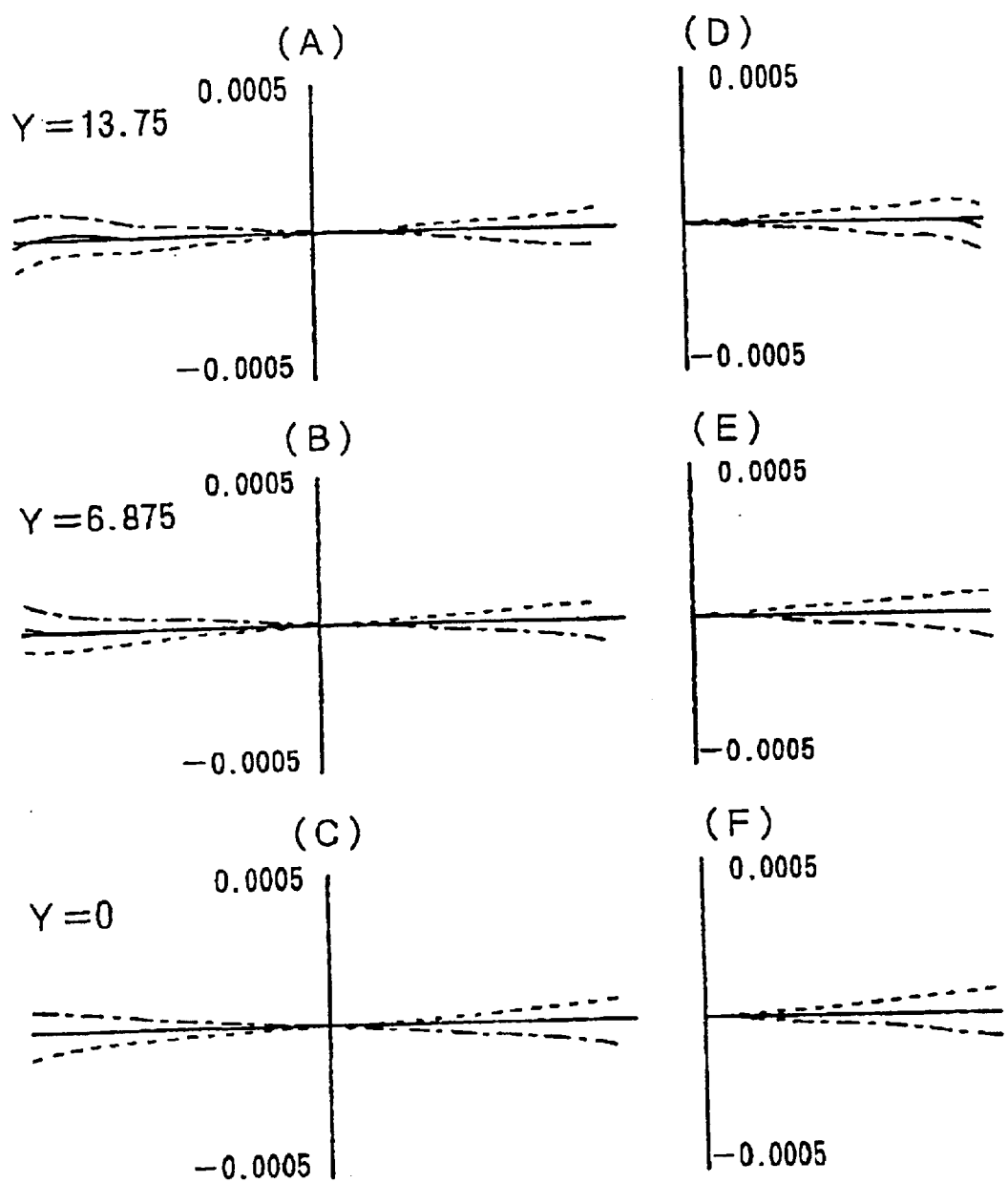
FIG. 17 is lateral aberration charts of the projection optical system according to the fifth numerical example of the present invention.
Figure 18:
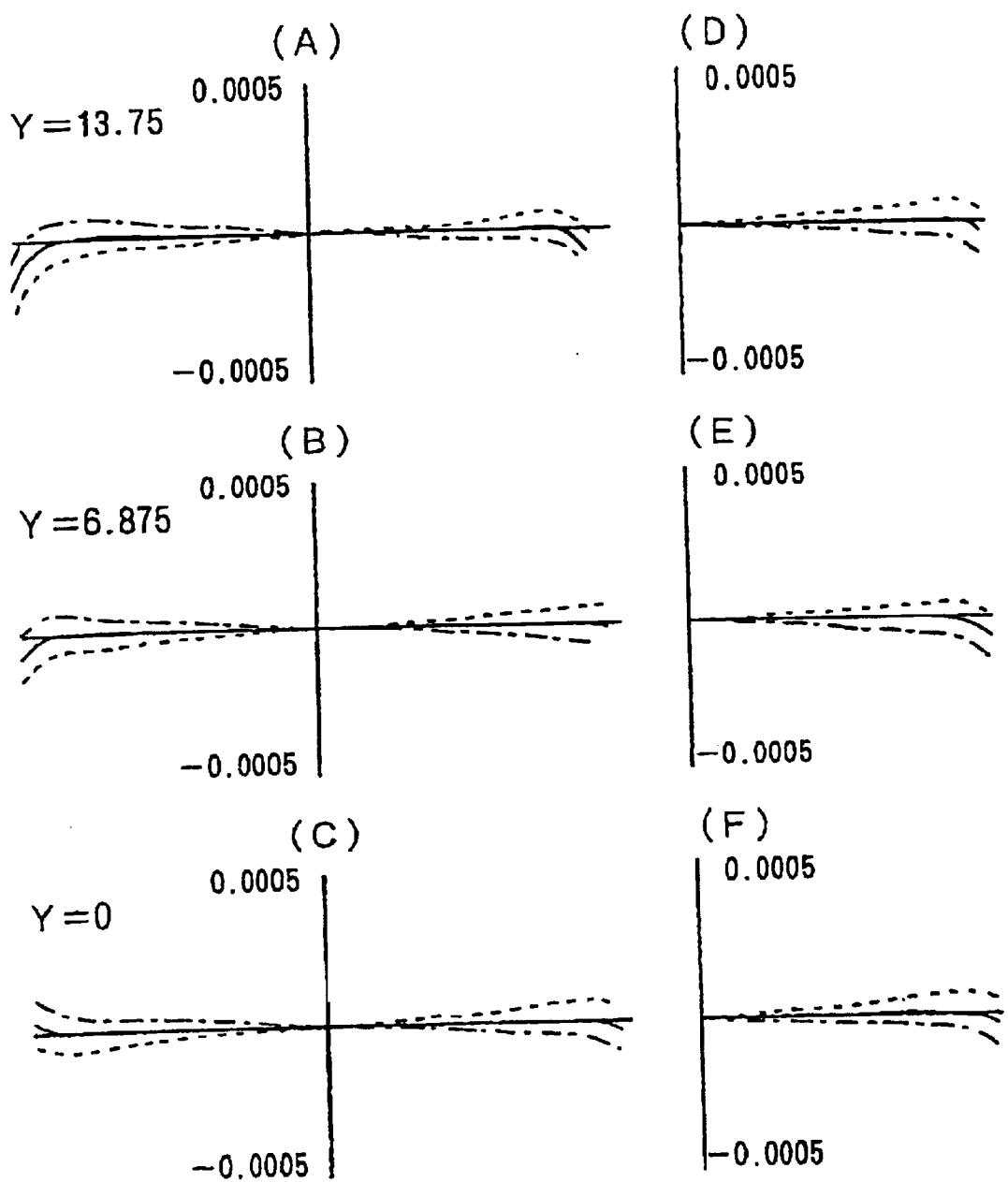
FIG. 18 is lateral aberration charts of the projection optical system according to the sixth numerical example of the present invention.
Figure 19:
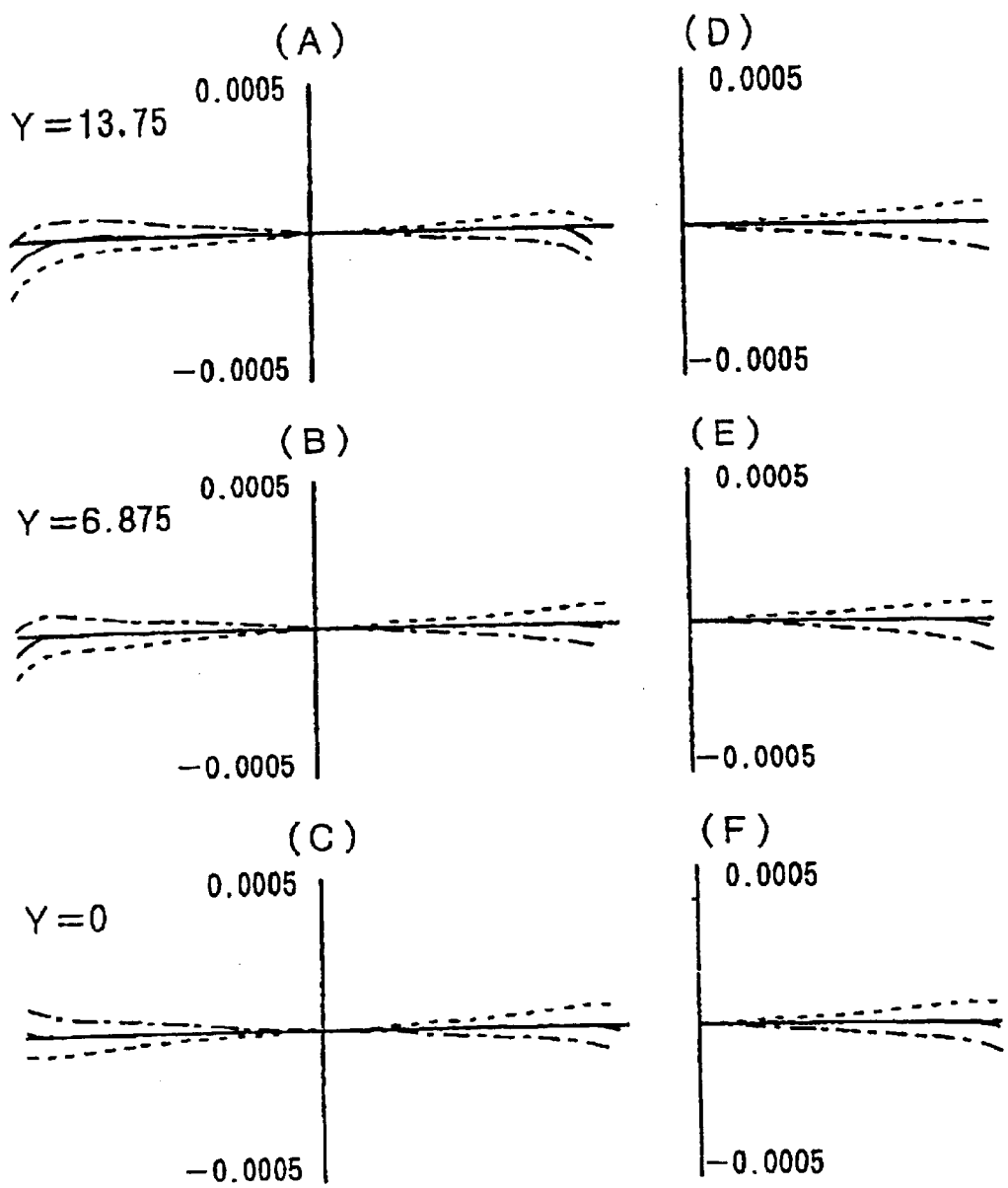
FIG. 19 is lateral aberration charts of the projection optical system according to the seventh numerical example of the present invention.
Figure 20:
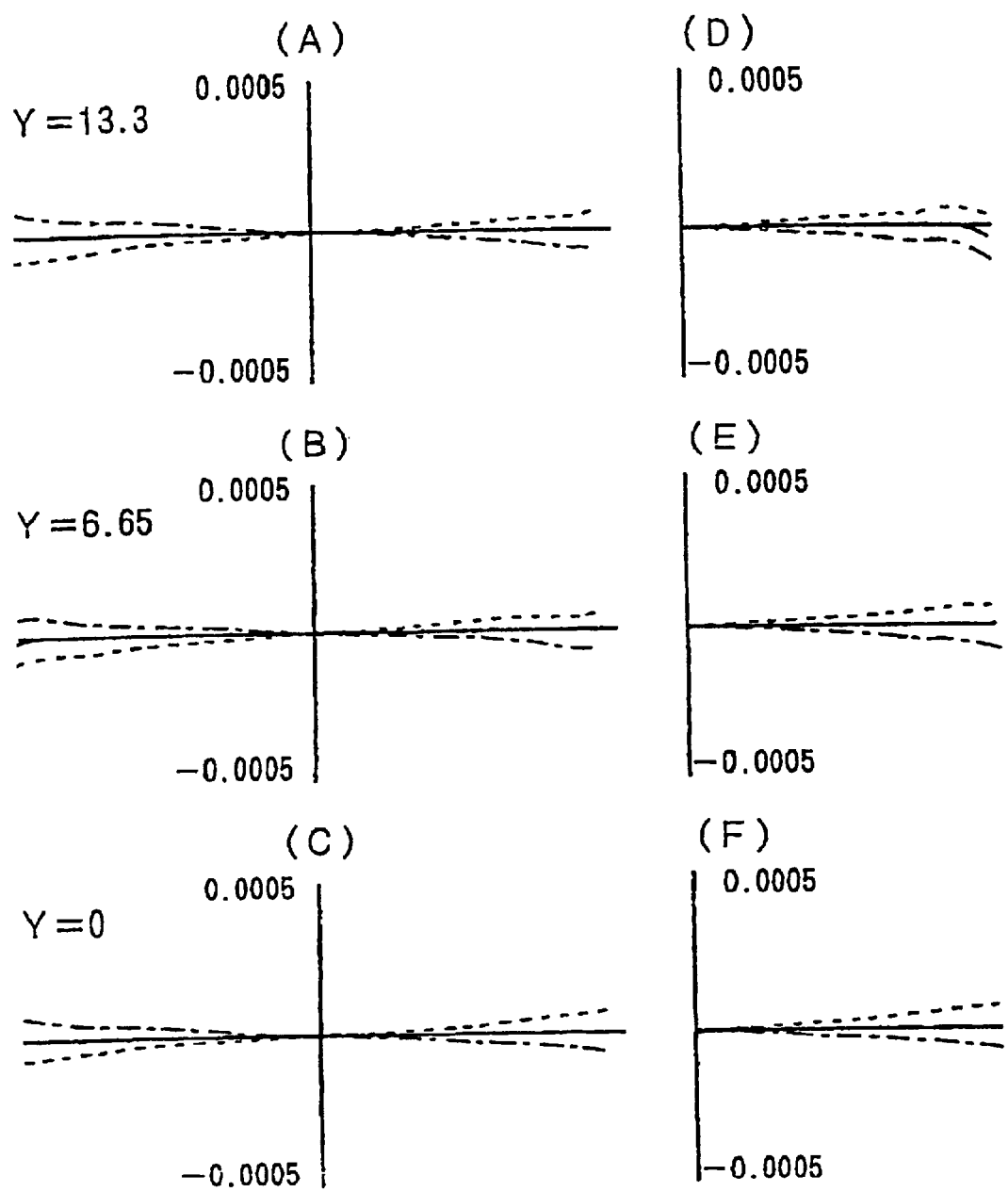
FIG. 20 is lateral aberration charts of a projection optical system according to an eighth numerical example (the second numerical example) of the present invention.

FIG. 14 is the optical path diagram of the projection optical system according to the seventh embodiment. In this seventh embodiment, silica glass (synthetic quartz) is used as the principal material (second material) of the radiation-transmitting refractors in the projection optical system and fluorite as the achromatizing material (first material).

As shown in FIG. 14, the projection optical system of the seventh embodiment is a double waist type imaging optical system having the front lens unit GF of the positive refracting power, the aperture stop AS, and the rear lens unit GR of the positive refracting power in the order named from the first surface A side.

The front lens unit GF has a negative lens L11 of the biconcave shape, three positive lenses L12 to L14 of the biconvex shape, a negative lens L15 of the meniscus shape with a convex surface facing to the first surface A side, a positive lens L16 of the meniscus shape with a concave surface facing to the first surface A side, a negative lens L17 of the meniscus shape with a convex surface facing to the first surface A side, two negative lenses L18, L19 of the biconcave shape, a negative lens L20 of the meniscus shape with a concave surface facing to the first surface A side, a positive lens L21 of the meniscus shape with a concave surface facing to the first surface A side, a positive lens L22 of the biconvex shape, a positive lens L23 of the meniscus shape with a concave surface facing to the first surface A side, a positive lens L24 of the meniscus shape with a convex surface facing to the first surface A side, a positive lens L25 of the biconvex shape, a negative lens L26 of the meniscus shape with a convex surface facing to the first surface A side, two negative lenses L27, L28 of the biconcave shape, and a positive lens L29 of the meniscus shape with a concave surface facing to the first surface A side, in the order named from the first surface A side. Then the lens surface on the first surface A side of the negative lens L20, the lens surface on the first surface A side of the negative lens L27, and the lens surface on the second surface B side of the negative lens L28 are formed as aspheric surfaces ASP1, ASP2, and ASP3, respectively. Only the positive lens L29 closest to the second surface B and the positive lens L24 in the middle are made of fluorite and the other lenses L11 to L23, L25 to L28 are made all of silica glass.

The rear lens unit GR has two positive lenses L51, L52 of the biconvex shape, a negative lens L53 of the meniscus shape with a concave surface facing to the first surface A side, a positive lens L54 of the biconvex shape, three positive lenses L55 to L57 of the meniscus shape with a convex surface facing to the first surface A side, a negative lens L58 of the biconcave shape, and a positive lens L59 of the biconvex shape in the order named from the first surface A side. Here the four lenses L53, L54, L58, L59 are made as silica lenses and the other five lenses L51, L52, L55, L56, L57 are made of fluorite.

In the seventh embodiment, as described above, silica glass (synthetic quartz) and fluorite are also used as the lens materials (glass materials) and all the lens surfaces of the aspheric shape are formed in the lenses of silica glass.

Next, the lens configuration of the projection optical system according to the eighth embodiment of the present example is the same as that of the second embodiment of FIG. 2. However, the second embodiment was designed to effect the chromatic aberration correction in the range of the wavelength band ±0.4 pm for the reference wavelength of 193.306 nm, whereas this eighth embodiment is arranged to effect the chromatic aberration correction in the range of FWHM (full width at half maximum) of 0.35 pm centered about 193.3 nm, i.e., in the range of 193.3 nm±0.175 pm. This range is substantially equivalent to the color correction range of the second embodiment (the range of the wavelength band ±0.4 pm for the reference wavelength).

Table 4 to Table 8 below provide the specifications of the projection optical systems of the third embodiment to the seventh embodiment, respectively. In Table 4 to Table 8, the left end column indicates numbers of the respective lens surfaces from the first surface A, the second column indicates radii of curvature of the respective lens surfaces, the third column indicates surface spacings from each lens surface to a next lens surface, the fourth column indicates lens materials, the fifth column indicates symbols of the aspheric surfaces, the sixth column indicates the symbols of the respective lenses, and the seventh column indicates clear aperture diameters $\Phi_{eff}$ of the respective lens surfaces. A radius of curvature in the second column for each aspheric lens surface represents a radius of curvature at a vertex thereof. The aspheric shape is expressed by foregoing Eq. (a).

In the last part of Table 4 to Table 8 there are presented the conical coefficient κ and the aspheric coefficients A, B, C, D, E, F for each aspheric surface as [aspheric data].

In the third embodiment to the seventh embodiment, the refractive index at the reference wavelength (193.3 nm), the change (dispersion) of refractive index per wavelength+1 pm, and specific gravity of silica glass (synthetic quartz) are as follows.

refractive index of silica glass: 1.560326 dispersion of silica glass: $-1.591 \times 10^{-6}$/pm specific gravity of silica glass: 2.2

Further, the refractive index at the above reference wavelength (193.3 nm), the change (dispersion) of refractive index per wavelength+1 pm, and the specific gravity of fluorite are as follows.

refractive index of fluorite: 1.501455 dispersion of fluorite: $-0.980 \times 10^{-6}$/pm specific gravity of fluorite: 3.18

In Table 4 to Table 8 below, $SiO_2$ indicates silica glass, $CaF_2$ fluorite, d0 the distance from the first surface A to the lens surface closest to the first surface A, and WD the distance from the lens surface closest to the second surface B, to the second surface B (workpieceing distance).

Being common to the third embodiment to the seventh embodiment, the numerical aperture NA of the projection optical system (the maximum numerical aperture NAw on the second surface B side), the projection magnification β, and the diameter φ of the image circle on the second surface B are as follows.

NA=0.75

β=−1/4

φ=27.5 mm

TABLE 4

Third Embodiment (FIG. 10)
d0 = 55.000001 (mm)
WD = 11.000007 (mm)

| | Radius of curvature (mm) | Spacing (mm) | Glass | Aspheric surface | Lens | $\Phi_{eff}$ (mm) |
|---|---|---|---|---|---|---|
| 1: | 7091.42905 | 15.000000 | $SiO_2$ | ASP1 | L11 | 65.764267 |
| 2: | 355.28402 | 26.433708 | | | | 67.469398 |
| 3: | −130.38826 | 25.918810 | $SiO_2$ | | L12 | 67.725563 |
| 4: | −754.54900 | 17.524438 | | ASP2 | | 83.206055 |
| 5: | −184.75652 | 50.000000 | $SiO_2$ | | L21 | 83.795761 |
| 6: | −201.31203 | 1.000000 | | | | 106.116302 |
| 7: | −19890.02238 | 49.483069 | $SiO_2$ | | L22 | 122.397278 |
| 8: | −316.51565 | 1.000000 | | | | 129.413116 |
| 9: | 1245.95085 | 42.403865 | $SiO_2$ | | L23 | 138.357544 |
| 10: | −498.42771 | 66.560407 | | | | 140.000000 |
| 11: | 278.47126 | 51.637906 | $SiO_2$ | | L24 | 141.615372 |
| 12: | −5012.84861 | 1.000000 | | | | 139.454163 |
| 13: | 289.66134 | 44.179422 | $SiO_2$ | ASP3 | L25 | 129.500671 |
| 14: | −2001.37857 | 42.267253 | | | | 124.865738 |
| 15: | 790.93523 | 49.069868 | $SiO_2$ | | L31 | 91.125748 |
| 16: | 135.96684 | 33.309217 | | | | 65.088898 |
| 17: | −267.87840 | 17.040059 | $SiO_2$ | | L32 | 61.547058 |
| 18: | 270.92888 | 19.267729 | | | | 57.542892 |
| 19: | −142.62085 | 16.121708 | $SiO_2$ | | L33 | 57.458405 |
| 20: | 178.57511 | 16.822454 | | ASP4 | | 61.534664 |
| 21: | −421.32209 | 50.000000 | $SiO_2$ | | L41 | 61.972908 |
| 22: | −259.46576 | 1.000000 | | | | 76.112648 |
| 23: | −2487.25765 | 50.000000 | $SiO_2$ | | L42 | 79.889153 |
| 24: | −308.14629 | 76.768520 | | | | 88.439072 |
| 25: | 280.00000 | 41.127434 | $SiO_2$ | | L43 | 108.679848 |
| 26: | −720.48955 | 1.000000 | | | | 108.229263 |
| 27: | ∞ | 42.733304 | | | AS | 106.832184 |
| 28: | −291.63339 | 24.106015 | $SiO_2$ | | L51 | 104.909050 |
| 29: | 462.50054 | 3.915270 | | ASP5 | | 111.616905 |
| 30: | 471.58425 | 40.504164 | $SiO_2$ | | L52 | 112.104271 |
| 31: | −415.23032 | 1.000000 | | | | 114.105286 |
| 32: | 454.04392 | 43.243602 | $SiO_2$ | | L53 | 118.187286 |
| 33: | −454.04392 | 16.312093 | | | | 117.964470 |
| 34: | 165.07875 | 34.495142 | $SiO_2$ | | L54 | 104.927750 |
| 35: | 339.14804 | 1.000000 | | | | 100.211807 |
| 36: | 150.00000 | 50.000000 | $SiO_2$ | | L55 | 92.390938 |
| 37: | 224.50669 | 1.706390 | | | | 75.144737 |
| 38: | 129.56425 | 36.373254 | $SiO_2$ | | L56 | 69.153374 |
| 39: | 270.95319 | 6.298515 | | ASP6 | | 54.786152 |
| 40: | −21804.34155 | 50.000000 | $SiO_2$ | | L57 | 53.646206 |
| 41: | ∞ | (WD) | | | | 26.202827 |

[Aspheric Data]

ASP1

κ: 0.000000
A: $0.961814 \times 10^{-7}$
B: $-0.378122 \times 10^{-11}$
C: $0.392716 \times 10^{-16}$
D: $0.424498 \times 10^{-20}$
E: $-0.220614 \times 10^{-23}$
F: $0.200305 \times 10^{-27}$

ASP2

κ: 0.000000
A: $0.263695 \times 10^{-7}$
B: $-0.882693 \times 10^{-12}$
C: $0.290428 \times 10^{-16}$
D: $0.285450 \times 10^{-21}$
E: $-0.170241 \times 10^{-24}$
F: $0.929230 \times 10^{-29}$

ASP3

κ: 0.000000
A: $-0.889053 \times 10^{-8}$
B: $-0.224185 \times 10^{-12}$
C: $-0.211101 \times 10^{-17}$
D: $-0.108571 \times 10^{-22}$
E: $0.470441 \times 10^{-27}$
F: $0.130782 \times 10^{-31}$ TABLE 4-continued

ASP4

$\kappa$: 0.000000
A: $0.408033 \times 10^{-7}$
B: $-0.582850 \times 10^{-11}$
C: $0.132297 \times 10^{-15}$
D: $0.117896 \times 10^{-19}$
E: $-0.974397 \times 10^{-24}$
F: $0.578268 \times 10^{-28}$

ASP5

$\kappa$: 0.000000
A: $0.186307 \times 10^{-7}$
B: $-0.146992 \times 10^{-13}$
C: $-0.448096 \times 10^{-17}$
D: $-0.180733 \times 10^{-22}$
E: $0.986636 \times 10^{-27}$
F: $-0.118893 \times 10^{-31}$

ASP6

$\kappa$: 0.000000
A: $-0.256013 \times 10^{-7}$
B: $-0.517336 \times 10^{-11}$
C: $0.740082 \times 10^{-16}$
D: $-0.106082 \times 10^{-19}$
E: $0.506294 \times 10^{-23}$
F: $-0.312361 \times 10^{-27}$

TABLE 5

Fourth Embodiment (FIG. 11)
d0 = 61.517734 (mm)
WD = 11.723518 (mm)

| | Radius of curvature (mm) | Spacing (mm) | Glass | Aspheric surface | Lens | $\varnothing_{eff}$ (mm) |
|---|---|---|---|---|---|---|
| 1: | 850.22148 | 15.762264 | SiO$_2$ | ASP1 | L11 | 67.516739 |
| 2: | 258.78675 | 32.754986 | | | | 68.621666 |
| 3: | −120.04708 | 29.316457 | SiO$_2$ | | L12 | 69.040245 |
| 4: | −1436.64708 | 14.154830 | | ASP2 | | 88.608788 |
| 5: | −262.93413 | 49.861514 | SiO$_2$ | | L21 | 89.277542 |
| 6: | −204.39549 | 1.000000 | | | | 108.090843 |
| 7: | 4807.74825 | 47.706981 | SiO$_2$ | | L22 | 124.939384 |
| 8: | −334.63584 | 1.000000 | | | | 130.588333 |
| 9: | 943.02750 | 38.323507 | SiO$_2$ | | L23 | 138.787674 |
| 10: | −755.20042 | 52.297712 | | | | 139.999893 |
| 11: | 314.45430 | 52.295370 | SiO$_2$ | | L24 | 142.105682 |
| 12: | −1342.07699 | 1.000000 | | | | 140.302780 |
| 13: | 220.89539 | 44.997489 | SiO$_2$ | ASP3 | L25 | 125.209908 |
| 14: | 1112.83084 | 35.915976 | | | | 119.146675 |
| 15: | 578.45483 | 47.943238 | SiO$_2$ | | L31 | 94.646919 |
| 16: | 137.07988 | 34.945536 | | | | 68.147148 |
| 17: | −290.24030 | 22.821650 | SiO$_2$ | | L32 | 64.390198 |
| 18: | 284.15051 | 19.770859 | | | | 59.085491 |
| 19: | −144.74289 | 15.000000 | SiO$_2$ | | L33 | 58.975883 |
| 20: | 182.17660 | 18.923653 | | ASP4 | | 62.526440 |
| 21: | −316.81092 | 50.000000 | SiO$_2$ | | L41 | 62.945671 |
| 22: | −235.35205 | 1.000000 | | | | 77.530685 |
| 23: | −1288.79277 | 48.502244 | SiO$_2$ | | L42 | 81.365692 |
| 24: | −310.15694 | 87.817988 | | | | 90.067612 |
| 25: | 280.00000 | 44.217287 | CaF$_2$ | | L43 | 114.022461 |
| 26: | −726.81420 | 1.000000 | | | | 113.702507 |
| 27: | ∞ | 34.906154 | | | AS | 112.151863 |
| 28: | −321.35755 | 24.106015 | SiO$_2$ | | L51 | 111.345039 |
| 29: | 527.14450 | 3.208930 | | ASP5 | | 117.654945 |
| 30: | 526.07539 | 41.883852 | SiO$_2$ | | L52 | 117.834465 |
| 31: | −420.10068 | 1.000000 | | | | 119.874275 |
| 32: | 501.17942 | 44.518152 | SiO$_2$ | | L53 | 124.057274 |
| 33: | −518.35529 | 23.847453 | | | | 123.851112 |
| 34: | 187.05620 | 37.766684 | SiO$_2$ | | L54 | 111.266914 |
| 35: | 401.71759 | 3.209637 | | | | 105.841919 |
| 36: | 150.18738 | 50.000000 | SiO$_2$ | | L55 | 96.210228 |
| 37: | 247.90367 | 7.654279 | | | | 80.668587 |
| 38: | 129.88090 | 35.932549 | SiO$_2$ | | L56 | 70.574219 |

TABLE 5-continued

| | | | | | | |
|---|---|---|---|---|---|---|
| 39: | 296.77641 | 6.269996 | | ASP6 | | 57.089531 |
| 40: | −55171.62371 | 50.000000 | CaF$_2$ | | L57 | 55.946609 |
| 41: | 8863.22783 | (WD) | | | | 26.976627 |

[Aspheric Data]

ASP1

$\kappa$: 0.000000
A: $0.973900 \times 10^{-7}$
B: $-0.304719 \times 10^{-11}$
C: $0.103626 \times 10^{-15}$
D: $0.933452 \times 10^{-20}$
E: $-0.259784 \times 10^{-23}$
F: $0.281860 \times 10^{-27}$

ASP2

$\kappa$: 0.000000
A: $0.525544 \times 10^{-8}$
B: $-0.471274 \times 10^{-12}$
C: $0.546888 \times 10^{-16}$
D: $-0.177219 \times 10^{-20}$
E: $0.249175 \times 10^{-26}$
F: $0.442229 \times 10^{-29}$

ASP3

$\kappa$: 0.000000
A: $-0.378457 \times 10^{-8}$
B: $-0.141446 \times 10^{-12}$
C: $-0.231375 \times 10^{-17}$
D: $-0.721926 \times 10^{-22}$
E: $-0.407320 \times 10^{-27}$
F: $-0.595894 \times 10^{-31}$

ASP4

$\kappa$: 0.000000
A: $0.607276 \times 10^{-7}$
B: $-0.700544 \times 10^{-11}$
C: $0.760900 \times 10^{-16}$
D: $0.201180 \times 10^{-19}$
E: $-0.160443 \times 10^{-23}$
F: $0.856074 \times 10^{-28}$

ASP5

$\kappa$: 0.000000
A: $0.157329 \times 10^{-7}$
B: $-0.167548 \times 10^{-14}$
C: $-0.304998 \times 10^{-17}$
D: $-0.499814 \times 10^{-23}$
E: $0.552478 \times 10^{-27}$
F: $-0.684401 \times 10^{-32}$

ASP6

$\kappa$: 0.000000
A: $-0.183007 \times 10^{-7}$
B: $-0.320743 \times 10^{-11}$
C: $0.474775 \times 10^{-16}$
D: $-0.990352 \times 10^{-20}$
E: $0.269071 \times 10^{-23}$
F: $-0.170233 \times 10^{-27}$

TABLE 6

Fifth Embodiment (FIG. 12)
d0 = 55.000003 (mm)
WD = 10.999994 (mm)

| | Radius of curvature (mm) | Spacing (mm) | Glass | Aspheric surface | Lens | $\varnothing_{eff}$ (mm) |
|---|---|---|---|---|---|---|
| 1: | ∞ | 15.000000 | SiO$_2$ | | L11 | 65.321190 |
| 2: | 314.62704 | 27.244624 | | ASP1 | | 67.796265 |
| 3: | −123.18686 | 27.378474 | SiO$_2$ | | L12 | 68.086769 |
| 4: | −266.68374 | 14.602794 | | | | 82.068336 |
| 5: | −150.00000 | 50.000000 | SiO$_2$ | ASP2 | L21 | 82.538231 |

TABLE 6-continued

| | | | | | |
|---|---|---|---|---|---|
| 6: | −244.34192 | 1.000000 | | | 110.219063 |
| 7: | −1198.84474 | 44.914055 | SiO$_2$ | L22 | 122.357353 |
| 8: | −232.66356 | 1.000000 | | | 127.431076 |
| 9: | 5275.64252 | 43.090859 | SiO$_2$ | L23 | 137.635925 |
| 10: | −360.63034 | 5.030036 | | | 139.581192 |
| 11: | 285.72583 | 47.577067 | SiO$_2$ | L24 | 139.546677 |
| 12: | 4561.05389 | 6.030041 | | | 136.970505 |
| 13: | 212.35017 | 50.000000 | SiO$_2$ | L25 | 124.093590 |
| 14: | 796.03296 | 35.691263 | | | 116.083298 |
| 15: | 762.23216 | 50.000000 | SiO$_2$ | L31 | 95.138901 |
| 16: | 147.63565 | 50.187741 | | ASP3 | 69.070221 |
| 17: | −185.70008 | 15.000000 | SiO$_2$ | L32 | 61.216537 |
| 18: | 639.43295 | 15.701720 | | | 59.080795 |
| 19: | −153.51758 | 15.000000 | SiO$_2$ | L33 | 59.002586 |
| 20: | 185.58159 | 20.611177 | | ASP4 | 63.036831 |
| 21: | −255.87716 | 50.000000 | CaF$_2$ | L41 | 63.577843 |
| 22: | −249.68527 | 3.980529 | | | 80.211006 |
| 23: | −3778.76287 | 35.000000 | CaF$_2$ | L42 | 86.501961 |
| 24: | −224.75345 | 129.599557 | | | 90.822037 |
| 25: | 280.00000 | 50.000000 | SiO$_2$ | L43 | 120.569611 |
| 26: | −913.12886 | 10.916703 | | | 119.561447 |
| 27: | ∞ | 33.865871 | | AS | 117.247459 |
| 28: | −361.62622 | 24.106015 | SiO$_2$ | L51 | 115.516739 |
| 29: | 416.11728 | 5.557131 | | ASP5 | 118.568176 |
| 30: | 416.69495 | 44.381334 | SiO$_2$ | L52 | 119.549057 |
| 31: | −543.90687 | 1.000000 | | | 120.733887 |
| 32: | 590.20673 | 38.166548 | SiO$_2$ | L53 | 121.085487 |
| 33: | −590.20673 | 24.232291 | | | 120.207893 |
| 34: | 180.00000 | 39.243850 | SiO$_2$ | L54 | 108.463890 |
| 35: | 309.38340 | 8.819688 | | | 101.371346 |
| 36: | 150.00000 | 50.000000 | SiO$_2$ | L55 | 92.781006 |
| 37: | 225.00345 | 1.166306 | | ASP6 | 77.138145 |
| 38: | 114.38119 | 43.612328 | CaF$_2$ | L56 | 70.172379 |
| 39: | 390.97069 | 5.290357 | | | 54.909901 |
| 40: | −7097.28080 | 50.000000 | CaF$_2$ | L57 | 53.587784 |
| 41: | ∞ | (WD) | | | 25.551462 |

[Aspheric Data]

ASP1

κ: 0.000000
A: −0.969228 × 10$^{-7}$
B: 0.326972 × 10$^{-11}$
C: −0.944059 × 10$^{-16}$
D: 0.473154 × 10$^{-20}$
E: 0.728259 × 10$^{-24}$
F: −0.582964 × 10$^{-29}$

ASP2

κ: 0.000000
A: −0.243951 × 10$^{-7}$
B: −0.120134 × 10$^{-11}$
C: −0.659871 × 10$^{-16}$
D: −0.399458 × 10$^{-20}$
E: −0.878285 × 10$^{-25}$
F: −0.231429 × 10$^{-28}$

ASP3

κ: 0.000000
A: 0.293300 × 10$^{-8}$
B: 0.197746 × 10$^{-11}$
C: 0.885710 × 10$^{-16}$
D: 0.335600 × 10$^{-20}$
E: 0.761535 × 10$^{-24}$
F: 0.365525 × 10$^{-28}$

ASP4

κ: 0.000000
A: 0.506090 × 10$^{-7}$
B: −0.926440 × 10$^{-11}$
C: 0.292340 × 10$^{-15}$
D: 0.202698 × 10$^{-19}$
E: −0.264577 × 10$^{-23}$
F: 0.125177 × 10$^{-27}$

ASP5

κ: 0.000000
A: 0.142370 × 10$^{-7}$
B: 0.564687 × 10$^{-13}$
C: −0.238454 × 10$^{-17}$
D: −0.231787 × 10$^{-22}$
E: 0.248738 × 10$^{-27}$
F: −0.396109 × 10$^{-32}$

ASP6

κ: 0.000000
A: 0.328323 × 10$^{-8}$
B: −0.104463 × 10$^{-11}$
C: −0.354474 × 10$^{-16}$
D: −0.125502 × 10$^{-20}$
E: −0.370501 × 10$^{-27}$
F: 0.157184 × 10$^{-29}$

TABLE 7

Sixth Embodiment (FIG. 13)
d0 = 63.749760 (mm)
WD = 11.204291 (mm)

| | Radius of curvature (mm) | Spacing (mm) | Glass | Aspheric surface | Lens | Ø$_{eff}$ (mm) |
|---|---|---|---|---|---|---|
| 1: | −384.26106 | 15.000000 | SiO$_2$ | | L11 | 65.998985 |
| 2: | 281.85126 | 11.978853 | | | | 71.535873 |
| 3: | 348.95782 | 28.971808 | SiO$_2$ | | L12 | 77.330864 |
| 4: | −344.97594 | 1.000000 | | | | 79.541092 |
| 5: | 838.59364 | 22.091944 | SiO$_2$ | | L13 | 82.133408 |
| 6: | −491.36531 | 1.000000 | | | | 82.994720 |
| 7: | 404.67369 | 24.295064 | SiO$_2$ | | L14 | 83.439461 |
| 8: | −747.56330 | 1.000000 | | | | 82.796455 |
| 9: | 231.07842 | 15.000000 | SiO$_2$ | | L15 | 79.702614 |
| 10: | 134.40371 | 10.555015 | | | | 74.346352 |
| 11: | 220.98194 | 31.018759 | SiO$_2$ | | L16 | 74.341751 |
| 12: | −376.01279 | 1.000000 | | | | 72.918823 |
| 13: | −2565.43982 | 31.296610 | SiO$_2$ | | L17 | 70.508438 |
| 14: | 150.78493 | 21.342695 | | | | 61.532974 |
| 15: | −265.42164 | 15.000000 | SiO$_2$ | | L18 | 61.468307 |
| 16: | 205.74686 | 22.633359 | | | | 62.887703 |
| 17: | −175.10057 | 15.000000 | SiO$_2$ | | L19 | 63.156342 |
| 18: | 384.28896 | 26.307128 | | | | 73.675224 |
| 19: | −337.20967 | 15.000000 | SiO$_2$ | ASP1 | L20 | 81.524727 |
| 20: | −2665.09055 | 11.890080 | | | | 92.491890 |
| 21: | −355.33094 | 23.660088 | SiO$_2$ | | L21 | 93.401833 |
| 22: | −212.64088 | 1.000000 | | | | 100.326263 |
| 23: | 9025.03298 | 37.428886 | SiO$_2$ | | L22 | 118.812363 |
| 24: | −307.87323 | 1.000000 | | | | 123.020493 |
| 25: | −3478.34934 | 35.232416 | SiO$_2$ | | L23 | 131.558868 |
| 26: | −350.00000 | 1.000000 | | | | 134.129471 |
| 27: | 655.38208 | 45.610359 | SiO$_2$ | | L24 | 139.999451 |
| 28: | −513.31974 | 1.000000 | | | | 140.078323 |
| 29: | 213.32620 | 57.138993 | SiO$_2$ | | L25 | 130.179550 |
| 30: | −4397.04839 | 33.096623 | | | | 126.273247 |
| 31: | 887.72778 | 15.000000 | SiO$_2$ | | L26 | 100.220100 |
| 32: | 161.65056 | 57.435235 | | | | 85.838745 |
| 33: | −157.17781 | 15.000000 | SiO$_2$ | ASP2 | L27 | 82.709534 |
| 34: | 219.87361 | 32.150950 | | | | 84.204674 |
| 35: | −255.39120 | 15.000000 | SiO$_2$ | | L28 | 84.510979 |
| 36: | −8581.78601 | 11.405070 | | ASP3 | | 93.478951 |
| 37: | −388.87067 | 44.944016 | CaF$_2$ | | L29 | 94.167152 |
| 38: | −218.37501 | 1.000000 | | | | 106.093346 |
| 39: | ∞ | 14.244161 | | | AS | 113.779617 |
| 40: | 2733.87010 | 44.018422 | CaF$_2$ | | L51 | 121.696854 |
| 41: | −283.88458 | 1.000000 | | | | 124.288734 |
| 42: | 336.30525 | 43.993297 | CaF$_2$ | | L52 | 133.359390 |
| 43: | −1641.02052 | 26.208757 | | | | 133.284454 |
| 44: | −305.07796 | 25.000000 | SiO$_2$ | | L53 | 133.233185 |
| 45: | −428.53617 | 9.225281 | | | | 137.790878 |
| 46: | 704.67535 | 38.550758 | SiO$_2$ | | L54 | 139.115891 |
| 47: | −708.09492 | 1.000000 | | | | 138.525772 |

TABLE 7-continued

| | Radius of curvature (mm) | Spacing (mm) | Glass | Aspheric surface | Lens | $\emptyset_{\text{eff}}$ (mm) |
|---|---|---|---|---|---|---|
| 48: | 210.28367 | 39.284351 | CaF$_2$ | | L55 | 126.898781 |
| 49: | 533.77492 | 1.000000 | | | | 122.815582 |
| 50: | 178.50760 | 37.746739 | CaF$_2$ | | L56 | 111.402145 |
| 51: | 379.62268 | 1.057673 | | | | 104.079216 |
| 52: | 169.01250 | 33.580626 | CaF$_2$ | | L57 | 93.513443 |
| 53: | 510.82832 | 7.325751 | | | | 84.815453 |
| 54: | 4574.64963 | 50.000000 | SiO$_2$ | | L58 | 83.638657 |
| 55: | 379.11421 | 2.326181 | | | | 53.309875 |
| 56: | 563.01655 | 50.000000 | SiO$_2$ | | L59 | 52.367188 |
| 57: | −4692.22208 | (WD) | | | | 26.519352 |

[Aspheric Data]

ASP1

κ: 0.000000
A: 0.216518 × 10$^{-7}$
B: 0.109348 × 10$^{-11}$
C: 0.396907 × 10$^{-16}$
D: 0.177070 × 10$^{-20}$
E: 0.301350 × 10$^{-25}$
F: 0.748178 × 10$^{-29}$

ASP2

κ: 0.339337
A: 0.468446 × 10$^{-8}$
B: 0.323507 × 10$^{-11}$
C: −0.277057 × 10$^{-17}$
D: 0.454850 × 10$^{-20}$
E: −0.183005 × 10$^{-24}$
F: 0.121371 × 10$^{-28}$

ASP3

κ: 0.000000
A: −0.170958 × 10$^{-7}$
B: 0.631731 × 10$^{-12}$
C: −0.315858 × 10$^{-16}$
D: 0.957027 × 10$^{-21}$
E: −0.298216 × 10$^{-25}$
F: −0.655478 × 10$^{-30}$

TABLE 8

Seventh Embodiment (FIG. 14)
d0 = 63.749746 (mm)
WD = 13.389654 (mm)

| | Radius of curvature (mm) | Spacing (mm) | Glass | Aspheric surface | Lens | $\emptyset_{\text{eff}}$ (mm) |
|---|---|---|---|---|---|---|
| 1: | −396.81755 | 15.164101 | SiO$_2$ | | L11 | 66.032784 |
| 2: | 318.45576 | 29.207879 | | | | 71.297302 |
| 3: | 732.28117 | 25.666287 | SiO$_2$ | | L12 | 83.471970 |
| 4: | −379.10485 | 1.000000 | | | | 86.041710 |
| 5: | 525.04598 | 29.799021 | SiO$_2$ | | L13 | 90.425125 |
| 6: | −386.12241 | 1.000000 | | | | 91.317108 |
| 7: | 296.71481 | 27.521447 | SiO$_2$ | | L14 | 91.079468 |
| 8: | −1834.92841 | 1.000000 | | | | 89.757446 |
| 9: | 178.21689 | 15.000000 | SiO$_2$ | | L15 | 84.396111 |
| 10: | 128.82838 | 30.507210 | | | | 77.857750 |
| 11: | −912.34305 | 18.141324 | SiO$_2$ | | L16 | 77.741890 |
| 12: | −290.65675 | 1.000000 | | | | 77.271347 |
| 13: | 2184.51382 | 47.405470 | SiO$_2$ | | L17 | 74.290833 |
| 14: | 188.39849 | 24.667168 | | | | 65.022842 |
| 15: | −180.63293 | 15.000000 | SiO$_2$ | | L18 | 64.974625 |
| 16: | 308.32087 | 19.189943 | | | | 68.677689 |
| 17: | −233.12081 | 15.000000 | SiO$_2$ | | L19 | 68.994057 |
| 18: | 439.39083 | 32.120556 | | | | 79.245667 |
| 19: | −336.14512 | 15.000000 | SiO$_2$ | ASP1 | L20 | 89.338654 |
| 20: | −2278.87871 | 10.459773 | | | | 101.857063 |
| 21: | −456.23451 | 24.690274 | SiO$_2$ | | L21 | 102.820465 |
| 22: | −254.53495 | 1.000000 | | | | 110.024078 |
| 23: | 2814.34795 | 54.862219 | SiO$_2$ | | L22 | 131.136322 |
| 24: | −244.85996 | 1.000000 | | | | 135.344131 |
| 25: | −1839.77632 | 33.926267 | SiO$_2$ | | L23 | 144.103409 |

TABLE 8-continued

| | Radius of curvature (mm) | Spacing (mm) | Glass | Aspheric surface | Lens | $\emptyset_{\text{eff}}$ (mm) |
|---|---|---|---|---|---|---|
| 26: | −387.77935 | 1.000000 | | | | 146.107864 |
| 27: | 350.00000 | 44.271958 | CaF$_2$ | | L24 | 149.999664 |
| 28: | 22107.52832 | 1.000000 | | | | 148.725906 |
| 29: | 254.93631 | 55.237937 | SiO$_2$ | | L25 | 141.298035 |
| 30: | −6319.95498 | 31.357005 | | | | 137.595520 |
| 31: | 664.06027 | 18.849345 | SiO$_2$ | | L26 | 112.356766 |
| 32: | 185.98655 | 69.207456 | | | | 96.853653 |
| 33: | −174.34160 | 15.000000 | SiO$_2$ | ASP2 | L27 | 91.180862 |
| 34: | 227.17956 | 38.807665 | | | | 92.023659 |
| 35: | −241.62100 | 15.000000 | SiO$_2$ | | L28 | 92.325920 |
| 36: | 4079.61757 | 15.799849 | | ASP3 | | 103.721855 |
| 37: | −376.03072 | 39.964600 | CaF$_2$ | | L29 | 104.289635 |
| 38: | −218.60371 | 1.000000 | | | | 114.670761 |
| 39: | ∞ | 6.289754 | | | AS | 125.662186 |
| 40: | 1034.55937 | 49.970241 | CaF$_2$ | | L51 | 133.965057 |
| 41: | −321.64602 | 1.000000 | | | | 136.199570 |
| 42: | 468.84931 | 48.186456 | CaF$_2$ | | L52 | 143.242279 |
| 43: | −704.77302 | 17.319103 | | | | 143.524338 |
| 44: | −346.54415 | 25.000000 | SiO$_2$ | | L53 | 143.458008 |
| 45: | −611.18135 | 5.972669 | | | | 147.975433 |
| 46: | 506.91799 | 50.000000 | SiO$_2$ | | L54 | 150.196625 |
| 47: | −1493.04288 | 6.590003 | | | | 148.599213 |
| 48: | 277.37401 | 50.000000 | CaF$_2$ | | L55 | 139.059814 |
| 49: | 1289.11360 | 7.965482 | | | | 133.022858 |
| 50: | 179.54228 | 44.409645 | CaF$_2$ | | L56 | 114.913353 |
| 51: | 446.48076 | 1.057673 | | | | 106.338089 |
| 52: | 182.12642 | 32.279024 | CaF$_2$ | | L57 | 95.185760 |
| 53: | 558.39361 | 8.108756 | | | | 86.695763 |
| 54: | −10831.21505 | 50.000000 | SiO$_2$ | | L58 | 85.506866 |
| 55: | 322.39407 | 2.037539 | | | | 54.834679 |
| 56: | 399.72415 | 50.000000 | SiO$_2$ | | L59 | 53.968300 |
| 57: | −1901.87993 | (WD) | | | | 29.165956 |

[Aspheric Data]

ASP1

κ: 0.000000
A: 0.894266 × 10$^{-8}$
B: 0.474065 × 10$^{-12}$
C: 0.152423 × 10$^{-16}$
D: 0.302088 × 10$^{-21}$
E: 0.257776 × 10$^{-25}$
F: −0.100658 × 10$^{-30}$

ASP2

κ: 0.316202
A: 0.472957 × 10$^{-8}$
B: 0.240757 × 10$^{-11}$
C: −0.215896 × 10$^{-16}$
D: 0.217268 × 10$^{-20}$
E: −0.736783 × 10$^{-25}$
F: 0.336149 × 10$^{-29}$

ASP3

κ: 0.000000
A: −0.155031 × 10$^{-7}$
B: 0.622128 × 10$^{-12}$
C: −0.259658 × 10$^{-16}$
D: 0.943107 × 10$^{-21}$
E: −0.288354 × 10$^{-25}$
F: 0.360267 × 10$^{-30}$

Now Table 9 below presents numerical values corresponding to the conditions in the third embodiment to the seventh embodiment, and in the eighth embodiment (equivalent to the second embodiment). In Table 9, f2 indicates the focal length of the rear lens unit GR, NA indicates the numerical aperture on the second surface B side of the projection optical system (=the image-side maximum numerical aperture NAw), φ indicates the diameter (mm) of the image circle, β indicates the projection magnification, y indicates the reduced use amount (kg) of fluorite as a disk member, yP indicates the use amount (kg) of fluorite as the lenses themselves (shape material), and A indicates the number of aspheric surfaces.

TABLE 9

|  | f2 (mm) | NA (NAw) | Ø (mm) | $\|\beta\|$ | y (kg) | yP (kg) | A |
|---|---|---|---|---|---|---|---|
| Embodiment 3 | 128.0 | 0.75 | 27.5 | 0.25 | 0.0 | 0.0 | 6 |
| Embodiment 4 | 134.2 | 0.75 | 27.5 | 0.25 | 8.6 | 5.8 | 6 |
| Embodiment 5 | 140.2 | 0.75 | 27.5 | 0.25 | 13.5 | 10.3 | 6 |
| Embodiment 6 | 141.6 | 0.75 | 27.5 | 0.25 | 45.2 | 24.7 | 3 |
| Embodiment 7 | 156.4 | 0.75 | 27.5 | 0.25 | 65.9 | 37.3 | 3 |
| Embodiment 8 | 128.3 | 0.75 | 26.6 | 0.25 | 14.1 | 7.9 | 6 |

Next, Table 10 provides the fluorite amount y in FIG. 8 and FIG. 9, and the results of calculation of the parameter x (=f2 · 4$|\beta|$ · NAw$^2$) for each of the embodiments, based on above Table 9. Table 10 further presents values of f2/NAw, which are calculated by dividing the focal length f2 of the rear lens unit GR by the image-side maximum numerical aperture NAw (=NA) of the projection optical system, for each of the embodiments.

TABLE 10

|  | X (= f2 · 4 $\|\beta\|$ · NAw$^2$) (mm) | y (amount of fluorite) (kg) | f2/NAw (mm) |
|---|---|---|---|
| Embodiment 3 | 72.000 | 0.0 | 170.67 |
| Embodiment 4 | 75.488 | 8.6 | 178.93 |
| Embodiment 5 | 78.863 | 13.5 | 186.93 |
| Embodiment 6 | 79.650 | 45.2 | 188.80 |
| Embodiment 7 | 87.975 | 65.9 | 208.53 |
| Embodiment 8 | 72.169 | 14.1 | 171.07 |

The data A3 to A8 (A2) of (x, y) in the third embodiment to the eighth embodiment (the second embodiment), obtained from Table 10, are plotted in FIG. 8 and FIG. 9. These data A3 to A8 are all in the range of the region B5 and the region C5, and thus these embodiments satisfy the conditions (11) to (14) and the conditions (15) to (18). Further, these embodiments all satisfy the conditions (d-1), (d-2). The third embodiment to the sixth embodiment, and the eighth embodiment (the second embodiment) satisfy the condition (e).

The third embodiment to the fifth embodiment, and the eighth embodiment (the second embodiment) satisfy the conditions (19), (20), and the sixth embodiment and the seventh embodiment satisfy the conditions (21), (22).

Next, Table 11 presents the values corresponding to the conditions of the above embodiments concerning the conditions (b-1), (b-2) and (c-1), (c-2) of the aspheric shape. In Table 11, the lens number indicates a number of the lens having the first aspheric surface when counted from the first surface side, in the projection optical system of each embodiment, and the surface number of aspheric surface a number of the aspheric surface from the first surface. The principal curvature Ca is a local, principal curvature near the center of the optical axis of the aspheric surface and is calculated according to Eq (b-4). The principal curvature Cb is a local, principal curvature in the meridional direction of the extreme marginal region of the clear aperture diameter of lens and is calculated according to Eq (b-5).

TABLE 11

|  | Embodiment 3 | Embodiment 4 | Embodiment 5 | Embodiment 8 |
|---|---|---|---|---|
| Lens number | 1 | 1 | 1 | 1 |
| Surface number of aspheric surface | 1 | 1 | 2 | 2 |
| + or − of refracting power | + | + | − | − |
| Clear aperture diameter (mm) | 65.8 | 67.5 | 67.8 | 66.6 |
| Principal curvature Ca | −0.00014 | −0.00118 | −0.00318 | 0.00329 |
| Principal curvature Cb | −0.00308 | −0.00507 | 0.00000 | −0.00234 |
| Cb/Ca | 21.860 | 4.309 | 0.000 | −0.711 |

It is seen from this Table 11 that the third embodiment to the fifth embodiment, and the eighth embodiment (the second embodiment) satisfy the conditions (b-1), (b-2), and (c-1), (c-2) concerning the aspheric shape.

In the next place, FIG. 15 to FIG. 20 show the lateral aberration charts on the second surface B of the projection optical systems according to the third embodiment to the eighth embodiment (the second embodiment), respectively.

Here FIG. 15(A) to FIG. 19(A) are the lateral aberration charts in the meridional direction at the image height Y=13.75, FIG. 15(B) to FIG. 19(B) the lateral aberration diagrams in the meridional direction at the image height Y=6.875, FIG. 15(C) to FIG. 19(C) the lateral aberration diagrams in the meridional direction at the image height Y=0 (on the optical axis), FIG. 15(D) to FIG. 19(D) the lateral aberration diagrams in the sagittal direction at the image height Y=13.75, FIG. 15(E) to FIG. 19(E) the lateral aberration diagrams in the sagittal direction at the image height Y=6.875, and FIG. 15(F) to FIG. 19(F) the lateral aberration diagrams in the sagittal direction at the image height Y=0 (on the optical axis).

FIG. 20(A) is the lateral aberration chart in the meridional direction at the image height Y=13.3, FIG. 20(B) the lateral aberration diagram in the meridional direction at the image height Y=6.65, FIG. 20(C) the lateral aberration diagram in the meridional direction at the image height Y=0 (on the optical axis), FIG. 20(D) the lateral aberration chart in the sagittal direction at the image height Y=13.3, FIG. 20(E) the lateral aberration diagram in the sagittal direction at the image height Y=6.65, and FIG. 20(F) the lateral aberration diagram in the sagittal direction at the image height Y=0 (on the optical axis)

In each of the lateral aberration charts of FIG. 15 to FIG. 20, a solid line represents an aberration curve at the wavelength $\lambda$=193.3 nm (the reference wavelength), a dashed line an aberration curve at the wavelength $\lambda$=193.3 nm+0.175 pm (the reference wavelength+0.175 pm), and a chain line an aberration curve at the wavelength $\lambda$=193.3 nm−0.175 pm (the reference wavelength−0.175 pm).

As apparent from FIG. 15 to FIG. 20, in the projection optical system of each embodiment, the chromatic aberration is corrected well across the wavelength region of ±0.175 pm.

Each of the projection optical systems of the third embodiment to the seventh embodiment has the circular image field having the diameter of 27.5 mm and can ensure the rectangular exposure area, for example, having the width of about 8 mm in the scanning direction and the width of about 26 mm in the direction perpendicular to the scanning direction, in the image field. When the projection optical systems of these embodiments are applied to those of the scanning exposure type projection exposure apparatus of the step-and-scan method, the stitch-and-scan method, and so on, high throughput can be yielded accordingly.

In the foregoing examples, the rectangular exposure area was employed in consideration of application of the projection optical system PL of each embodiment to the scanning exposure apparatus, but the shape of the exposure area can be any area included in the circular image field; e.g., either of various shapes including the hexagonal shape, isosceles trapezoid, scalene trapezoid, rhomboid, square, arc, and so on.

Figure 5:
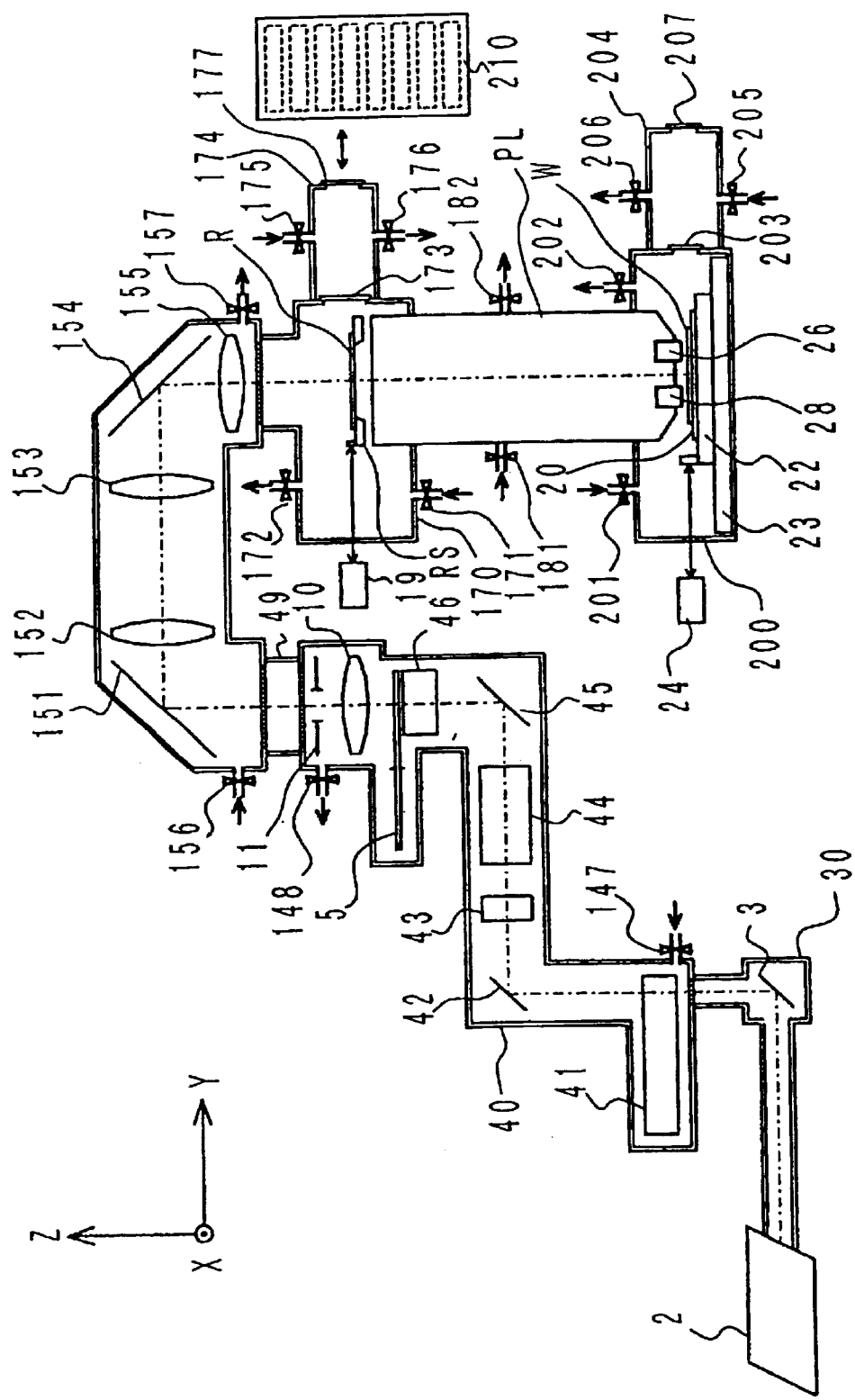
FIG. 5 is a drawing to show the schematic structure of a projection exposure apparatus according to an embodiment of the present invention.

The foregoing projection optical systems PL of the first embodiment to the seventh embodiment can be applied to the projection exposure apparatus of the embodiment shown in FIG. 5. FIG. 5 describes an example using the $F_2$ laser source as a light source and using the first embodiment as the projection optical system PL, but, for application of the projection optical systems PL of the second to seventh embodiments optimized for the ArF excimer laser, the fundamental structure of exposure apparatus except for the light source is also substantially the same as that in FIG. 5.

The embodiment of the exposure apparatus according to the present invention will be described with reference to FIG. 5.

FIG. 5 is a drawing to show the schematic structure of the projection exposure apparatus according to the embodiment. In FIG. 5 an XYZ coordinate system is adopted.

The exposure apparatus according to the embodiment results from application of the present invention to the projection exposure apparatus using the $F_2$ laser source as an exposure light source and the refracting optical system as the projection optical system. The projection exposure apparatus of the present embodiment employs the step-and-scan method of sequentially transferring a pattern image of a reticle into one shot area on a substrate by synchronous scanning of the reticle and the substrate in a predetermined direction relative to an illumination area of a predetermined shape on the reticle. Such exposure apparatus of the step-and-scan type can transfer the pattern of the reticle into the wider area on the substrate than the exposure field of the projection optical system.

In FIG. 5, the laser light source 2 has a combination of a fluorine dimer laser ($F_2$ laser) having the oscillation frequency of 157 nm with a band narrowing device, for example. The $F_2$ laser has FWHM of about 1.5 pm in spontaneous emission and this $F_2$ laser is combined with the band narrowing device to obtain laser light with FWHM of about 0.2 pm to 0.25 pm.

The laser light source 2 in the present embodiment can be one of light sources emitting light in the vacuum ultraviolet region of the wavelengths of about 120 nm to about 180 nm; e.g., the krypton dimer laser ($Kr_2$ laser) having the oscillation wavelength of 146 nm, the argon dimer laser ($Ar_2$ laser) having the oscillation wavelength of 126 nm, and so on.

The pulse laser light (illumination light) from the laser light source 2 is deflected by a deflection mirror 3 toward a light delaying optical system 41 to be temporally divided into a plurality of beams with an optical path difference of not less than the temporal coherence length of the illumination light from the laser light source 2. The light delaying optical system of this type is disclosed, for example, in Japanese Patent Applications Laid-Open No. H01-198759 and Laid-Open No. H11-174365.

The illumination light emitted from the light delaying optical system 41 is deflected by a path deflection mirror 42 and thereafter travels successively through a first fly's eye lens 43, a zoom lens 44, and a vibrating mirror 45 to reach a second fly's eye lens 46. A switching revolver 5 for an aperture stop of an illumination optical system, which is for setting the effective size and shape of light source to desired ones, is located on the exit side of the second fly's eye lens 46. In the present example, the size of the beam into the second fly's eye lens 46 is variable by the zoom lens 44, in order to reduce loss in quantity of light at the aperture stop of the illumination optical system.

The beam emerging from the aperture of the aperture stop of the illumination optical system travels through a condenser lens unit 10 to illuminate an illumination field stop (reticle blind) 11. The illumination field stop 11 is disclosed in Japanese Patent Application Laid-Open No. H04-196513 and U.S. Pat. No. 5,473,410 corresponding thereto.

The light from the illumination field stop 11 is guided via an illumination-field-stop imaging optical system (reticle-blind imaging system) consisting of deflection mirrors 151, 154 and lenses 152, 153, 155 onto a reticle R, whereupon an illumination area, which is an image of the opening portion of the illumination field stop 10, is formed on the reticle R. The light from the illumination area on the reticle R is guided through the projection optical system PL onto a wafer W, whereupon a reduced image of a pattern in the illumination area of the reticle R is formed on the wafer W.

When the exposure light is light of the wavelength in the vacuum ultraviolet region, it is necessary to purge gases having the strong absorption property for such light in the wavelength band (which will be called hereinafter "absorptive gases" at need), such as oxygen, water vapor, hydrocarbon-based gases, and so on, from the optical paths.

In the present embodiment, therefore, the illumination optical path (the optical path from the laser light source 2 to the reticle R) and the projection optical path (the optical path from the reticle R to the wafer W) are shut off from the external atmosphere and those optical paths are filled with a gas of nitrogen, helium, argon, neon, krypton, or the like as a specific gas having the property of little absorbing the light in the vacuum ultraviolet region, or a mixed gas of two or more selected therefrom (which will be called hereinafter "low-absorptive gas" or "specific gas" at need).

Specifically, the optical path from the laser source 2 to the light delaying optical system 41 is shut off from the external atmosphere by casing 30, the optical path from the light delaying optical system 41 to the illumination field stop 11 off from the external atmosphere by casing 40, the illumination-field-stop imaging optical system off from the external atmosphere by casing 150, and the foregoing specific gas is filled in those optical paths. The projection optical system PL itself has a barrel acting as a casing and the internal optical path thereof is filled with the foregoing specific gas.

The specific gas filled in each optical path is preferably helium. However, nitrogen can also be used as the specific gas in the optical paths of the illumination optical system from the laser source 2 to the reticle R (the casings 30, 40, 150).

A casing 170 shuts off the space between the casing 150 housing the illumination-field-stop imaging optical system, and the projection optical system PL from the external atmosphere and houses a reticle stage RS for holding the reticle R inside. This casing 170 is provided with a gate 173 for loading and unloading of the reticle R and a gas replacement chamber 174 for preventing the atmosphere in the casing 170 from being contaminated during loading and unloading of the reticle R, is provided outside the gate 173. This gas replacement chamber 174 is also provided with a gate 177 and transfer of a reticle is implemented through the gate 177 to or from a reticle stocker 210 storing plural types of reticles.

A casing 200 shuts off the space between the projection optical system PL and the wafer W from the external atmosphere and houses inside, a wafer stage 22 for holding the wafer W, an autofocus sensor 26 of an oblique incidence type for detecting the position in the Z-direction (focus position) and inclination angle of the surface of the wafer W as a substrate, an alignment sensor 28 of the off-axis method, and a surface plate 23 carrying the wafer stage 22. This casing 200 is provided with a gate 203 for loading and unloading of the wafer W, and a gas replacement chamber 204 for preventing the atmosphere inside the casing 200 from being contaminated, is provided outside this gate 203. This gas replacement chamber 204 is equipped with a gate 207 and a wafer W is carried into or of the apparatus through this gate 207.

Here each of the casings 40, 150, 170, 200 is provided with an inlet valve 147, 156, 171, or 201, respectively, and these inlet valves 147, 156, 171, 201 are connected to an inlet pipe path connected to an unrepresented gas supply. Each of the casings 40, 150, 170, 200 is also provided with an exhaust valve 148, 157, 172, or 202 and these exhaust valves 148, 157, 172, 202 are connected through an unrepresented exhaust pipe path to the foregoing gas supply. The specific gas from the gas supply is controlled to a predetermined target temperature by unrepresented temperature regulators. When helium is used as the specific gas, the temperature regulators are preferably located in the vicinity of the respective casings.

Similarly, the gas replacement chambers 174, 204 are also provided with an inlet valve 175 or 205 and an exhaust valve 176 or 206, and the inlet valves 175, 205 are connected through an inlet pipe path while the exhaust valves 176, 206 through an exhaust pipe path, to the foregoing gas supply. Further, the barrel of the projection optical system PL is also provided with an inlet valve 181 and an exhaust valve 182, and the inlet valve 181 is connected through an unrepresented inlet pipe path while the exhaust valve 182 through an unrepresented exhaust pipe path, to the foregoing gas supply.

The inlet pipe paths connected to the inlet valves 147, 156, 171, 175, 181, 201, 205 and the exhaust pipe paths connected to the exhaust valves 148, 157, 172, 176, 182, 202, 206 are equipped with a filter for removing dust (particles), such as a HEPA filter or an ULPA filter, and a chemical filter for removing the absorptive gases including oxygen and the like.

The gas replacement chambers 174, 204 require gas replacement every reticle exchange or wafer exchange. For example, on the occasion of reticle exchange, the gate 174 is opened to permit a reticle to be carried from the reticle stocker 210 into the gas replacement chamber 174, the gate 174 is then closed to fill the interior of the gas replacement chamber 174 with the specific gas, and thereafter the gate 173 is opened to mount the reticle onto the reticle stage RS. During wafer exchange, the gate 207 is opened to permit a wafer to be carried into the gas replacement chamber 204, and then the gate 207 is closed to fill the interior of the gas replacement chamber 204 with the specific gas. After that, the gate 203 is opened to mount the wafer onto the wafer holder 20. Procedures for reticle unloading and wafer unloading are reverse to the above procedures. The procedures for gas replacement in the gas replacement chamber 174, 204 can be also arranged to first decompress the atmosphere in the gas replacement chamber and thereafter supply the specific gas through the inlet valve.

In the casings 170, 200, there is the possibility of mixing of the gas thereinto on the occasion of the gas replacement in the gas replacement chambers 174, 204 and the gas in the gas replacement chambers 174, 204 can contain a considerable amount of the absorptive gases such as oxygen and the like with a high probability. It is thus desirable to carry out gas replacement there at the same timing as the gas replacement in the gas replacement chambers 174, 204. The casings and the gas replacement chambers are preferably filled with the specific gas at a higher pressure than the pressure of the external atmosphere.

In the present embodiment, though not shown in FIG. 5, at least one lens element of the plurality of lens elements constituting the projection optical system PL is held so as to be able to be changed in at least one of its position and posture. This makes the imaging characteristics of the projection optical system PL variable. Such adjusting means are disclosed, for example, in Japanese Patent Applications Laid-Open No. H04-192317, Laid-Open No. H04-127514 (and U.S. Pat. No. 5,117,255 corresponding thereto), Laid-Open No. H05-41344, and Laid-Open No. H06-84527 (and U.S. Pat. No. 5,424,552 corresponding thereto).

In the present embodiment, at least one of the lens elements changeable in at least one of the position and posture is preferably a spherical lens.

The projection optical systems PL of the second to seventh embodiments optimized for the ArF excimer laser can be applied to the projection exposure apparatus disclosed in Japanese Patent Applications Laid-Open No. H06-260386 (U.S. Pat. No. 5,559,584), Laid-Open No. H11-233447, WO98/57213, WO99/10917, and WO99/50892, and so on.

The projection exposure apparatus of the present invention is preferably provided with the light source for supplying the exposure light in the wavelength region of not more than 180 nm, the illumination optical system for guiding the exposure light from this light source to the pattern on the projection master, and the projection optical system located in the optical path between the projection master and the workpiece and guiding 25% or more by quantity of the exposure light having passed through the projection master, to the workpiece to form a reduced image of the pattern on the workpiece.

It is difficult to raise the sensitivity of photosensitive resin (resist) materials available for the wavelength region of not more than 180 nm, as compared with those for the longer wavelengths, and, where the projection optical system guides only 25% or less by quantity of the exposure light from the projection master to the workpiece, it is necessary to increase the exposure time in order to ensure a necessary exposure dose for the resist, which will undesirably decrease the throughput. In this case, more heat is accumulated in the projection optical system, so as to give rise to thermal aberration of the projection optical system, i.e., aberration due to variations in the refractive indices of the lenses or gas and variations in index distribution, caused by the accumulation of heat in the projection optical system. This is undesirable, because projection exposure cannot be implemented under stable imaging performance.

The projection exposure apparatus according to the embodiment of FIG. 5 adopts the projection optical system PL according to the embodiment of FIG. 1. The glass material making this projection optical system PL is fluorite as described previously and its transmittance per cm for the exposure light of 157 nm is 99 to 99.5%. Antireflection coats for the exposure light of 157 nm are those having the loss of light quantity per lens surface of 1%. From the above values, the projection exposure apparatus of FIG. 5 provided with the projection optical system of the embodiment of FIG. 1 has the transmittance of 37% and satisfies the foregoing condition.

The projection exposure method according to the present invention is preferably a projection exposure method of projecting a reduced image of a pattern provided in a projection master, onto a workpiece to effect exposure thereof, comprising a step of supplying exposure light in the wavelength band of not more than 200 nm; a step of guiding the exposure light from the light source through the illumination optical system onto the pattern on the projection master; and a step of guiding the exposure light from the projection master through the projection optical system onto the workpiece to form the reduced image of the pattern on the workpiece; wherein the following condition is satisfied:

$$\frac{En4}{En3} > \frac{En2}{En1}, \qquad (6)$$

where En1 is a quantity of the exposure light incident to the illumination optical system, En2 a quantity of the exposure light traveling from the illumination optical system to the projection master, En3 a quantity of the exposure light incident to the projection optical system, and En4 a quantity of the exposure light emerging from the projection optical system toward the workpiece.

When the above condition (6) is not satisfied, it becomes infeasible to achieve the functions necessary for the illumination optical system, e.g., uniform illumination on the workpiece or the like, so that a fine circuit pattern cannot be transferred onto the workpiece, which is undesirable.

In the foregoing projection exposure method, the step of guiding the exposure light to the pattern preferably comprises an auxiliary step of passing the exposure light through a space filled with a gas atmosphere having the low absorption property for the light in the wavelength region, and the step of forming the reduced image of the pattern on the workpiece preferably comprises an auxiliary step of passing the exposure light through a space filled with a gas atmosphere having the low absorption property for the light in the wavelength region.

Figure 6:
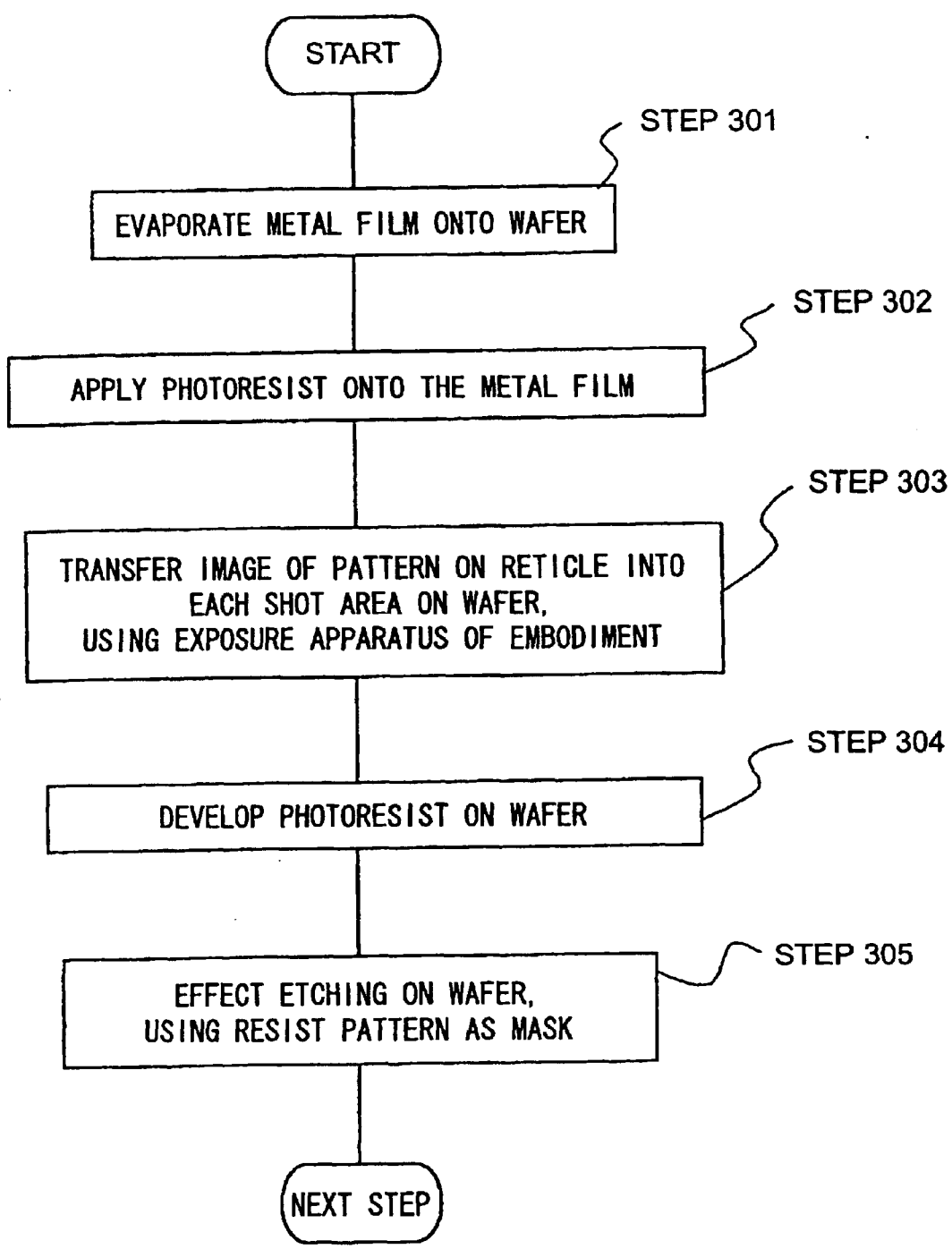
FIG. 6 is a flowchart to show an example of microdevice fabrication method of the present invention.

Next described referring to the flowchart of FIG. 6 is an example of operation to fabricate semiconductor devices as microdevices by forming a predetermined circuit pattern on the wafer by use of the projection exposure apparatus of the above embodiment.

First, in step 301 of FIG. 6, a metal film is evaporated onto one lot of wafers. In next step 302, a photoresist is applied onto the metal film on the lot of wafers. After that, in step 303, an image of a pattern on a reticle R is sequentially transferred through the projection optical system PL into each shot area on the lot of wafers, using the projection exposure apparatus of FIG. 5 provided with the projection optical system PL of either the first or second embodiment. After that, in step 304, the photoresist on the lot of wafers is developed and thereafter in step 305, etching is effected on the lot of wafers, using the resist pattern as a mask, thereby forming a circuit pattern corresponding to the pattern on the reticle R, in each shot area on each wafer. After that, such devices as the semiconductor devices are fabricated by further carrying out formation of circuit patterns of upper layers and the like.

By the foregoing semiconductor device fabrication method, the semiconductor devices having extremely fine circuit patterns can be fabricated at high throughput.

The projection exposure apparatus of the above embodiment can also be applied to fabrication of liquid crystal display devices as microdevices, by forming a predetermined circuit pattern on a plate (glass substrate). An example of operation in this application will be described below referring to the flowchart of FIG. 7.

Figure 7:
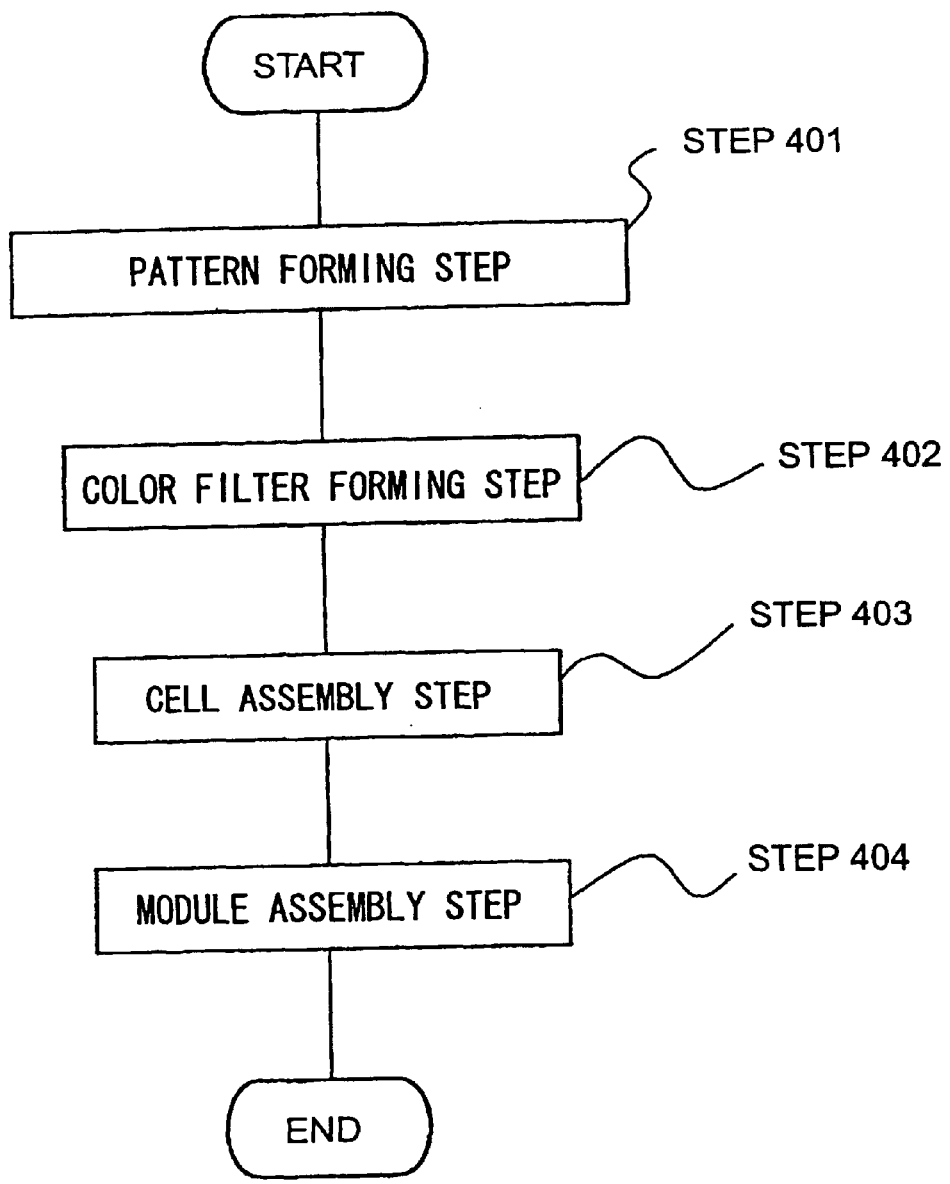
FIG. 7 is a flowchart to show another example of microdevice fabrication method of the present invention.

In FIG. 7, a pattern forming step 401 is a step of carrying out the so-called photolithography to transfer a pattern of a reticle onto a photosensitive substrate (a glass substrate coated with resist, or the like) by use of the exposure apparatus of the present embodiment. After completion of this photolithography step, a predetermined pattern including many electrodes and others is formed on the photosensitive substrate. After that, the exposed substrate is processed through steps including a development step, an etching step, a reticle removing step, and so on, whereby a predetermined pattern is formed on the substrate. Then the substrate is transferred to the next color filter forming step 202.

Next, in the color filter forming step 402, a color filter is formed in a matrix of many sets of three dots corresponding to R (Red), G (Green), and B (Blue). Then a cell assembly step 403 is carried out after the color filter forming step 402.

In the cell assembly step 403, a liquid crystal panel (liquid crystal cells) is assembled using the substrate with the predetermined pattern obtained in the pattern forming step 401, the color filter obtained in the color filter forming step 402, and so on. In the cell assembly step 403, for example, the liquid crystal panel (liquid crystal cells) is fabricated by charging the liquid crystal into between the substrate with the predetermined pattern obtained in the pattern forming step 401 and the color filter obtained in the color filter forming step 402.

In a module assembly step 404 thereafter, a liquid crystal display device is completed by mounting such components as an electric circuit for display operation of the assembled liquid crystal panel (liquid crystal cells), a back light, and so on.

By the foregoing liquid crystal display device fabrication method, the liquid crystal display devices having extremely fine circuit patterns can be fabricated at high throughput.

In the foregoing embodiment of FIG. 5, the fly's eye lenses 43, 46 as optical integrators (uniformizers or homogenizers) in the illumination optical system can be micro-fly's eye lenses fabricated by forming a plurality of microlens surfaces on a single substrate by the technique of etching or the like. The first fly's eye lens 43 may be replaced by a diffractive optical element which diverges incident light by diffraction action to form the illumination field in circular, ring, or multipolar shape in the far field (Fraunhofer diffraction region) thereof. The diffractive optical element of this type can be one disclosed in U.S. Pat. No.

5,850,300, for example. When the diffractive optical element is employed, the light delaying optical system 41 may be omitted.

The optical integrators can be either of internal reflection type integrators (rod integrators, optical pipes, optical tunnels, etc.). When an internal reflection type integrator of this kind is used, the exit surface of the internal reflection integrator becomes approximately conjugate with the pattern surface of the reticle. For applying it to the aforementioned embodiment, therefore, the illumination field stop (reticle blind) 11 is located, for example, in close proximity of the exit surface of the internal reflection integrator and the zoom lens 44 is constructed so as to establish the substantial conjugate relation between the exit surface of the first fly's eye lens 43 and the entrance surface of the internal reflection integrator.

When the wavelength of the exposure light is not more than 180 nm, at least either of the microlens array, diffractive optical element, internal reflection integrator, and lens elements in the illumination optical system is preferably made of a material selected from the group consisting of fluorite, silica glass doped with fluorine, silica glass doped with fluorine and hydrogen, silica glass having the structure determination temperature of not more than 1200K and the hydrogen molecule concentration of not less than $1 \times 10^{17}$ molecules/cm$^3$, silica glass having the structure determination temperature of not more than 1200K and the chlorine concentration of not more than 50 ppm, and silica glass having the structure determination temperature of not more than 1200K, the hydrogen molecule concentration of not less than $1 \times 10^{17}$ molecules/cm$^3$, and the chlorine concentration of not more than 50 ppm. When the exposure wavelength is within the range of 180 nm to 200 nm (e.g., the ArF excimer laser), it is also possible to use silica glass having the structure determination temperature of not more than 1200K and the OH-group concentration of not less than 1000 ppm, in addition to the foregoing materials.

The silica glass having the structure determination temperature of not more than 1200K and the OH-group concentration of not less than 1000 pm is disclosed in Japanese Patent No. 2770224 of Applicant of the present application, and the silica glass having the structure determination temperature of not more than 1200K and the hydrogen molecule concentration of not less than $1 \times 10^{17}$ molecules/cm$^3$, the silica glass having the structure determination temperature of not more than 1200K and the chlorine concentration of not more than 50 ppm, and the silica glass having the structure determination temperature of not more than 1200K, the hydrogen molecule concentration of not less than $1 \times 10^{17}$ molecules/cm$^3$, and the chlorine concentration of not more than 50 ppm are disclosed in Japanese Patent No. 2936138 of Applicant of the present application.

In the projection optical system PL according to the foregoing first embodiment, each of the lens elements making the projection optical system was made of fluorite, but each lens element making the projection optical system is preferably made of a material of at least one kind selected from the group consisting of calcium fluoride (CaF$_2$, fluorite), barium fluoride (BaF$_2$), lithium fluoride (LiF), magnesium fluoride (MgF$_2$), lithium calcium aluminum fluoride (LiCaAlF$_6$), lithium strontium aluminum fluoride (LiSrAlF$_6$), and strontium fluoride (SrF$_2$).

In the above embodiment of FIG. 5, supposing the application of the projection optical system PL of the first embodiment, the laser light source was the one for supplying the band-narrowed fluorine dimer laser (F$_2$ laser) of the oscillation wavelength of 157 nm, but the present invention is not limited to the F$_2$ laser. For example, the laser light to be used can also be the band-narrowed ArF excimer laser of the oscillation wavelength of 193 nm, or the KrF excimer laser of the oscillation wavelength of 248 nm.

It is difficult to narrow the band of the laser light source in the wavelength region of wavelengths not more than 200 nm, but the application of the present invention relaxes the degree of band narrowing of the laser light source and thus presents the advantage of decreasing the load of achromatism of the projection optical system.

Further, the aforementioned embodiment used the F$_2$ laser as a light source, but it can be replaced by a harmonic of a solid state laser such as the YAG laser or the like having the oscillation spectrum at 157 nm. It is also possible to use a harmonic obtained by amplifying single-wavelength laser light in the infrared region or in the visible region, lased from a DFB semiconductor laser or a fiber laser, for example, by a fiber amplifier doped with erbium (Er) (or doped with both erbium and ytterbium (Yb)) and converting the wavelength into ultraviolet radiation by use of a non-linear optical crystal.

For example, when the oscillation wavelength of the single-wavelength laser light is in the range of 1.51 to 1.59 μm, the tenth harmonic is outputted at the generated wavelength in the range of 151 to 159 nm. In particular, when the oscillation wavelength is in the range of 1.57 to 1.58 μm, the tenth harmonic is obtained at the generated wavelength in the range of 157 to 158 nm; i.e., ultraviolet radiation with the wavelength approximately equal to that of the F$_2$ laser light. When the oscillation wavelength is in the range of 1.03 to 1.12 μm, the seventh harmonic is outputted at the generated wavelength in the range of 147 to 160 nm and, particularly, when the oscillation wavelength is in the range of 1.099 to 1.106 μm, the seventh harmonic is obtained at the generated wavelength in the range of 157 to 158 nm; i.e., ultraviolet radiation with the wavelength approximately equal to that of the F$_2$ laser light. An yttrium-doped fiber laser is used as the single-wavelength oscillation laser.

When the harmonic from the laser light source is used as described above, this harmonic itself has a sufficiently narrow spectral width (e.g., 0.3 pm or less) and thus it can be used instead of the aforementioned light source 2.

In the first embodiment the projection optical system was constructed using the single kind of material, but the projection optical system does not always have to be limited to the single kind material. When the projection optical system is constructed on the premise of the exposure light in the vacuum ultraviolet region near the far ultraviolet region, or in the far ultraviolet region as in the second embodiment, synthetic quartz and fluorite can be used as materials. When the projection optical system is constructed on the premise of the exposure light in the vacuum ultraviolet region, the materials can be at least two kinds of materials selected from the group consisting of calcium fluoride (CaF$_2$, fluorite), barium fluoride (BaF$_2$), lithium fluoride (LiF), magnesium fluoride (MgF$_2$), lithium calcium aluminum fluoride (LiCaAlF$_6$), lithium strontium aluminum fluoride (LiSrAlF$_6$), and strontium fluoride (SrF$_2$). A diffractive optical element may be added to the projection optical system, so as to enjoy the advantage of the chromatic aberration correcting effect by the diffractive optical element.

In the embodiment of FIG. 5, a prism made of a birefringent material for prevention of speckle may be placed on the entrance side of the first fly's eye lens 43. The speckle-preventing prism of this type is disclosed, for example, in U.S. Pat. No. 5,253,110. When the exposure light is light with the exposure wavelength of not more than 180 nm, a prism made of a crystal of magnesium fluoride ($MgF_2$) can be used instead of the quartz prism disclosed in U.S. Pat. No. 5,253,110.

This wedge prism made of the crystal of magnesium fluoride is placed so as to gradually change its thickness in the direction crossing the optical axis of the illumination optical system. Then another wedge prism for correction of optical path is placed opposite to the wedge prism of the crystal of magnesium fluoride so that their apexes are directed in opposite directions to each other. This path-correcting wedge prism has the same apex angle as the prism of the crystal of magnesium fluoride and is made of a light-transmitting material without birefringence. This structure can align the light incident to the pair of prisms and the light emerging therefrom in the same traveling direction.

The material of the path-correcting prism is preferably one selected, for example, from the group consisting of fluorite, silica glass doped with fluorine, silica glass doped with fluorine and hydrogen, silica glass having the structure determination temperature of not more than 1200K and the OH-group concentration of not less than 1000 ppm, silica glass having the structure determination temperature of not more than 1200K and the hydrogen molecule concentration of not less than $1 \times 10^{17}$ molecules/cm$^3$, silica glass having the structure determination temperature of not more than 1200K and the chlorine concentration of not more than 50 ppm, and silica glass having the structure determination temperature of not more than 1200K, the hydrogen molecule concentration of not less than $1 \times 10^{17}$ molecules/cm$^3$, and the chlorine concentration of not more than 50 ppm.

The embodiment of FIG. 5 employed the step-and-scan method, but the exposure apparatus of the embodiment can be exposure apparatus of the stitching and slit scan type. When the stitching and slit scan method is employed, the reticle and substrate are synchronously scanned in a predetermined first direction relative to the illumination area of predetermined shape on the reticle, thereby effecting exposure in an area of the first column on the substrate. After that, the reticle is replaced or the reticle is moved by a predetermined distance along a second direction perpendicular to the first direction of the foregoing illumination area, thereby horizontally shifting the substrate in the direction conjugate with the second direction of the illumination area. Then the reticle and substrate are again synchronously scanned in the first direction relative to the illumination area of the predetermined shape on the reticle, thereby effecting exposure in an area of the second column on the substrate.

The exposure apparatus of this stitching and slit scan type can perform exposure of the pattern of the reticle in a wider area on the substrate than the exposure field of the projection optical system. Such stitching and slit scan type exposure apparatus are disclosed in U.S. Pat. No. 5,477,304, Japanese Patent Applications Laid-Open No. H08-330220 and Laid-Open No. H10-284408, and so on.

The above embodiment can also adopt the full exposure method of transferring the full pattern image on the reticle into a predetermined shot area on the substrate at one time.

The embodiment of FIG. 5 was provided with only one wafer stage for holding the wafer as a workpiece (photosensitive substrate), but the apparatus may be constructed in the structure with two sets of wafer stages, for example, as disclosed in Japanese Patent Applications Laid-Open No. H05-175098, Laid-Open No. H10-163097, Laid-Open No. H10-163098, Laid-Open No. H10-163099, Laid-Open No. H10-214783, and so on.

Further, the present invention can not be applied only to the exposure apparatus used in fabrication of semiconductor devices, but can also be applied to the exposure apparatus for transferring a device pattern onto a glass plate, used in fabrication of displays including the liquid crystal display devices and the like, the exposure apparatus for transferring a device pattern onto a ceramic wafer, used in fabrication of thin-film magnetic heads, the exposure apparatus used in fabrication of imaging devices (CCDs etc.), and so on. The present invention can also be applied to the exposure apparatus for transferring a circuit pattern onto a glass substrate or a silicon wafer or the like for fabrication of a reticle or a mask.

As described above, the present invention can be realized in various configurations without having to be limited to the aforementioned embodiments. The disclosures in the international application PCT/JP99/05329 filed Sep. 29, 1999 and in the internal application PCT/JP99/06387 filed Nov. 16, 1999, including their respective specifications, scopes of claims, drawings, and abstracts all are incorporated herein by reference.

INDUSTRIAL APPLICABILITY

As described above, the projection optical systems of the present invention are those capable of suppressing the chromatic aberration thereof and reducing the loads on the light source. The correction of chromatic aberration for the exposure light having some spectral width can be implemented by adding a single kind of glass material or the small number of color-correcting glass materials.

By the projection exposure apparatus and methods according to the present invention, it is feasible to obtain the very fine circuit patterns of microdevices while simplifying the structure of the projection optical system.

By the device fabrication methods according to the present invention, the very fine circuit patterns of microdevices can be obtained without a drop in throughput.

What is claimed is:

1. A dioptric projection optical system for forming an image of a pattern on a first surface, onto a second surface by action of radiation-transmitting refractors, comprising:

a front lens unit having a positive refracting power, located in an optical path between said first surface and said second surface;

a rear lens unit having a positive refracting power, located in an optical path between said front lens unit and said second surface; and an aperture stop located in the vicinity of a rear focal point position of said front lens unit;

said projection optical system being telecentric on the said first surface side and on the said second surface side, wherein the following condition is satisfied:

$$0.065 < f2/L < 0.125,$$

where f2 is a focal length of said rear lens unit and L is a distance from said first surface to said second surface.

2. The projection optical system according to claim 1, said projection optical system comprising at least one lens surface of aspheric shape.

3. The projection optical system according to claim 2, wherein when six lenses are selected in order from the said first surface side of lenses having their respective refracting powers in said projection optical system, at least one surface of the six lenses has an aspheric shape having a negative refracting power.

4. The projection optical system according to claim 1, wherein said front lens unit comprises a first lens unit with a negative refracting power, a second lens unit with a positive refracting power, a third lens unit with a negative refracting power, and a fourth lens unit with a positive refracting power in the order named from the first surface side, wherein the following conditions are satisfied:

$-1.3 < 1/\beta 1 < 0$, and $0.08 < L1/L < 0.17$, where $\beta 1$ is a composite, lateral magnification of said first lens unit and said second lens unit, L1 is a distance from said first surface to a lens surface closest to said second surface in said second lens unit, and L is the distance from said first surface to said second surface.

5. The projection optical system according to claim 4, wherein said first and second lens units include at least two lens surfaces of aspheric shape and comprise ten or more lenses.

6. The projection optical system according to claim 1, wherein said front lens unit comprises a first lens unit with a negative refracting power, a second lens unit with a positive refracting power, a third lens unit with a negative refracting power, and a fourth lens unit with a positive refracting power in the order named from the first surface side.

7. The projection optical system according to claim 4, wherein the following condition is satisfied:

$0.46 < C/L < 0.64$, where C is a total thickness along the optical axis of the radiation-transmitting refractors located in the optical path of said projection optical system and L is the distance from said first surface to said second surface.

8. The projection optical system according to claim 1, wherein the following condition is satisfied:

$0.15 < Ea/E < 0.7$, where E is the total number of members having their respective refracting powers among radiation-transmitting refractors in said projection optical system and Ea is the total number of members each provided with a lens surface of aspheric shape.

9. The projection optical system according to claim 8, wherein the total number of said members having their respective refracting powers is not less than 16.

10. The projection optical system according to claim 8, wherein the total number of said members having their respective refracting powers is not more than 26.

11. The projection optical system according to claim 8, wherein radiation-transmitting refractors in said projection optical system are made of a single kind of material.

12. The projection optical system according to claim 8, wherein the radiation-transmitting refractors in said projection optical system comprise first radiation-transmitting refractors made of a first material and second radiation-transmitting refractors made of a second material, and wherein a percentage of the number of said second radiation-transmitting refractors to the number of the members having their respective refracting powers among said radiation-transmitting refractors, is not more than 32%.

13. The projection optical system according to claim 1, said projection optical system forming a reduced image of said pattern on said first surface, on said second surface.

14. The projection optical system according to claim 1, wherein said aperture stop is located in an optical path between said front lens unit and said rear lens unit.

15. A method of fabricating a dioptric projection optical system for forming an image of a pattern on a first surface, onto a second surface by action of radiation-transmitting refractors, comprising:

a step of locating a front lens unit having a positive refracting power;

a step of locating a rear lens unit having a positive refracting power, between the front lens unit and said second surface; and a step of locating an aperture stop between said front lens unit and said rear lens unit;

wherein said front lens unit, said rear lens unit, and said aperture stop are located so that the projection optical system is telecentric on the said first surface side and on the said second surface side, and said method using the projection optical system satisfying the following condition:

$0.0065 < f2/L < 0.125$, where f2 is a focal length of said rear lens unit and L is a distance from said first surface to said second surface.

16. A projection exposure apparatus for projecting a reduced image of a pattern provided on a projection master, onto a workpiece to effect exposure thereof, comprising:

a light source for supplying exposure light;

an illumination optical system for guiding the exposure light from the light source to said pattern on said projection master; and the projection optical system as set forth in claim 1;

wherein said projection master can be placed on said first surface of said projection optical system, and said workpiece can be placed on said second surface.

17. A projection exposure apparatus for projecting a reduced image of a pattern provided on a projection master, onto a workpiece to effect exposure thereof while scanning, comprising:

a light source for supplying exposure light;

an illumination optical system for guiding the exposure light from the light source to said pattern on said projection master;

the projection optical system as set forth in claim 1;

a first stage for enabling said projection master to be placed on said first surface of said projection optical system; and a second stage for enabling said workpiece to be placed on said second surface;

wherein said first and second stages are movable at a ratio of speeds according to a projection magnification of said projection optical system.

18. The projection exposure apparatus according to claim 16, wherein said light source supplies the exposure light in a wavelength region of not more than 180 nm and wherein said projection optical system guides 25% or more by quantity of the exposure light from said projection master, to said workpiece.

19. A projection exposure method of projecting a pattern formed on a projection master, onto a workpiece to effect exposure thereof,
  which uses the projection exposure apparatus as set forth in claim 16,
    wherein said projection master is placed on said first surface and said workpiece is placed on said second surface, and
    wherein an image of said pattern is formed on said workpiece through said projection optical system.

20. A method of fabricating a microdevice having a predetermined circuit pattern, comprising:
  a step of projecting an image of said pattern onto said workpiece to effect exposure thereof, using the projection exposure method as set forth in claim 19, and
  a step of developing said workpiece after the projection exposure.

* * * * *